United States Patent
Shin et al.

(10) Patent No.: US 8,817,549 B2
(45) Date of Patent: Aug. 26, 2014

(54) INTEGRATED CIRCUIT MEMORY DEVICE

(75) Inventors: Choong-Sun Shin, Yongin-si (KR); Joo-Sun Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 60 days.

(21) Appl. No.: 13/478,774

(22) Filed: May 23, 2012

(65) Prior Publication Data

US 2012/0300555 A1  Nov. 29, 2012

Related U.S. Application Data

(60) Provisional application No. 61/490,835, filed on May 27, 2011.

(30) Foreign Application Priority Data

Nov. 11, 2011 (KR) ........................ 10-2011-0117380

(51) Int. Cl.
    *G11C 7/10* (2006.01)

(52) U.S. Cl.
    USPC ................................. 365/189.03; 365/230.03

(58) Field of Classification Search
    USPC ........................................ 365/189.03, 230.03
    See application file for complete search history.

(56) References Cited

U.S. PATENT DOCUMENTS

| | | | |
|---|---|---|---|
| 6,928,015 B2 * | 8/2005 | Ooishi | 365/171 |
| 7,158,433 B2 * | 1/2007 | Riho et al. | 365/222 |
| 7,202,128 B1 * | 4/2007 | Orimoto et al. | 438/257 |
| 7,215,561 B2 | 5/2007 | Park et al. | |
| 7,251,024 B2 * | 7/2007 | Maeda et al. | 356/237.2 |
| 7,391,634 B2 | 6/2008 | Kim et al. | |
| 8,159,075 B2 * | 4/2012 | Hsuan et al. | 257/777 |
| 2011/0085403 A1 | 4/2011 | Nishioka | |

FOREIGN PATENT DOCUMENTS

| | | |
|---|---|---|
| JP | 2011-081884 | 4/2011 |
| KR | 1020040017734 A | 2/2004 |
| KR | 1020060095621 A | 9/2006 |

* cited by examiner

*Primary Examiner* — Michael Tran
(74) *Attorney, Agent, or Firm* — Myers Bigel Sibley & Sajovec, PA

(57) ABSTRACT

A semiconductor memory device includes a plurality of memory regions formed on one chip, each of the memory regions having a plurality of volatile memory cells that are formed with a density or capacity of $2^{\wedge}K$ bits, where K is an integer greater than or equal to 0, and a plurality of input/output (I/O) terminals for inputting and outputting data of the volatile memory cells, and at least one peripheral region that controls a write operation for writing data into the memory regions and a read operation for reading data from the memory regions based on a command and an address input from outside. Thus, a total or entire density of the memory regions corresponds to a non-standard (or 'interim') density so that the semiconductor memory device may have an interim density.

16 Claims, 32 Drawing Sheets

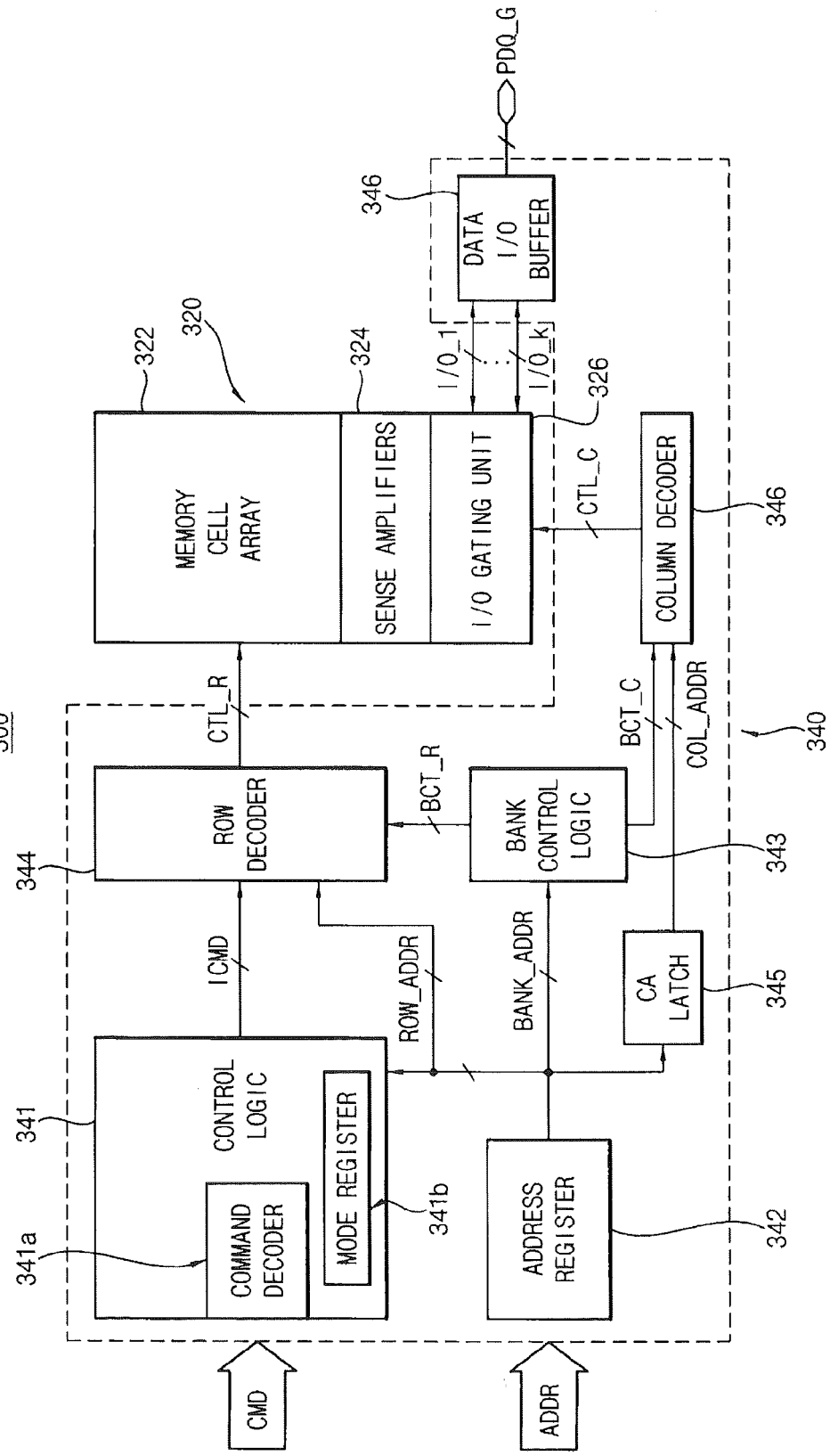

INTEGRATED CIRCUIT MEMORY DEVICE

CROSS-REFERENCE TO RELATED APPLICATION(S)

This US non-provisional application claims benefit of priority under 35 USC §119 to U.S. Provisional Application No. 61/490,835 filed on May 27, 2011 in the USPTO, and Korean Patent Application No. 10-2011-0117380 filed on Nov. 11, 2011 in the Korean Intellectual Property Office (KIPO), the contents of which are herein incorporated by reference in its entirety.

BACKGROUND

Example embodiments relate generally to a integrated circuit memory device. More particularly, embodiments of the inventive concept relate to a integrated circuit memory device having a plurality of volatile memory cells.

As a process refinement is performed owing to technological advances, a density (i.e., the number of memory cells) of a dynamic random access memory (DRAM) device has increased (e.g., 4 Gb, 8 Gb, 16 Gb, 32 Gb, 64 Gb, . . . ) by $2^M$ (here, M is a positive integer) times. A density of the DRAM device may be increased by increasing the number of row addresses, increasing the number of column addresses, and/or increasing the number of bank addresses. However, when nearing the limits of process refinement, it may be difficult for the conventional methods to increase a density (i.e., the number of memory cells) of the DRAM device by twice between generations.

SUMMARY

Some example embodiments provide an integrated circuit memory device having a non-standard density (i.e., 'interim' density) of $2^M+2^N+2^O+\ldots$ (here, M, N, and O are integers greater than or equal to 0, and M, N, and O are different from each other).

Some example embodiments provide an integrated circuit memory package including a plurality of semiconductor memory devices having an 'interim' density.

Some example embodiments provide a method of increasing a density of an integrated circuit memory device, the semiconductor memory device having an 'interim' density.

According to some example embodiments, an integrated circuit memory device includes a plurality of memory regions on a same memory chip. Each of the memory regions has a respective memory capacity defined in units of bits, and a sum of the respective memory capacities of the memory regions on the same memory chip cannot be expressed as a power of 2. The device further includes at least one peripheral region configured to control read or write operations for the plurality of memory regions responsive to address and command signals received from an external memory controller.

In some example embodiments, the plurality of memory regions may include: a first memory region comprising a plurality of first memory cells having a first memory capacity of $2^M$ bits (where M is an integer greater than or equal to zero) and a plurality of first input/output terminals coupled to the memory cells; and a second memory region comprising a plurality of second memory cells having a second memory capacity of $2^N$ bits (where N is an integer greater than or equal to zero and N does not equal M) and a plurality of second input/output terminals coupled to the memory cells. A sum of the first memory capacity and the second memory capacity is not a power of 2.

In some example embodiments, the device may further include an I/O connecting block configured to connect the first and/or second input/output terminals to chip input/output terminals of the same memory chip.

In some example embodiments, a quantity of the chip input/output terminals may not be a power of 2.

In some example embodiments, a quantity of the chip input/output terminals may correspond to a sum of a quantity of the first and second input/output terminals, and the I/O connecting block may be configured to simultaneously connect the first and second input/output terminals to the chip input/output terminals.

In some example embodiments, a quantity of the chip input/output terminals may correspond to a quantity of the first input/output terminals or a quantity of the second input/output terminals, and the I/O connecting block may be configured to selectively connect either the first input/output terminals or the second input/output terminals to the chip input/output terminals responsive to at least one chip select signal.

In some example embodiments, the integrated circuit memory device may be a first memory chip in a multi-chip memory package. The memory package may be a monolithic package, a multi-die package, or a through-silicon via multi-die stack package.

In some example embodiments, the multi-chip memory package may further include a second memory chip having the first memory region and the second memory region. The I/O connecting block may be configured to simultaneously connect the second input/output terminals of the first and second memory chips to the chip input/output terminals responsive to the chip select signal.

In some example embodiments, the chip select signal may be a first chip select signal, and the I/O connecting block may be configured to simultaneously connect the second input/output terminals of the first and second memory chips to the chip input/output terminals responsive to a logical combination of the first chip select signal and a second chip select signal.

In some example embodiments, the chip input/output terminals may include first chip terminals and second chip terminals different from the first chip terminals, and the I/O connecting block may be configured to simultaneously connect the second input/output terminals of the first and second memory chips to the first and second chip terminals, respectively, responsive to the chip select signal.

According to further example embodiments, a semiconductor memory device may include a plurality of memory regions formed on one chip, each of the memory regions having a plurality of volatile memory cells that are formed as a density of $2^K$ bits, where K is an integer greater than or equal to 0, and a plurality of input/output (I/O) terminals for inputting and outputting data of the volatile memory cells, and at least one peripheral region that controls a write operation for writing data into the memory regions and a read operation for reading data from the memory regions based on a command and an address input from outside. Here, an entire density of the memory regions corresponds to a non-standard density (i.e., 'interim' density) of $2^M+2^N+2^O+\ldots$ (here, M, N, and O are integers greater than or equal to 0, and M, N, and O are different from each other).

In example embodiments, the memory regions may include a first memory region having a plurality of first volatile memory cells that are formed as a density of $2^M$ bits, where M is an integer greater than or equal to 0, and a plurality of first I/O terminals for inputting and outputting data of the first volatile memory cells, and a second memory region having a plurality of second volatile memory cells that are formed as a density of $2^N$ bits, where N is an integer greater than or equal to 0 and N is different from M, and a plurality of second I/O terminals for inputting and outputting data of the second volatile memory cells.

In example embodiments, the number of the first I/O terminals and/or the number of the second I/O terminals can be expressed in the form of $2^L$, where L is an integer greater than or equal to 0, respectively.

In example embodiments, the number of the first I/O terminals may be the same as the number of the second I/O terminals.

In example embodiments, the number of the first I/O terminals may be different from the number of the second I/O terminals.

In example embodiments, the first memory region and the second memory region may belong to the same rank of a semiconductor memory module.

In example embodiments, the first I/O terminals and the second I/O terminals may simultaneously operate as chip I/O terminals.

In example embodiments, the number of the chip I/O terminals may correspond to a sum of the number of the first I/O terminals and the number of the second I/O terminals.

In example embodiments, the first memory region and the second memory region may belong to different ranks of a semiconductor memory module.

In example embodiments, the first I/O terminals and the second I/O terminals may selectively operate as chip I/O terminals in response to at least one chip selection signal.

In example embodiments, the number of the chip I/O terminals may correspond to the number of the first I/O terminals or the number of the second I/O terminals.

In example embodiments, the semiconductor memory device may be included in a semiconductor memory package.

In example embodiments, the semiconductor memory package may be implemented by a monolithic package.

In example embodiments, the semiconductor memory package may be implemented by a dual-die package.

In example embodiments, the semiconductor memory package may be implemented by a through-silicon via dual-die stack package.

According to some example embodiments, a semiconductor memory package may include a plurality of semiconductor memory devices. Here, each of the semiconductor memory devices may include a plurality of memory regions formed on one chip, each of the memory regions having a plurality of volatile memory cells that are formed as a density of $2^K$ bits, where K is an integer greater than or equal to 0, and a plurality of input/output (I/O) terminals for inputting and outputting data of the volatile memory cells, and at least one peripheral region that controls a write operation for writing data into the memory regions and a read operation for reading data from the memory regions based on a command and an address input from outside. Here, an entire or total density of the memory regions corresponds to an interim density.

In example embodiments, the memory regions may include a first memory region having a plurality of first volatile memory cells that are formed as a density of $2^M$ bits, where M is an integer greater than or equal to 0, and a plurality of first I/O terminals for inputting and outputting data of the first volatile memory cells, and a second memory region having a plurality of second volatile memory cells that are formed as a density of $2^N$ bits, where N is an integer greater than or equal to 0 and N is different from M, and a plurality of second I/O terminals for inputting and outputting data of the second volatile memory cells.

In example embodiments, the first memory region and the second memory region may belong to the same rank of a semiconductor memory module.

In example embodiments, the first I/O terminals and the second I/O terminals may simultaneously operate as chip I/O terminals.

In example embodiments, the number of the chip I/O terminals may correspond to a sum of the number of the first I/O terminals and the number of the second I/O terminals.

In example embodiments, the first memory region and the second memory region may belong to different ranks of a semiconductor memory module.

In example embodiments, the first I/O terminals and the second I/O terminals may selectively operate as chip I/O terminals in response to at least one chip selection signal.

In example embodiments, the number of the chip I/O terminals may correspond to the number of the first I/O terminals or the number of the second I/O terminals.

In example embodiments, the semiconductor memory devices may include first through (k)th semiconductor memory devices, and the first through (k)th semiconductor memory devices are coupled in a monolithic package.

In example embodiments, the semiconductor memory devices may include first through (k)th semiconductor memory devices, and the first through (k)th semiconductor memory devices are coupled in a dual-die package.

In example embodiments, the semiconductor memory devices may include first through (k)th semiconductor memory devices, and the first through (k)th semiconductor memory devices are coupled in a through-silicon via dual-die stack package.

According to some example embodiments, a method of increasing a density of a semiconductor memory device may include forming a plurality of memory regions on one chip, each of the memory regions having a plurality of volatile memory cells that are formed as a density of $2^K$ bits, where K is an integer greater than or equal to 0, and a plurality of I/O terminals for inputting and outputting data of the volatile memory cells, and a step of determining the I/O terminals of the memory regions as chip I/O terminals of the semiconductor memory device. Here, an entire or total density of the memory regions corresponds to an interim density.

In example embodiments, the number of the I/O terminals in each memory region may be expressed in the form of $2^L$, where L is an integer greater than or equal to 0.

In example embodiments, the step of forming the memory regions on one chip may include a step of coupling the memory regions to the same rank of a semiconductor memory module.

In example embodiments, the step of determining the I/O terminals of the memory regions as the chip I/O terminals may include a step of simultaneously operating the I/O terminals of the memory regions as the chip I/O terminals.

In example embodiments, the number of the chip I/O terminals may correspond to the total number of the I/O terminals of the memory regions.

In example embodiments, the step of forming the memory regions on one chip may include a step of coupling the memory regions to different ranks of a semiconductor memory module.

In example embodiments, the step of determining the I/O terminals of the memory regions as the chip I/O terminals may include a step of selectively operating the I/O terminals of the memory regions as the chip I/O terminals in response to at least one chip selection signal.

In example embodiments, the number of the chip I/O terminals may correspond to the number of the I/O terminals of one memory region.

Therefore, a semiconductor memory device according to example embodiments may have a non-standard density (i.e., 'interim' density) of $2^{\wedge}M+2^{\wedge}N+2^{\wedge}O+\ldots$ (where M, N, and O are integers greater than or equal to 0, and M, N, and O are different from each other). As a result, compared to conventional semiconductor memory devices, the semiconductor memory device may have a smaller size, and may consume lower power.

In addition, a semiconductor memory package according to example embodiments may include a plurality of semiconductor memory devices having a non-standard or 'interim' density. As a result, compared to some conventional semiconductor memory packages, the semiconductor memory package may have a smaller size, and may consume lower power. Thus, a performance of a system having the semiconductor memory package may be improved.

Furthermore, methods according to example embodiments may be used to manufacture a semiconductor memory device having an 'interim' density.

Other devices and/or methods of fabrication according to some embodiments will become apparent to one with skill in the art upon review of the following drawings and detailed description. It is intended that all such additional methods and/or devices be included within this description, be within the scope of the invention, and be protected by the accompanying claims.

BRIEF DESCRIPTION OF THE DRAWINGS

Illustrative, non-limiting example embodiments will be more clearly understood from the following detailed description taken in conjunction with the accompanying drawings.

FIG. 6 is a block diagram illustrating an integrated circuit memory device when memory regions of FIG. 2 belong to different ranks.

DETAILED DESCRIPTION OF EMBODIMENTS

Figure 1:
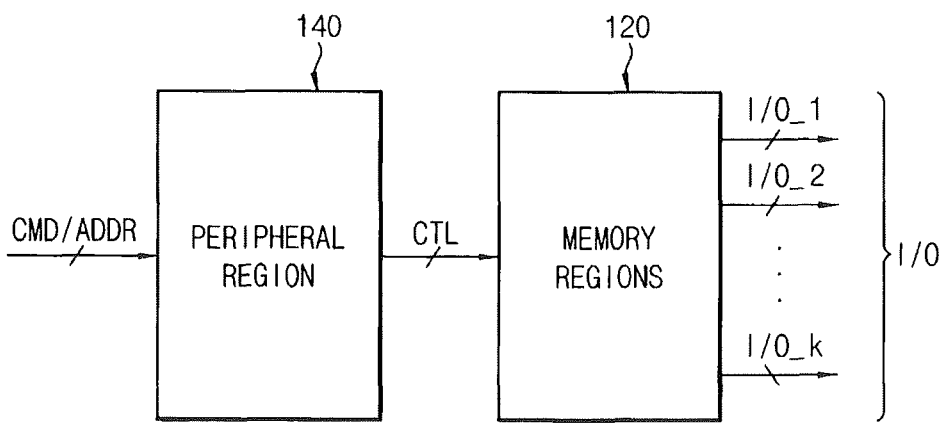
FIG. 1 is a diagram illustrating an integrated circuit memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating an integrated circuit memory device according to example embodiments.

Referring to FIG. 1, the semiconductor memory device 100 may include a plurality of memory regions 120 and a peripheral region 140 for controlling the memory regions 120.

Each memory region 120 may include a plurality of volatile memory cells. The number or quantity of volatile memory cells is related to a density or capacity of each memory region 120. Here, each memory region 120 has a 'standard' density or capacity of $2^\wedge K$ bits (also denoted herein as $2^K$ bits, where K is an integer greater than or equal to 0), and a density of one memory region 120 is different from a density of another memory region 120. In other words, a 'standard' density or capacity as referred to herein can be expressed, in bits, as a power of 2 (e.g., $2^K$). In addition, the memory regions 120 may include a plurality of I/O terminals I/O_1 through I/O_k for inputting/outputting data of the volatile memory cells, respectively. Therefore, the semiconductor memory device 100 including the memory regions 120 may have an 'interim' density or capacity (i.e., non-standard density or capacity) of $2^\wedge M+2^\wedge N+2^\wedge O+\ldots$ (where M, N, and O are integers greater than or equal to 0, and M, N, and O are different from each other) because each memory region 120 includes a plurality of volatile memory cells that are formed as a density (i.e., standard density) of $2^\wedge K$ bits. In other words, an 'interim' density or capacity as referred to herein may include two or more standard storage capacity memory regions, where the total storage capacity (e.g., the sum of the standard storage capacities), in bits, of the two or more memory regions cannot be expressed as a power of 2.

According to some example embodiments, each memory region 120 may include a memory cell array unit, a sense amplifier unit, an I/O gating unit, etc. For convenience of description, it is assumed that the memory regions 120 include a first memory region and a second memory region. In this case, the first memory region may include a first volatile memory cells that are formed as a density of $2^\wedge M$ bits (here, M is an integer greater than or equal to 0) and a first I/O terminals I/O_1 for inputting/outputting data of the first volatile memory cells, and the second memory region may include a second volatile memory cells that are formed as a density of $2^\wedge N$ bits (here, N is an integer greater than or equal to 0, and N is different from M) and a second I/O terminals I/O_2 for inputting/outputting data of the second volatile memory cells. The number of the memory regions 120 is described herein by way of example, and thus, the number of the memory regions 120 is not limited to 2. For example, the memory regions 120 may include at least three memory regions. In one example embodiment, the number of the first I/O terminals I/O_1 and the number of the second I/O terminals I/O_2 may be determined to be a form of $2^\wedge L$ (here, L is an integer greater than or equal to 0), respectively. For example, the number of the first I/O terminals I/O_1 may be 1, 2, 4, 8, 16, 32, 64, . . . , and the first I/O terminals I/O_1 may input/output data of 1 bit, 2 bits, 4 bits, 8 bits, 16 bits, 32 bits, 64 bits, Likewise, the number of the second I/O terminals I/O_2 may be 1, 2, 4, 8, 16, 32, 64, and the second I/O terminals I/O_2 may input/output data of 1 bit, 2 bits, 4 bits, 8 bits, 16 bits, 32 bits, 64 bits, . . . . Since the number of the first I/O terminals I/O_1 and the number of the second I/O terminals I/O_2 are exemplary, the number of the first I/O terminals I/O_1 and the number of the second I/O terminals I/O_2 are not limited thereto.

Generally, the number or quantity of the first I/O terminals I/O_1 of the first memory region and the number or quantity of the second terminals I/O_2 of the second memory region are determined according to required conditions. According to some example embodiments, however, the number of the first I/O terminals I/O_1 of the first memory region and the number of the second terminals I/O_2 of the second memory region may be determined according to a density of the first memory region and a density of the second memory region, respectively. In one example embodiment, the number of the first I/O terminals I/O_1 may be the same as the number of the second I/O terminals I/O_2. In this case, a density of the first memory region may be the same as a density of the second memory region. In another example embodiment, the number of the first I/O terminals I/O_1 may be different from the number of the second I/O terminals I/O_2. In this case, a density of the first memory region may be different from a density of the second memory region.

Meanwhile, in case that the first memory region and the second memory region belong to the same rank of a semiconductor memory module, the first I/O terminals I/O_1 and the second I/O terminals I/O_2 simultaneously operate as chip I/O terminals I/O of the semiconductor memory device 100 to simultaneously input/output data of the first memory region and the second memory region. Here, the number or quantity of the chip I/O terminals I/O may correspond to a sum of the number of the first I/O terminals I/O_1 and the number of the second I/O terminals I/O_2. On the other hand, in case that the first memory region and the second memory region belong to different ranks of a semiconductor memory module, the first I/O terminals I/O_1 and the second I/O terminals I/O_2 selectively operate as chip I/O terminals I/O of the semiconductor memory device 100 in response to at least one chip selection signal to selectively input/output data of the first memory region and the second memory region. Here, the number or quantity of the chip I/O terminals I/O may correspond to the number of the first I/O terminals I/O_1 or the number of the second I/O terminals I/O_2.

Based on a command CMD and an address ADDR input from outside (e.g., received from an external device, such as a memory controller), the peripheral region 140 may control a write operation for writing data into the memory regions 120 and a read operation for reading data from the memory regions 120. For this operation, the peripheral region 140 may generate a control signal CTL based on a command CMD and an address ADDR input from outside to simultaneously or selectively provide the control signal CTL to the memory regions 120. Thus, based on the control signal CTL, the memory regions 120 may write data input from outside into internal volatile memory cells, or may read data stored in the internal volatile memory cells. According to some example embodiments, the peripheral region 140 may include a control logic unit, an address register unit, a bank control logic unit, a row decoder unit, a column decoder unit, a column address latch unit, a data I/O buffer unit, etc. However, the peripheral region 140 may be described in detail below. As described above, since each memory region 120 has a density (i.e., standard density) of $2^K$ bits (here, K is an integer greater than or equal to 0), and a density of one memory region 120 is different from a density of another memory region 120, the semiconductor memory device 100 including the memory regions 120 may have a density (i.e., 'interim' density) of $2^M+2^N+2^O+\ldots$ (here, M, N, and O are integers greater than or equal to 0, and M, N, and O are different from each other). In addition, the semiconductor memory device 100 including the memory regions 120 may use the I/O terminals I/O_1 through I/O_k) of the memory regions 120 as the chip I/O terminals I/O. As a result, the semiconductor memory device 100 in which the memory regions 120 are formed on one chip may have a smaller size, and may consume less power compared to conventional semiconductor memory device. Although it is described that the semiconductor memory device 100 is a DRAM device (i.e., a volatile semiconductor memory device) in FIG. 1, the semiconductor memory device 100 may be applied to a non-volatile semiconductor memory device. For example, the semiconductor memory device 100 may be applied to an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc.

Figure 2:
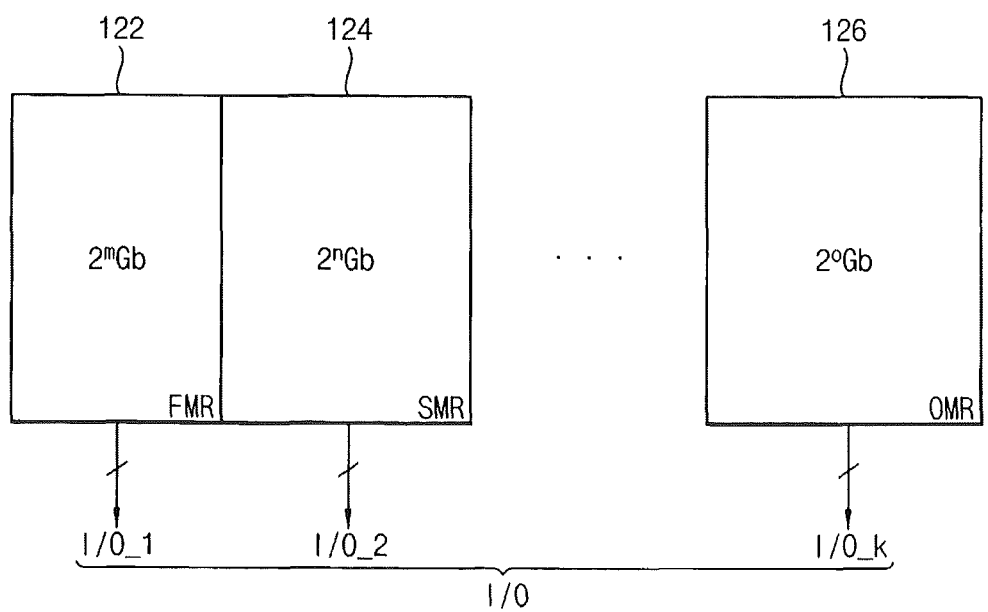
FIG. 2 is a diagram illustrating a plurality of memory regions in an integrated circuit memory device of FIG. 1.

FIG. 2 is a diagram illustrating a plurality of memory regions in an integrated circuit memory device of FIG. 1.

Referring to FIG. 2, the memory regions 120 may include first through (k)th memory regions 122 through 126. Here, the first through (k)th memory regions 122 through 126 are formed on one chip. For convenience of description, it is assumed that k is 3. As described above, the semiconductor memory device 100 including the first through (k)th memory regions 122 through 126 may have an 'interim' density because each of the first through (k)th memory regions 122 through 126 includes a plurality of volatile memory cells that are formed as a density (i.e., standard density) of $2^K$ bits, and densities of the first through (k)th memory regions 122 through 126 are different from each other. For example, the first memory region 122 may have a capacity of $2^M$ Gb (here, M is an integer greater than or equal to 0), the second memory region 124 may have a capacity of $2^N$ Gb (here, N is an integer greater than or equal to 0, and N is different from M), and the (k)th memory region 126 may have a capacity of $2^O$ Gb (here, O is an integer greater than or equal to 0, and O is different from M and N). That is, the first memory region 122 may include $2^{(M+30)}$ first volatile memory cells, the second memory region 124 may include $2^{(N+30)}$ second volatile memory cells, and the (k)th memory region 126 may include $2^{(O+30)}$ (k)th volatile memory cells. Meanwhile, the first memory region 122 may include first I/O terminals I/O_1 for inputting/outputting data of the $2^{(M+30)}$ first volatile memory cells, the second memory region 124 may include second I/O terminals I/O_2 for inputting/outputting data of the $2^{(N+30)}$ second volatile memory cells, and the (k)th memory region 126 may include (k)th I/O terminals I/O_k for inputting/outputting data of the $2^{(O+30)}$ (k)th volatile memory cells. In one example embodiment, in case that the first memory region 122, the second memory region 124, and the (k)th memory region 126 belong to the same rank of a semiconductor memory module, the first I/O terminals I/O_1, the second I/O terminals I/O_2, and the (k)th I/O terminals I/O_k may simultaneously operate as chip I/O terminals I/O to simultaneously input/output data of the first memory region 122, the second memory region 124, and the (k)th memory region 126. In another example embodiment, in case that the first memory region 122, the second memory region 124, and the (k)th memory region 126 belong to different ranks of a semiconductor memory module, the first I/O terminals I/O_1, the second I/O terminals I/O_2, and the (k)th I/O terminals I/O_k may selectively operate as chip I/O terminals I/O based on at least one chip selection signal to selectively input/output data of the first memory region 122, the second memory region 124, and the (k)th memory region 126. Thus, the semiconductor memory device 100 including the first through (k)th memory regions 122 through 126 may have a density (i.e., 'interim' density) of $2^M+2^N+2^O+\ldots$ (here, M, N, and O are integers greater than or equal to 0, and M, N, and O are different from each other) because each of the first through (k)th memory regions 122 through 126 has a density (i.e., standard density) of $2^K$ bits (here, K is an integer greater than or equal to 0), and densities of the first through (k)th memory regions 122 through 126 are different from each other.

Figure 3:
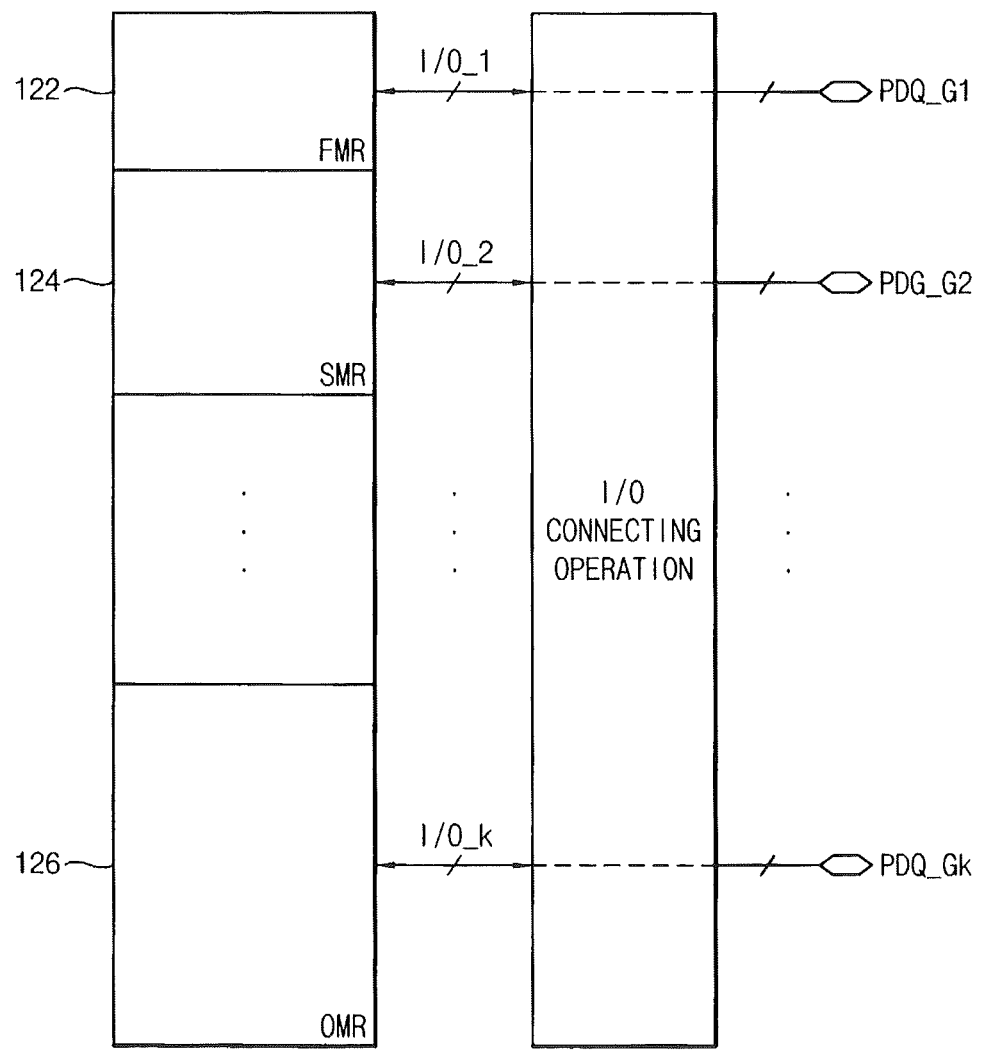
FIG. 3 is a diagram illustrating a plurality of chip input/output (I/O) terminals when memory regions of FIG. 2 belong to the same rank.

FIG. 3 is a diagram illustrating a plurality of chip input/output (I/O) terminals when memory regions of FIG. 2 belong to the same rank.

Referring to FIG. 3, the first through (k)th memory regions 122 through 126 may belong to the same rank of a semiconductor memory module. For convenience of description, it is assumed that k is 3. In this case, the first through (k)th I/O terminals I/O_1 through I/O_k for inputting/outputting data of the first through (k)th memory regions 122 through 126 may simultaneously operate as chip I/O terminals PDQ_G1 through PDQ_Gk. For this operation, the first through (k)th I/O terminals I/O_1 through I/O_k may be simultaneously coupled to the chip I/O terminals PDQ_G1 through PDQ_Gk by I/O connecting operations. For example, the first I/O terminals I/O_1 of the first memory region 122 may be coupled to the first chip I/O terminals PDQ_G1, the second I/O terminals I/O_2 of the second memory region 124 may be coupled to the second chip I/O terminals PDQ_G2, and the (k)th I/O terminals I/O_k of the (k)th memory region 126 may be coupled to the (k)th chip I/O terminals PDQ_Gk. According to some example embodiments, the number of the first I/O terminals I/O_1, the number of the second I/O terminals I/O_2, and the (k)th I/O terminals I/O_k may be determined to be a form of $2^L$ (here, L is an integer greater than or equal to 0), respectively. However, the number of the first I/O terminals I/O_1, the number of the second I/O terminals I/O_2, and the (k)th I/O terminals I/O_k are not limited thereto. For example, the number of the first chip I/O terminals PDQ_G1 may be 8 when data of 8 bits are input/output through the first I/O terminals I/O_1. The number of the second chip I/O terminals PDQ_G2 may be 16 when data of 16 bits are input/output through the second I/O terminals I/O_2. The number of the (k)th chip I/O terminals PDQ_Gk may be 32 when data of 32 bits are input/output through the (k)th I/O terminals I/O_k. The sum of the number of the first I/O terminals I/O_1, the number of the second I/O terminals I/O_2, and the number of the (k)th I/O terminals I/O_k may correspond to the sum of the number of the first chip I/O terminals PDQ_G1, the number of the second chip I/O terminals PDQ_G2, and the number of the (k)th chip I/O terminals PDQ_Gk. Generally, the number of the first I/O terminals I/O_1, the number of the second I/O terminals I/O_2, and the number of the (k)th I/O terminals I/O_k are determined according to required conditions. However, the number of the first I/O terminals I/O_1, the number of the second I/O terminals I/O_2, and the number of the (k)th I/O terminals I/O_k may be determined according to a density of the first memory region 122, a density of the second memory region 124, and a density of the (k)th memory region 126, respectively. In one example embodiment, the number of the first I/O terminals I/O_1, the number of the second I/O terminals I/O_2, and the number of the (k)th I/O terminals I/O_k are the same. In another example embodiment, the number of the first I/O terminals I/O_1, the number of the second I/O terminals I/O_2, and the number of the (k)th I/O terminals I/O_k are different from each other. Although it is described that the first through (k)th I/O terminals I/O_1 through I/O_k are coupled to the first through (k)th chip I/O terminals PDQ_G1 through PDQ_Gk, it should be understood that the I/O connecting operations may be implemented by various methods of operating the first through (k)th I/O terminals I/O_1 through I/O_k as the first through (k)th chip I/O terminals PDQ_G1 through PDQ_Gk.

Figure 4:
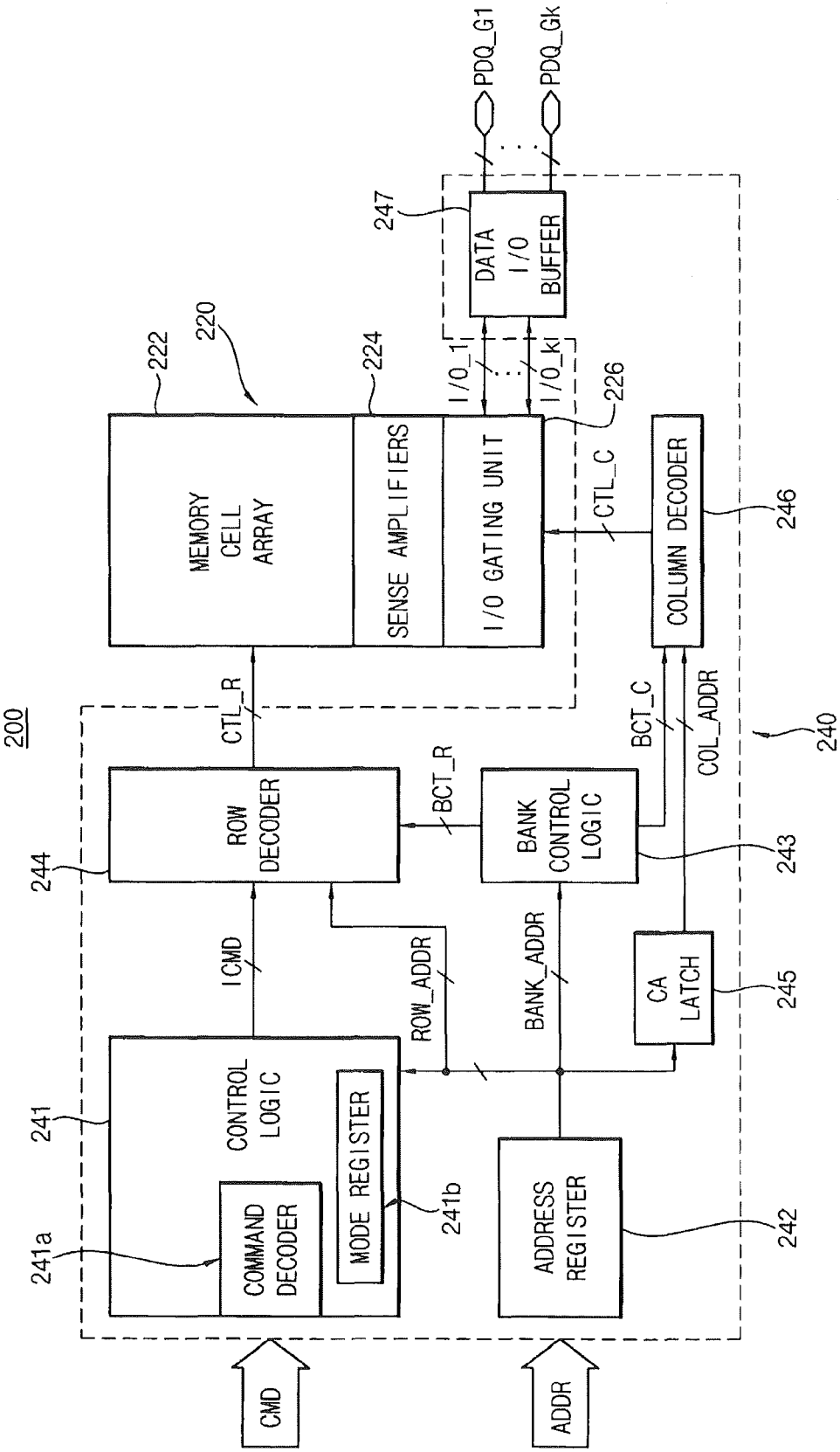
FIG. 4 is a block diagram illustrating an integrated circuit memory device when memory regions of FIG. 2 belong to the same rank.

FIG. 4 is a block diagram illustrating an integrated circuit memory device when memory regions of FIG. 2 belong to the same rank.

Referring to FIG. 4, the semiconductor memory device 200 may include a plurality of memory regions 220 and a peripheral region 240 for controlling the memory regions 220. Here, the semiconductor memory device 200 may be a volatile semiconductor memory device having a plurality of volatile memory cells. For example, the semiconductor memory device 200 may correspond to a DRAM device such as a synchronous dynamic random access memory (SDRAM) device, a double data rate synchronous dynamic random access memory (DDR SDRAM) device, a low power double data rate (LPDDR) device, a graphics double data rate (GDDR) device, a Rambus dynamic random access memory (RDRAM) device.

The memory regions 220 may include a memory cell array unit 222, a sense amplifier unit 224, and an I/O gating unit 226. As described above, the memory regions 220 are formed on one chip. In addition, each of the memory regions 220 includes a plurality of volatile memory cells that are formed as a density (i.e., standard density) of $2^K$ bits (here, K is an integer greater than or equal to 0). Here, densities of the memory regions 220 are different from each other. Thus, the memory cell array unit 222 corresponding to the memory regions 220 may have a density (i.e., 'interim' density) of $2^M+2^N+2^O+\ldots$ (here, M, N, and O are integers greater than or equal to 0, and M, N, and O are different from each other). Based on a row control signal CTL_R provided from the row decoder unit 244 and a column control signal CTL_C provided from the column decoder unit 246, the memory cell array unit 222 may write data into internal volatile memory cells, or may read data stored in the internal volatile memory cells. According to some example embodiments, the memory cell array unit 222 may include a plurality of bank arrays. The sense amplifier unit 224 may perform a write operation by applying data input from outside into the memory cell array unit 222, and may perform a read operation by sensing data stored in the memory cell array unit 222. The I/O gating unit 226 may perform a gating operation for data input from outside and data stored in the memory cell array unit 222 when the semiconductor memory device 200 perform a write operation or a read operation.

The peripheral region 240 may include a control logic unit 241, an address register unit 242, a bank control logic unit 243, a row decoder unit 244, a column address latch unit 245, a column decoder unit 246, and a data I/O buffer unit 247. The control logic unit 241 may control overall operations of the semiconductor memory device 200. For example, the control logic unit 241 may generate an internal control signal ICMD for write/read operations of the semiconductor memory device 200. According to some example embodiments, the control logic unit 241 may include a command decoder 241*a* that decodes a command CMD input from outside (i.e., memory controller) and a mode register 241*b* that set an operation mode of the semiconductor memory device 200. For example, the command decoder 241*a* may generate an internal control signal ICMD corresponding to the command CMD by decoding a write enable signal /WE, a row address strobe signal /RAS, a column address strobe signal /CAS, a chip selection signal /CS, etc. Meanwhile, the control logic unit 241 may further receive a clock signal CLK and a clock enable signal /CKE for operating the semiconductor memory device 200 by a synchronous method. Further, the control logic unit 241 may control a refresh operation of the semiconductor memory device 200 in response to a refresh command REF. The address register unit 242 may receive an address ADDR including a bank address BANK_ADDR, a row address ROW_ADDR, and a column address COL_ADDR from outside (i.e., memory controller). The address register unit 242 may provide the bank address BANK_ADDR to the bank control logic unit 243, may provide the row address ROW_ADDR to the row decoder unit 244, and may provide the column address COL_ADDR to the column decoder unit 246 through the column address latch unit 245.

The bank control logic unit 243 may generate a first bank control signal BCT_R and a second bank control signal BCT_C in response to the bank address BANK_ADDR.

For example, in case that the memory cell array unit 222 includes a plurality of bank arrays, a bank row decoder corresponding to the bank address BANK_ADDR among a plurality of bank row decoders in the row decoder unit 244 may be activated in response to the first bank control signal BCT_R, and a bank column decoder corresponding to the bank address BANK_ADDR among a plurality of bank column decoders in the column decoder unit 246 may be activated in response to the second bank control signal BCT_C. The row decoder unit 244 may decode the row address ROW_ADDR to activate a word-line corresponding to the row address ROW_ADDR. For example, the row decoder unit 244 may apply a word-line driving voltage to a word-line corresponding to the row address ROW_ADDR. The column address latch unit 245 may receive the column address COL_ADDR from the address register unit 242 to temporarily store the column address COL_ADDR, and may provide the column address COL_ADDR to the column decoder unit 246. According to some example embodiments, the column address latch unit 242 may gradually increase the column address COL_ADDR in a burst mode. The column decoder unit 246 may active at least one sense amplifier corresponding to the bank address BANK_ADDR and the column address COL_ADDR through the I/O gating unit 226. The data I/O buffer unit 247 may perform a buffer operation for I/O data.

As described above, the memory regions 220 may include the first through (k)th I/O terminals I/O_1 through I/O_k for inputting/outputting data of the memory regions 220. Namely, the memory cell array unit 222 may include a plurality of memory cell arrays of which each corresponds to each of the memory regions 220. In addition, each of the memory cell arrays may be accessed through the first through (k)th I/O terminals I/O_1 through I/O_k. As illustrated in FIG. 4, in case that the memory regions 220 belong to the same rank of a semiconductor memory module, the first through (k)th I/O terminals I/O_1 through I/O_k may be simultaneously coupled to the first through (k)th chip I/O terminals PDQ_G1 through PDQ_Gk by I/O connecting operations. Here, it should be understood that the I/O connecting operations may be implemented various methods of operating the first through (k)th I/O terminals I/O_1 through I/O_k as the first through (k)th chip I/O terminals PDQ_G1 through PDQ_Gk. As a result, the first through (k)th I/O terminals I/O_1 through I/O_k may simultaneously operate as the first through (k)th chip I/O terminals PDQ_G1 through PDQ_Gk. For example, the first I/O terminals I/O_1 may be coupled to the first chip I/O terminals PDQ_G1, the second I/O terminals I/O_2 may be coupled to the second chip I/O terminals PDQ_G2, and the (k)th I/O terminals I/O_k may be coupled to the (k)th chip I/O terminals PDQ_Gk. According to some example embodiments, the number of the first I/O terminals I/O_1, the number of the second I/O terminals I/O_2, and the number of the (k)th I/O terminals I/O_k may be determined to be a form of $2^L$ (here, L is an integer greater than or equal to 0), respectively. However, the number of the first I/O terminals I/O_1, the number of the second I/O terminals I/O_2, and the number of the (k)th I/O terminals I/O_k are not limited thereto. Meanwhile, the sum of the number of the first I/O terminals I/O_1, the number of the second I/O terminals I/O_2, and the number of the (k)th I/O terminals I/O_k may correspond to the sum of the number of the first chip I/O terminals PDQ_G1, the number of the second chip I/O terminals PDQ_G2, and the number of the (k)th chip I/O terminals PDQ_Gk.

Figure 5:
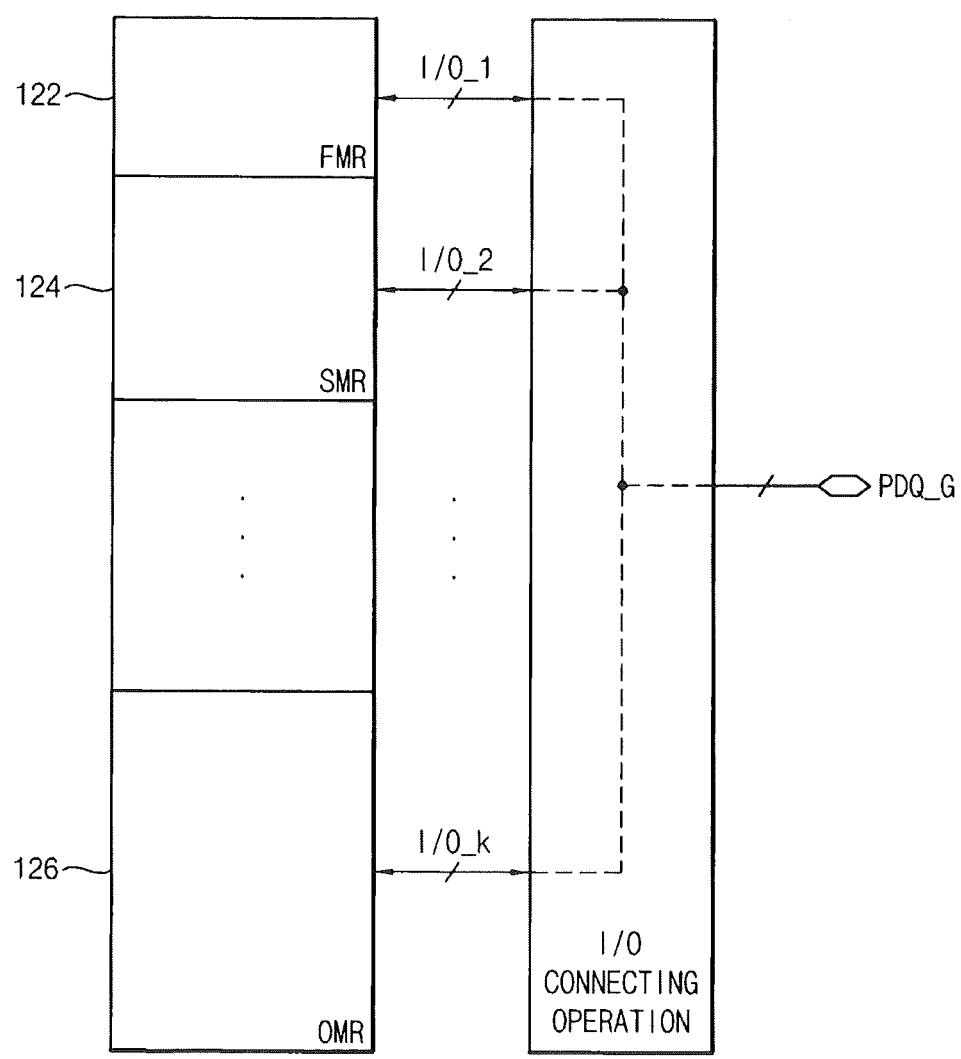
FIG. 5 is a diagram illustrating a plurality of chip I/O terminals when memory regions of FIG. 2 belong to different ranks.

FIG. 5 is a diagram illustrating a plurality of chip I/O terminals when memory regions of FIG. 2 belong to different ranks.

Referring to FIG. 5, the first through (k)th memory regions 122 through 126 may belong to different ranks of a semiconductor memory module. For convenience of description, it is assumed that k is 3. In this case, the first through (k)th I/O terminals I/O_1 through I/O_k for inputting/outputting data of the first through (k)th memory regions 122 through 126 may selectively operate as chip I/O terminals PDQ_G in response to at least one chip selection signal. For this operation, the first through (k)th I/O terminals I/O_1 through I/O_k may be selectively coupled to the chip I/O terminals PDQ_G by I/O connecting operations. For example, the first I/O terminals I/O_1 of the first memory region 122 may be coupled to the chip I/O terminals PDQ_G when the first memory region 122 is selected in response to at least one chip selection signal, the second I/O terminals I/O_2 of the second memory region 124 may be coupled to the chip I/O terminals PDQ_G when the second memory region 124 is selected in response to at least one chip selection signal, and the (k)th I/O terminals I/O_k of the (k)th memory region 126 may be coupled to the chip I/O terminals PDQ_G when the (k)th memory region 126 is selected in response to at least one chip selection signal. According to some example embodiments, the number of the first I/O terminals I/O_1, the number of the second I/O terminals I/O_2, and the (k)th I/O terminals I/O_k may be determined to be a form of $2^L$ (here, L is an integer greater than or equal to 0), respectively. However, the number of the first I/O terminals I/O_1, the number of the second I/O terminals I/O_2, and the (k)th I/O terminals I/O_k are not limited thereto. Meanwhile, the number of the chip I/O terminals PDQ_G may correspond to the number of the first I/O terminals I/O_1, the number of the second I/O terminals I/O_2, or the (k)th I/O terminals I/O_k. Generally, the number of the first I/O terminals I/O_1, the number of the second I/O terminals I/O_2, and the number of the (k)th I/O terminals I/O_k are determined according to required conditions. However, the number of the first I/O terminals I/O_1, the number of the second I/O terminals I/O_2, and the number of the (k)th I/O terminals I/O_k may be determined according to a density of the first memory region 122, a density of the second memory region 124, and a density of the (k)th memory region 126, respectively. In one example embodiment, the number of the first I/O terminals I/O_1, the number of the second I/O terminals I/O_2, and the number of the (k)th I/O terminals I/O_k are the same. In another example embodiment, the number of the first I/O terminals I/O_1, the number of the second I/O terminals I/O_2, and the number of the (k)th I/O terminals I/O_k are different from each other. Although it is described that the first through (k)th I/O terminals I/O_1 through I/O_k are coupled to the chip I/O terminals PDQ_G, it should be understood that the I/O connecting operations may be implemented by various methods of operating the first through (k)th I/O terminals I/O_1 through I/O_k as the chip I/O terminals PDQ_G.

FIG. 6 is a block diagram illustrating an integrated circuit memory device when memory regions of FIG. 2 belong to different ranks.

Referring to FIG. 6, the semiconductor memory device 300 may include a plurality of memory regions 320 and a peripheral region 340 for controlling the memory regions 320. Here, the semiconductor memory device 300 may be a volatile semiconductor memory device having a plurality of volatile memory cells. For example, the semiconductor memory device 300 may correspond to a DRAM device such as a SDRAM device, a DDR SDRAM device, a LPDDR device, a GDDR device, a RDRAM device.

The memory regions 320 may include a memory cell array unit 322, a sense amplifier unit 324, and an I/O gating unit 326. As described above, the memory regions 320 are formed on one chip. In addition, each of the memory regions 320 includes a plurality of volatile memory cells that are formed as a density (i.e., standard density) of $2^K$ bits (here, K is an integer greater than or equal to 0). Here, densities of the memory regions 320 are different from each other. Thus, the memory cell array unit 322 corresponding to the memory regions 320 may have a density (i.e., 'interim' density) of $2^M+2^N+2^O+\ldots$ (here, M, N, and O are integers greater than or equal to 0, and M, N, and O are different from each other). The peripheral region 340 may include a control logic unit 341, an address register unit 342, a bank control logic unit 343, a row decoder unit 344, a column address latch unit 345, a column decoder unit 346, and a data I/O buffer unit 347. Since the memory cell array unit 322, the sense amplifier unit 324, the I/O gating unit 326, the control logic unit 341, the address register unit 342, the bank control logic unit 343, the row decoder unit 344, the column address latch unit 345, the column decoder unit 346, and the data I/O buffer unit 347 are described above, duplicated description will be omitted below.

The memory regions 320 may include the first through (k)th I/O terminals I/O_1 through I/O_k for inputting/outputting data of the memory regions 320. Namely, the memory cell array unit 322 may include a plurality of memory cell arrays of which each corresponds to each of the memory regions 320. In addition, each of the memory cell arrays may be accessed through the first through (k)th I/O terminals I/O_1 through I/O_k. As illustrated in FIG. 6, in case that the memory regions 320 belong to different ranks of a semiconductor memory module, the first through (k)th I/O terminals I/O_1 through I/O_k may be selectively coupled to the chip I/O terminals PDQ_G by I/O connecting operations in response to at least one chip selection signal. Here, it should be understood that the I/O connecting operations may be implemented by various methods of operating the first through (k)th I/O terminals I/O_1 through I/O_k as the chip I/O terminals PDQ_G. As a result, the first through (k)th I/O terminals I/O_1 through I/O_k may selectively operate as the chip I/O terminals PDQ_G. For example, the first I/O terminals I/O_1 may be coupled to the chip I/O terminals PDQ_G when the first memory region is selected in response to at least one chip selection signal, the second I/O terminals I/O_2 may be coupled to the chip I/O terminals PDQ_G when the second memory region is selected in response to at least one chip selection signal, and the (k)th I/O terminals I/O_k may be coupled to the chip I/O terminals PDQ_G when the (k)th memory region is selected in response to at least one chip selection signal. According to some example embodiments, the number of the first I/O terminals I/O_1, the number of the second I/O terminals I/O_2, and the number of the (k)th I/O terminals I/O_k may be determined to be a form of $2^L$ (here, L is an integer greater than or equal to 0), respectively. However, the number of the first I/O terminals I/O_1, the number of the second I/O terminals I/O_2, and the number of the (k)th I/O terminals I/O_k are not limited thereto. Meanwhile, the number of the chip I/O terminals PDQ_G may correspond to the number of the first I/O terminals I/O_1, the number of the second I/O terminals I/O_2, or the number of the (k)th I/O terminals I/O_k.

Figure 7A:
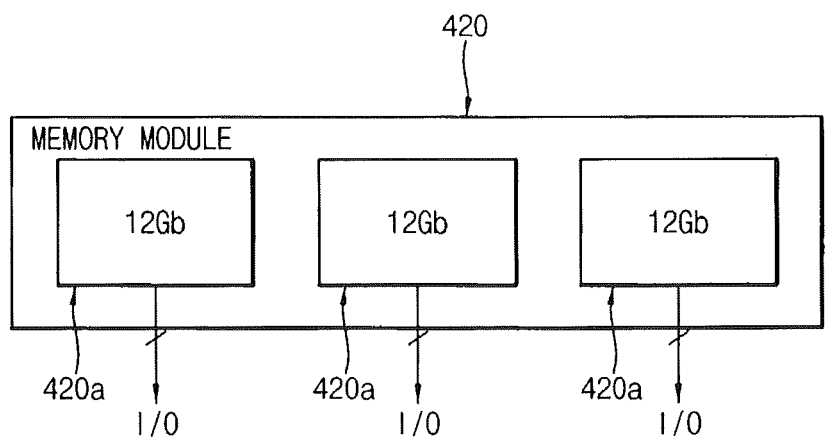
FIG. 7A is a diagram illustrating an example of a single-rank semiconductor memory module including an integrated circuit memory device of FIG. 1.

FIG. 7A is a diagram illustrating an example of a single-rank semiconductor memory module including an integrated circuit memory device of FIG. 1.

Referring to FIG. 7A, the single-rank semiconductor memory module 420 may include a plurality of semiconductor memory devices 420a. According to some example embodiments, the single-rank semiconductor memory module 420 may be a registered dual in-line memory module (RDIMM). Although it is illustrated in FIG. 7A that the single-rank semiconductor memory module 420 includes three semiconductor memory devices 420a, the number of semiconductor memory devices included in the single-rank semiconductor memory module 420 is not limited thereto.

As illustrated in FIG. 7A, the single-rank semiconductor memory module 420 may have a capacity of 36 Gb because the single-rank semiconductor memory module 420 includes three semiconductor memory devices 420a having a capacity of 12 Gb. Here, the semiconductor memory device 420a may have a density (i.e., 'interim' density) of $2^M+2^N+2^O+\ldots$ (here, M, N, and O are integers greater than or equal to 0, and M, N, and O are different from each other). For example, the semiconductor memory device 420a having a capacity of 12 Gb may be manufactured by forming a memory region having a density of $2^3$ Gb and a memory region having a density of $2^2$ Gb on one chip. However, the manufacture of the semiconductor memory device 420a is not limited thereto. That is, the semiconductor memory device 420a may be variously manufactured by forming a plurality of different capacity memory regions on one chip (i.e., while meeting the expression of $2^M+2^N+2^O+\ldots$) As the semiconductor memory device 420a includes a plurality of memory regions, the number of chip I/O terminals I/O of the semiconductor memory device 420a may be increased. For example, if a memory region having a capacity of 4 Gb includes four I/O terminals and a memory region having a capacity of 8 Gb includes eight I/O terminals, the semiconductor memory device 420a having a capacity of 12 Gb may include twelve chip I/O terminals I/O because the semiconductor memory device 420a is manufactured by forming a memory region having a capacity of 4 Gb and a memory region having a capacity of 8 Gb on one chip.

As described above, the semiconductor memory device 420a may have an 'interim' density. In addition, the number of the chip I/O terminals I/O of the semiconductor memory device 420a may be an 'interim' number. Thus, when the single-rank semiconductor memory module 420 includes three semiconductor memory devices 420a, and the semiconductor memory device 420a includes twelve chip I/O terminals I/O, the single-rank semiconductor memory module 420 may include thirty-six chip I/O terminals I/O. That is, if the semiconductor memory device 420a includes a data-bus of 12 bits, the single-rank semiconductor memory module 420 having three semiconductor memory devices 420a may include a data-bus of 36 bits. In conclusion, conventional semiconductor memory devices may not have an 'interim' density (e.g., a capacity of 12 Gb). As a result, nine conventional semiconductor memory devices having a capacity of 4 Gb are needed to manufacture one conventional semiconductor memory module having a capacity of 36 Gb. Thus, some conventional semiconductor memory module may have relatively larger size, and may consume higher power because the number of components (i.e., semiconductor memory devices) is relatively great compared to the single-rank semiconductor memory module 420. In other words, the single-rank semiconductor memory module 420 may have a smaller size, and may consume less power because the number of components is relatively small (or, the number of components per chip is increased) compared to some conventional semiconductor memory modules.

Figure 7B:
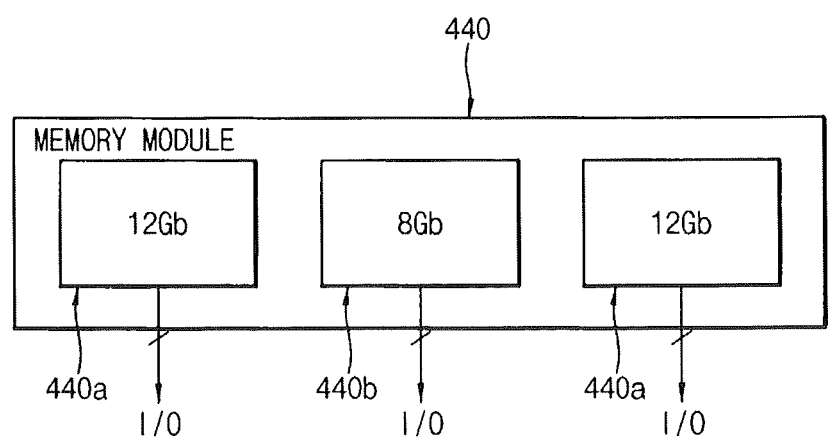
FIG. 7B is a diagram illustrating another example of a single-rank semiconductor memory module including an integrated circuit memory device of FIG. 1.

FIG. 7B is a diagram illustrating another example of a single-rank semiconductor memory module including an integrated circuit memory device of FIG. 1.

Referring to FIG. 7B, the single-rank semiconductor memory module 440 may include a plurality of semiconductor memory devices 440a and 440b. According to some example embodiments, the single-rank semiconductor memory module 440 may be a RDIMM. Although it is illustrated in FIG. 7B that the single-rank semiconductor memory module 440 includes three semiconductor memory devices 440a and 440b, the number of semiconductor memory devices included in the single-rank semiconductor memory module 440 is not limited thereto.

As illustrated in FIG. 7B, the single-rank semiconductor memory module 440 may have a capacity of 32 Gb because the single-rank semiconductor memory module 440 includes two semiconductor memory devices 440a having a capacity of 12 Gb and one semiconductor memory device 440b having a capacity of 8 Gb. Here, each of the semiconductor memory devices 440a and 440b may have a density (i.e., 'interim' density) of $2^{\wedge}M+2^{\wedge}N+2^{\wedge}O+\ldots$ (here, M, N, and O are integers greater than or equal to 0, and M, N, and O are different from each other). For example, the semiconductor memory device 440a having a capacity of 12 Gb may be manufactured by forming a memory region having a density of $2^{\wedge}3$ Gb and a memory region having a density of $2^{\wedge}2$ Gb on one chip. In addition, the semiconductor memory device 440b may be manufactured by forming a memory region having a density of $2^{\wedge}2$ Gb and a memory region having a density of $2^{\wedge}2$ Gb on one chip. However, the manufacture of the semiconductor memory devices 440a and 440b is not limited thereto. That is, the semiconductor memory devices 440a and 440b may be variously manufactured by forming a plurality of memory regions on one chip (i.e., while meeting the expression of $2^{\wedge}M+2^{\wedge}N+2^{\wedge}O+\ldots$). As the semiconductor memory devices 440a and 440b includes a plurality of memory regions, the number of chip I/O terminals I/O of the semiconductor memory devices 440a and 440b may be increased. For example, if a memory region having a capacity of 4 Gb includes four I/O terminals and a memory region having a capacity of 8 Gb includes eight I/O terminals, the semiconductor memory device 440a having a capacity of 12 Gb may include twelve chip I/O terminals I/O because the semiconductor memory device 440a is manufactured by forming a memory region having a capacity of 4 Gb and a memory region having a capacity of 8 Gb on one chip.

As described above, the semiconductor memory devices 440a and 440b may have an 'interim' density, respectively. In addition, the number of the chip I/O terminals I/O of the semiconductor memory devices 440a and 440b may be an 'interim' number, respectively. Thus, when the single-rank semiconductor memory module 440 includes three semiconductor memory devices 440a and 440b, the semiconductor memory device 440a having a capacity of 12 Gb includes twelve chip I/O terminals I/O, and the semiconductor memory device 440b having a capacity of 8 Gb includes eight chip I/O terminals I/O, the single-rank semiconductor memory module 440 may include thirty-two chip I/O terminals I/O. That is, if the semiconductor memory device 440a having a capacity of 12 Gb includes a data-bus of 12 bits, and the semiconductor memory device 440b having a capacity of 8 Gb includes a data-bus of 8 bits, the single-rank semiconductor memory module 440 having two semiconductor memory devices 440a and one semiconductor memory device 440b may include a data-bus of 32 bits. In conclusion, conventional semiconductor memory devices may not have an 'interim' density (e.g., a capacity of 12 Gb). As a result, conventional semiconductor memory modules may have a larger size, and may consume more power because the number of components (i.e., semiconductor memory devices) is relatively great compared to the single-rank semiconductor memory module 440. In other words, the single-rank semiconductor memory module 440 may have a smaller size, and may consume less power because the number of components is relatively small (or, the number of components per chip is increased) compared to conventional semiconductor memory module.

Figure 8A:
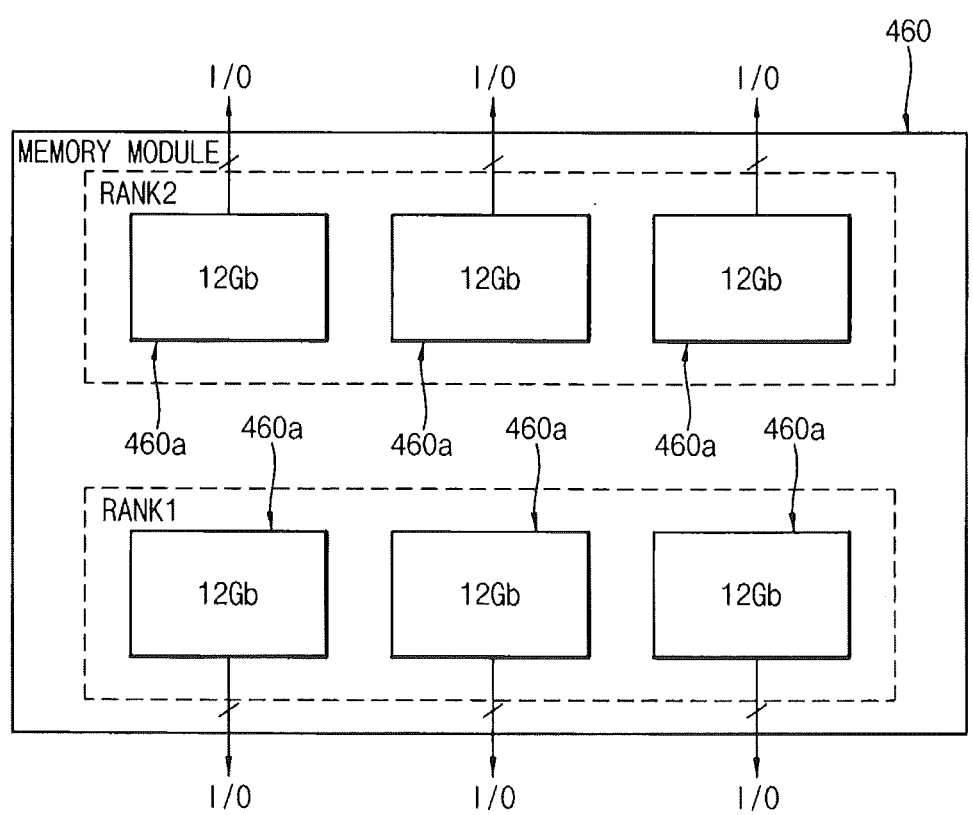
FIG. 8A is a diagram illustrating an example of a multi-rank semiconductor memory module including an integrated circuit memory device of FIG. 1.

FIG. 8A is a diagram illustrating an example of a multi-rank semiconductor memory module including an integrated circuit memory device of FIG. 1.

Referring to FIG. 8A, the multi-rank semiconductor memory device 460 may have a first rank RANK1 and a second rank RANK2, and the first and second ranks RANK1 and RANK2 of the multi-rank semiconductor memory device 460 may include a plurality of semiconductor memory devices 460a, respectively. According to some example embodiments, the multi-rank semiconductor memory module 460 may be a RDIMM. Although it is illustrated that the first and second ranks RANK1 and RANK2 of the multi-rank semiconductor memory module 460 each include three semiconductor memory devices 460a in FIG. 8A, the number of the semiconductor memory devices included in the multi-rank semiconductor memory module 460 is not limited thereto.

As illustrated in FIG. 8A, the multi-rank semiconductor memory module 460 may have a capacity of 72 Gb because the multi-rank semiconductor memory module 460 has the first rank RANK1 including three semiconductor memory devices 460a having a capacity of 12 Gb and the second rank RANK2 including three semiconductor memory devices 460a having a capacity of 12 Gb. Here, the first rank RANK1 and the second rank RANK2 may be selectively accessed based on at least one chip selection signal. The semiconductor memory device 460a may have a density (i.e., 'interim' density) of $2^{\wedge}M+2^{\wedge}N+2^{\wedge}O+\ldots$ (here, M, N, and O are integers greater than or equal to 0, and M, N, and O are different from each other). That is, the semiconductor memory device 460a may be variously manufactured by forming a plurality of memory regions on one chip (i.e., while meeting the expression of $2\,\mu m+2^{\wedge}N+2^{\wedge}O+\ldots$). As the semiconductor memory device 460a includes a plurality of memory regions, the number of chip I/O terminals I/O of the semiconductor memory device 460a may be increased. In addition, the number of the chip I/O terminals I/O of the semiconductor memory device 460a may be an 'interim' number. As described above, the multi-rank semiconductor memory module 460 may have a smaller size, and may consume less power because the number of components is relatively small (or, the number of components per chip is increased) compared to conventional semiconductor memory modules.

Figure 8B:
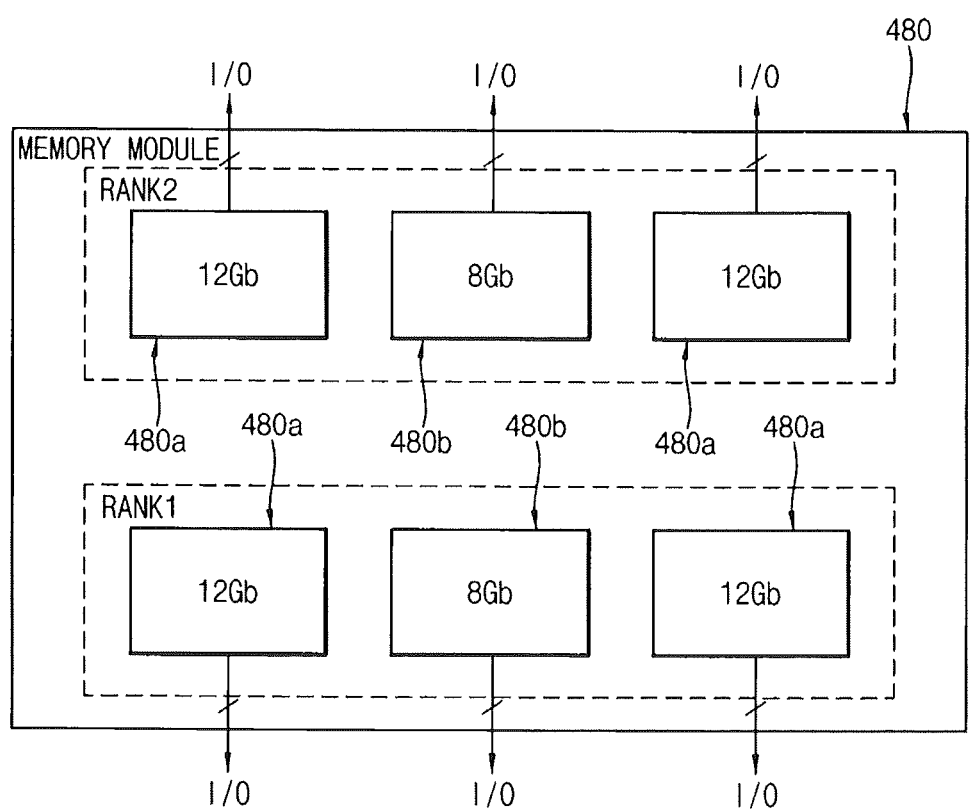
FIG. 8B is a diagram illustrating another example of a multi-rank semiconductor memory module including an integrated circuit memory device of FIG. 1.

FIG. 8B is a diagram illustrating another example of a multi-rank semiconductor memory module including an integrated circuit memory device of FIG. 1.

Referring to FIG. 8B, the multi-rank semiconductor memory device 480 may have a first rank RANK1 and a second rank RANK2, and the first and second ranks RANK1 and RANK2 of the multi-rank semiconductor memory device 460 may include a plurality of semiconductor memory devices 480a and 480b, respectively. According to some example embodiments, the multi-rank semiconductor memory module 480 may be a RDIMM. Although it is illustrated in FIG. 8B that the first and second ranks RANK1 and RANK2 of the multi-rank semiconductor memory module 480 includes two semiconductor memory devices 480a having a capacity of 12 Gb and one semiconductor memory device 480b having a capacity of 8 Gb, respectively, the number of the semiconductor memory devices included in the multi-rank semiconductor memory module 480 is not limited thereto.

As illustrated in FIG. 8B, the multi-rank semiconductor memory module 480 may have a capacity of 64 Gb because the multi-rank semiconductor memory module 480 has the first rank RANK1 including two semiconductor memory devices 480a having a capacity of 12 Gb and one semiconductor memory device 480b having a capacity of 8 Gb, and the second rank RANK2 including two semiconductor memory devices 480a having a capacity of 12 Gb and one semiconductor memory device 480b having a capacity of 8 Gb. Here, the first rank RANK1 and the second rank RANK2 may be selectively accessed based on at least one chip selection signal. The semiconductor memory devices 480a and 480b may have a density (i.e., 'interim' density) of $2^{\wedge}M+2^{\wedge}N+2^{\wedge}O+\ldots$ (here, M, N, and O are integers greater than or equal to 0, and M, N, and O are different from each other), respectively. That is, the semiconductor memory devices 480a and 480b may be variously manufactured by forming a plurality of memory regions on one chip (i.e., while meeting the expression of $2 \ \mu m+2^{\wedge}N+2^{\wedge}O+\ldots$), respectively. As the semiconductor memory devices 480a and 480b include a plurality of memory regions, the number of chip I/O terminals I/O of the semiconductor memory device 460a may be increased. In addition, the number of the chip I/O terminals I/O of the semiconductor memory devices 480a and 480b may be an 'interim' number. As described above, the multi-rank semiconductor memory module 480 may have a smaller size, and may consume less power because the number of components is relatively small (or, the number of components per chip is increased) compared to conventional semiconductor memory modules.

Figure 9:
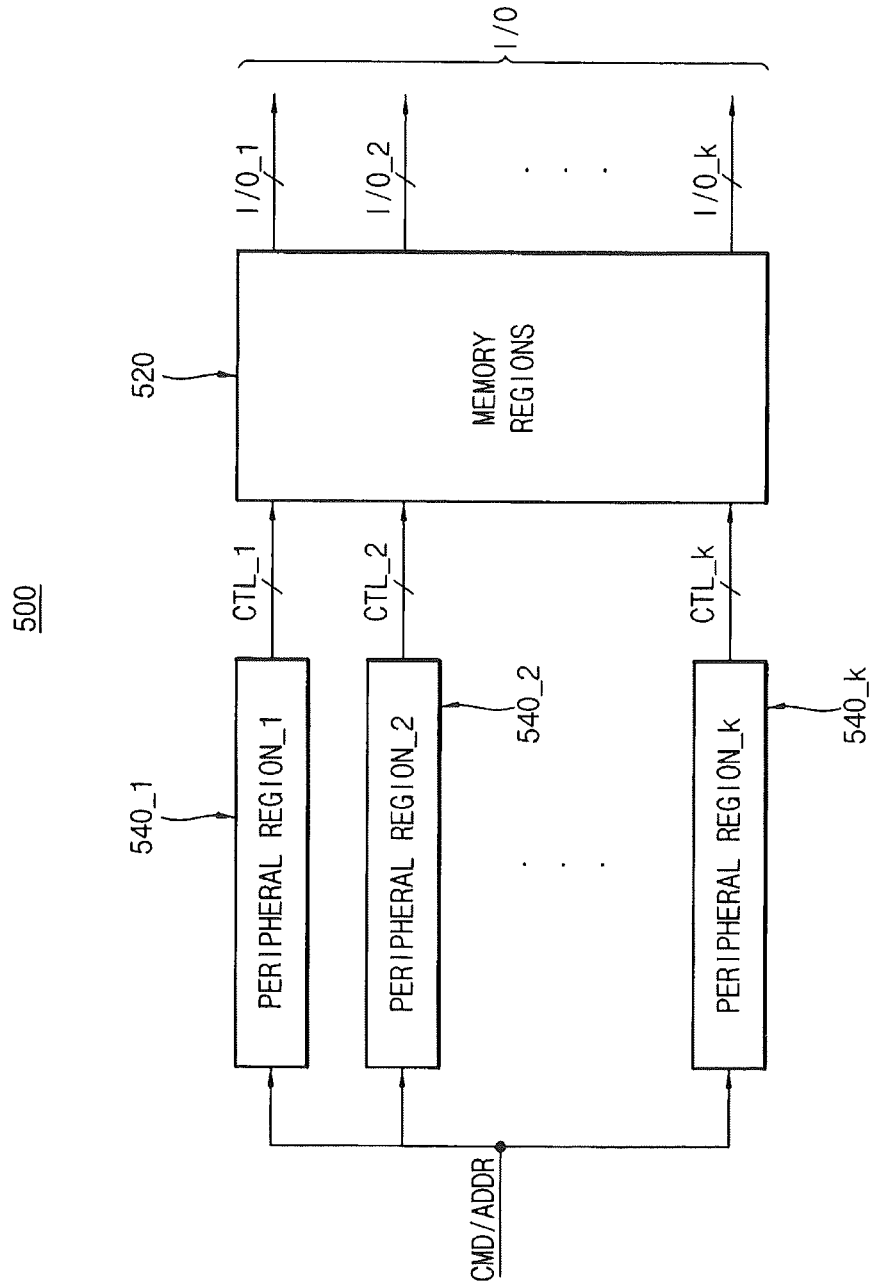
FIG. 9 is a diagram illustrating an integrated circuit memory device according to example embodiments.

FIG. 9 is a diagram illustrating an integrated circuit memory device according to example embodiments.

Referring to FIG. 9, the semiconductor memory device 500 may include a plurality of memory regions 520 and a plurality of peripheral regions 540_1 through 540_k for controlling the memory regions 520.

Each memory region 520 may include a plurality of volatile memory cells. The number of volatile memory cells is related to a density of each memory region 520. Here, each memory region 520 has a density (i.e., standard density) of $2^{\wedge}K$ bits (here, K is an integer greater than or equal to 0), and a density of one memory region 520 is different from a density of another memory region 520. In addition, the memory regions 520 may include a plurality of I/O terminals I/O_1 through I/O_k for inputting/outputting data of the volatile memory cells, respectively. Therefore, the semiconductor memory device 500 including the memory regions 520 may have a density (i.e., 'interim' density) of $2^{\wedge}M+2^{\wedge}N+2^{\wedge}O+\ldots$ (here, M, N, and O are integers greater than or equal to 0, and M, N, and O are different from each other) because each memory region 520 includes a plurality of volatile memory cells that are formed as a density (i.e., standard density) of $2^{\wedge}K$ bits. According to some example embodiments, each memory region 520 may include a memory cell array unit, a sense amplifier unit, an I/O gating unit, etc. For convenience of description, it is assumed that the memory regions 520 include a first memory region and a second memory region. In this case, the first memory region may include a first volatile memory cells that are formed as a density of $2^{\wedge}M$ bits (here, M is an integer greater than or equal to 0) and a first I/O terminals I/O_1 for inputting/outputting data of the first volatile memory cells, and the second memory region may include a second volatile memory cells that are formed as a density of $2^{\wedge}N$ bits (here, N is an integer greater than or equal to 0, and N is different from M) and a second I/O terminals I/O_2 for inputting/outputting data of the second volatile memory cells. Since the number of the memory regions 520 is exemplary, the number of the memory regions 520 is not limited to 2. For example, the memory regions 520 may include at least three memory regions. In one example embodiment, the number of the first I/O terminals I/O_1 and the number of the second I/O terminals I/O_2 may be determined to be a form of $2^{\wedge}L$ (here, L is an integer greater than or equal to 0), respectively. For example, the number of the first I/O terminals I/O_1 may be 1, 2, 4, 8, 16, 32, 64, ..., and the first I/O terminals I/O_1 may input/output data of 1 bit, 2 bits, 4 bits, 8 bits, 16 bits, 32 bits, 64 bits, .... Likewise, the number of the second I/O terminals I/O_2 may be 1, 2, 4, 8, 16, 32, 64, ..., and the second I/O terminals I/O_2 may input/output data of 1 bit, 2 bits, 4 bits, 8 bits, 16 bits, 32 bits, 64 bits, .... Since the number of the first I/O terminals I/O_1 and the number of the second I/O terminals I/O_2 are exemplary, the number of the first I/O terminals I/O_1 and the number of the second I/O terminals I/O_2 are not limited thereto.

Generally, the number of the first I/O terminals I/O_1 of the first memory region and the number of the second terminals I/O_2 of the second memory region are determined according to required conditions. According to some example embodiments, however, the number of the first I/O terminals I/O_1 of the first memory region and the number of the second terminals I/O_2 of the second memory region may be determined according to a density of the first memory region and a density of the second memory region, respectively. In one example embodiment, the number of the first I/O terminals I/O_1 may be the same as the number of the second I/O terminals I/O_2. In this case, a density of the first memory region may be the same as a density of the second memory region. In another example embodiment, the number of the first I/O terminals I/O_1 may be different from the number of the second I/O terminals I/O_2. In this case, a density of the first memory region may be different from a density of the second memory region. Meanwhile, in case that the first memory region and the second memory region belong to the same rank of a semiconductor memory module, the first I/O terminals I/O_1 and the second I/O terminals simultaneously operate as chip I/O terminals I/O of the semiconductor memory device 500 to simultaneously input/output data of the first memory region and the second memory region. Here, the number of the chip I/O terminals I/O may correspond to a sum of the number of the first I/O terminals I/O_1 and the number of the second I/O terminals I/O_2. On the other hand, in case that the first memory region and the second memory region belong to different ranks of a semiconductor memory module, the first I/O terminals I/O_1 and the second I/O terminals selectively operate as chip I/O terminals I/O of the semiconductor memory device 500 in response to at least one chip selection signal to selectively input/output data of the first memory region and the second memory region. Here, the number of the chip I/O terminals I/O may correspond to the number of the first I/O terminals I/O_1 or the number of the second I/O terminals I/O_2.

Based on a command CMD and an address ADDR input from outside, the peripheral regions 540_1 through 540_k may control a write operation for writing data into the memory regions 520 and a read operation for reading data from the memory regions 520, respectively. For example, the first peripheral region 540_1 may control the first memory region among the memory regions 520, the second peripheral region 540_2 may control the second memory region among the memory regions 520, and the (k)th peripheral region 540_k may control the (k)th memory region among the memory regions 520. For this operation, the peripheral regions 540_1 through 540_k may generate first through (k)th control signals CTL_1 through CTL_k based on a command CMD and an address ADDR input from outside to simultaneously or selectively provide the first through (k)th control signals CTL_1 through CTL_k to the memory regions 520. Thus, based on the first through (k)th control signals CTL_1 through CTL_k, the memory regions 520 may write data input from outside into internal volatile memory cells, or may read data stored in the internal volatile memory cells. According to some example embodiments, each peripheral region 540 may include a control logic unit, an address register unit, a bank control logic unit, a row decoder unit, a column decoder unit, a column address latch unit, a data I/O buffer unit, etc. As described above, since each memory region 520 has a density (i.e., standard density) of $2^K$ bits (here, K is an integer greater than or equal to 0), and a density of one memory region 520 is different from a density of another memory region 520, the semiconductor memory device 500 including the memory regions 520 may have a density (i.e., 'interim' density) of $2^M+2^N+2^O+\ldots$ (here, M, N, and O are integers greater than or equal to 0, and M, N, and O are different from each other). In addition, the semiconductor memory device 500 including the memory regions 520 may use the I/O terminals I/O_1 through I/O_k) of the memory regions 520 as the chip I/O terminals I/O. As a result, the semiconductor memory device 500 in which the memory regions 520 are formed on one chip may have a smaller size, and may consume less power compared to conventional semiconductor memory device. Although it is described that the semiconductor memory device 500 is a DRAM device (i.e., a volatile semiconductor memory device) in FIG. 9, the semiconductor memory device 500 may be applied to a non-volatile semiconductor memory device. For example, the semiconductor memory device 500 may be applied to an EEPROM device, a flash memory device, a PRAM device, a RRAM device, a NFGM device, a PoRAM device, a MRAM device, a FRAM device, etc.

Figure 10:
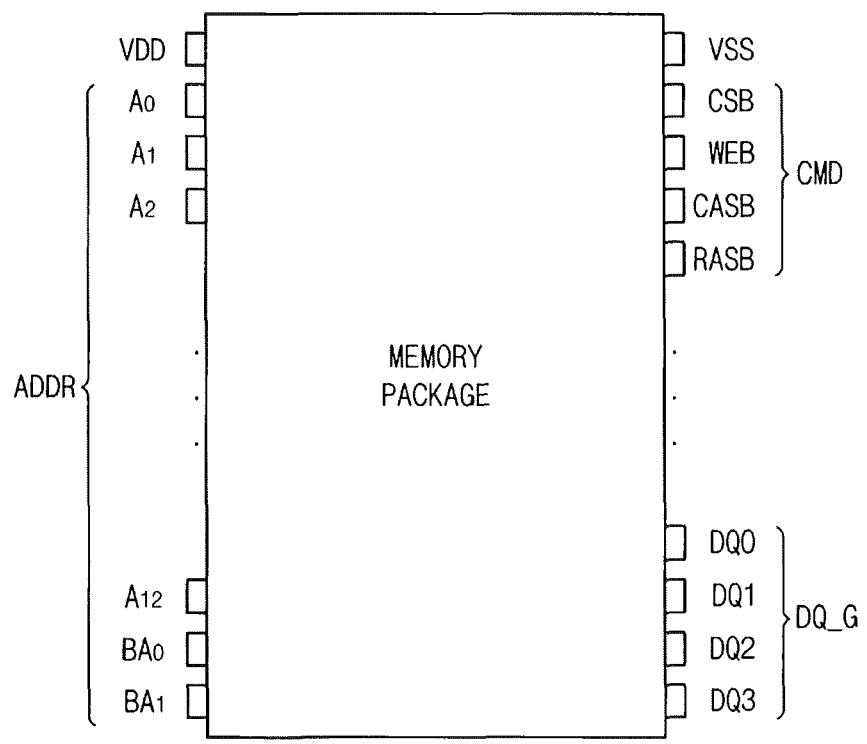
FIG. 10 is a diagram illustrating an integrated circuit memory package according to example embodiments.

FIG. 10 is a diagram illustrating an integrated circuit memory package according to example embodiments.

Referring to FIG. 10, the semiconductor memory package 600 may include a plurality of semiconductor memory devices. The semiconductor memory package 600 employs a multi-chip packaging technique by which a plurality of semiconductor memory devices are included in one package. According to some example embodiments, the semiconductor memory package 600 may be implemented by a monolithic package, a dual-die (DDP) package, a through-silicon via (TSV) dual-die stack package. In FIG. 10, each semiconductor memory device in the semiconductor memory package 600 may include a plurality of memory regions and at least one peripheral region. Here, each memory region includes a plurality of volatile memory cells that are formed as a density (i.e., standard density) of $2^K$ bits (here, K is an integer greater than or equal to 0), and a plurality of I/O terminals for inputting/outputting data of the volatile memory cells. In addition, a density of one memory region is different from a density of another memory region. Further, the memory regions are formed on one chip. Based on a command CMD and an address ADDR input from outside, the at least one peripheral region controls a write operation for writing data into the memory regions and a read operation for reading data from the memory regions.

An example of the semiconductor memory package 600 having a capacity of 512 Mb is shown in FIG. 10. That is, the semiconductor memory package 600 may include a power voltage pin VDD, a ground voltage pin VSS, a plurality of address pins A1 through A12 and BA0 through BA1, a plurality of command pins CSB, WEB, CASB, and RASB, a plurality of chip I/O pins DQ0 through DQ3, etc. Since the pin-configurations of the semiconductor memory package 600 are exemplary, the pin-configurations of the semiconductor memory package 600 may be changed according to required conditions. As illustrated in FIG. 10, a plurality of semiconductor memory devices in the semiconductor memory package 600 may receive the command CMD from the command pins CSB, WEB, CASB, and RASB, and may receive the address ADDR from the address pins A0 through A12 and BA0 through BA1. Then, the semiconductor memory devices may perform a write operation and a read operation based on I/O data that are input/output through the chip I/O pins DQ0 through DQ3. For example, data of 4 bits may be input/output because the number of the chip I/O pins DQ0 through DQ3 is 4 in FIG. 10.

As described above, each semiconductor memory device in the semiconductor memory package 600 may have a density (i.e., 'interim' density) of $2^M+2^N+2^O+\ldots$ (here, M, N, and O are integers greater than or equal to 0, and M, N, and O are different from each other) because each semiconductor memory device includes a plurality of memory regions, and each memory region includes a plurality of volatile memory cells that are formed as a density (i.e., standard density) of $2^K$ bits. Thus, a capacity of some conventional semiconductor memory packages may be restrictively determined because the conventional semiconductor memory packages may include a plurality of semiconductor memory devices only having a standard density. On the other hand, a capacity of the semiconductor memory package 600 may be non-restrictively determined because the semiconductor memory package 600 includes a plurality of semiconductor memory devices having an 'interim' density. For example, the conventional semiconductor memory package may have a capacity of 12 Gb by including three semiconductor memory devices having a capacity of 4 Gb. However, the semiconductor memory package 600 may have a capacity of 12 Gb by including two semiconductor memory devices having a capacity of 6 Gb. As a result, the semiconductor memory package 600 may have a smaller size, and may consume less power compared to some conventional semiconductor memory packages.

In one example embodiment, each semiconductor memory device in the semiconductor memory package 600 may include a first memory region and a second memory region. Here, the first memory region includes a first volatile memory cells that are formed as a density of $2^M$ bits (here, M is an integer greater than or equal to 0) and a first I/O terminals for inputting/outputting data of the first volatile memory cells. Similarly, the second memory region includes a second volatile memory cells that are formed as a density of $2^N$ bits (here, N is an integer greater than or equal to 0, and N is different from M) and a second I/O terminals for inputting/outputting data of the second volatile memory cells. In case that the first memory region and the second memory region belong to the same rank of the semiconductor memory module 600, the first I/O terminals and the second I/O terminals simultaneously operate as chip I/O terminals of the semiconductor memory device. In this case, the number of the chip I/O terminals may correspond to a sum of the number of the first I/O terminals and the number of the second I/O terminals. On the other hand, in case that the first memory region and the second memory region belong to different ranks of the semiconductor memory module 600, the first I/O terminals and the second I/O terminals selectively or alternatingly operate as chip I/O terminals of the semiconductor memory device in response to at least one chip selection signal. In this case, the number of the chip I/O terminals may correspond to the number of the first I/O terminals or the number of the second I/O terminals. Meanwhile, according to required conditions, the chip I/O terminals of one semiconductor memory device and the chip I/O terminals of another semiconductor memory device in the semiconductor memory package 600 may be simultaneously coupled to the chip I/O pins DQ_G of the semiconductor memory package 600. Alternatively, the chip I/O terminals of one semiconductor memory device and the chip I/O terminals of another semiconductor memory device in the semiconductor memory package 600 may be selectively coupled to the chip I/O pins DQ_G of the semiconductor memory package 600.

Figure 11:
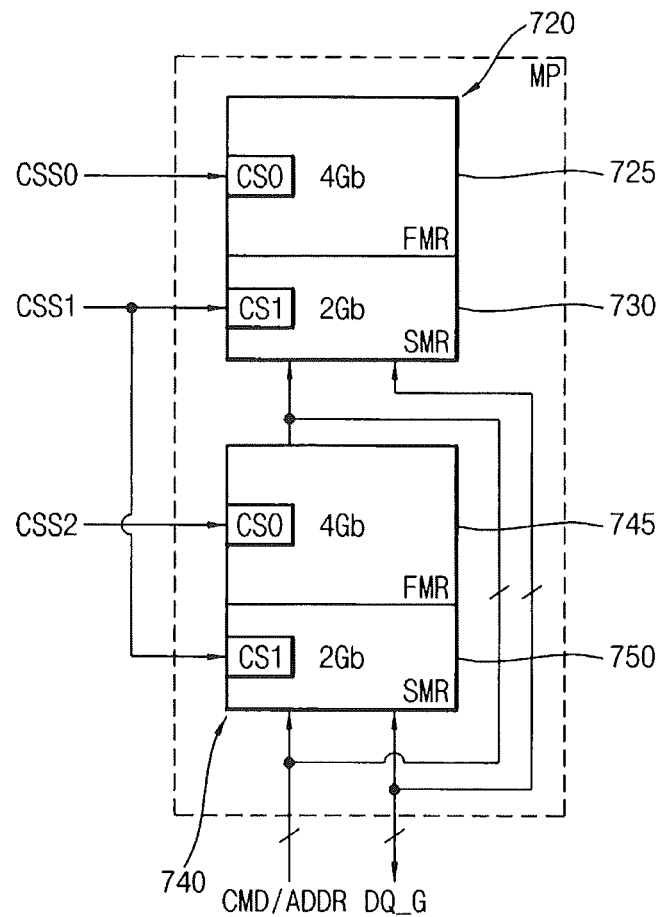
FIG. 11 is a diagram illustrating an example in which an integrated circuit memory package of FIG. 10 is implemented by a monolithic package.

FIG. 11 is a diagram illustrating an example in which an integrated circuit memory package of FIG. 10 is implemented by a monolithic package.

Referring to FIG. 11, the semiconductor memory package 700 may be implemented by a monolithic package in which a first semiconductor memory device 720 is coupled to a second semiconductor memory device 740. The first semiconductor memory device 720 may include a first memory region FMR 725 having a capacity of 4 Gb and a second memory region SMR 730 having a capacity of 2 Gb. The second semiconductor memory device 740 may include a first memory region FMR 745 having a capacity of 4 Gb and a second memory region SMR 750 having a capacity of 2 Gb. That is, the first semiconductor memory device 720 may have a capacity of 6 Gb (i.e., 'interim' density), and the second semiconductor memory device 740 may also have a capacity of 6 Gb (i.e., 'interim' density). In addition, the first semiconductor memory device 720 may include a first chip selection terminal CS0 that receives a chip selection signal for activating/deactivating the first memory region 725, and a second chip selection terminal CS1 that receives a chip selection signal for activating/deactivating the second memory region 730. Similarly, the second semiconductor memory device 740 may include a first chip selection terminal CS0 that receives a chip selection signal for activating/deactivating the first memory region 745, and a second chip selection terminal CS1 that receives a chip selection signal for activating/deactivating the second memory region 750. In the first semiconductor memory device 720, the first memory region 725 having a capacity of 4 Gb and the second memory region 730 having a capacity of 2 Gb may belong to different ranks of a semiconductor memory module. In the second semiconductor memory device 740, the first memory region 745 having a capacity of 4 Gb and the second memory region 750 having a capacity of 2 Gb may belong to different ranks of a semiconductor memory module.

When first through third chip selection signals CSS0, CSS1, and CSS2 are input to the semiconductor memory package 700, the first and second chip selection signals CSS0 and CSS1 are input to the first semiconductor memory device 720, and the second and third chip selection signals CSS1 and CSS2 are input to the second semiconductor memory device 740. Here, the second chip selection signal CSS1 may be simultaneously input to the first and second semiconductor memory devices 720 and 740. In detail, the first memory region 725 of the first semiconductor memory device 720 may receive the first chip selection signal CSS0, the first memory region 745 of the second semiconductor memory region 740 may receive the third chip selection signal CSS2, and the second memory region 730 of the first semiconductor memory device 720 and the second memory region 750 of the second semiconductor memory device 740 may receive the second chip selection signal CSS1. As a result, the semiconductor memory package 700 may substantially operate as having one semiconductor memory module of three ranks. For example, the first memory region 725 of the first semiconductor memory device 720 may correspond to a first rank RANK1 (i.e., 4 Gb) of the semiconductor memory module, the first memory region 745 of the second semiconductor memory device 740 may correspond to a second rank RANK2 (i.e., 4 Gb) of the semiconductor memory module, and the second memory region 730 of the first semiconductor memory device 720 and the second memory region 750 of the second semiconductor memory device 740 may correspond to a third rank RANK3 (i.e., 4 Gb) of the semiconductor memory module.

As illustrated in FIG. 11, in the semiconductor memory package 700, the first semiconductor memory device 720 and the second semiconductor memory device 740 may share command pins CMD, address pins ADDR, and chip I/O pins DQ_G. In addition, the second chip selection signal CSS1 is simultaneously input to the second memory region 730 of the first semiconductor memory device 720 and the second memory region 750 of the second semiconductor memory device 740. Thus, the second memory region 730 of the first semiconductor memory device 720 may be distinguished from the second memory region 750 of the second semiconductor memory device 740 by a bank address, a row address, or a column address. Hence, various means such as a package/bonding option, a fuse option, and/or a chip counter, etc., may be used. As described above, the semiconductor memory package 700 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 700 reduces the number of semiconductor memory modules per channel compared to some conventional semiconductor memory packages. Although it is illustrated above that the monolithic package includes the first and second semiconductor memory devices 720 and 740, the number of semiconductor memory devices included in the monolithic package is not limited thereto.

Figure 12:
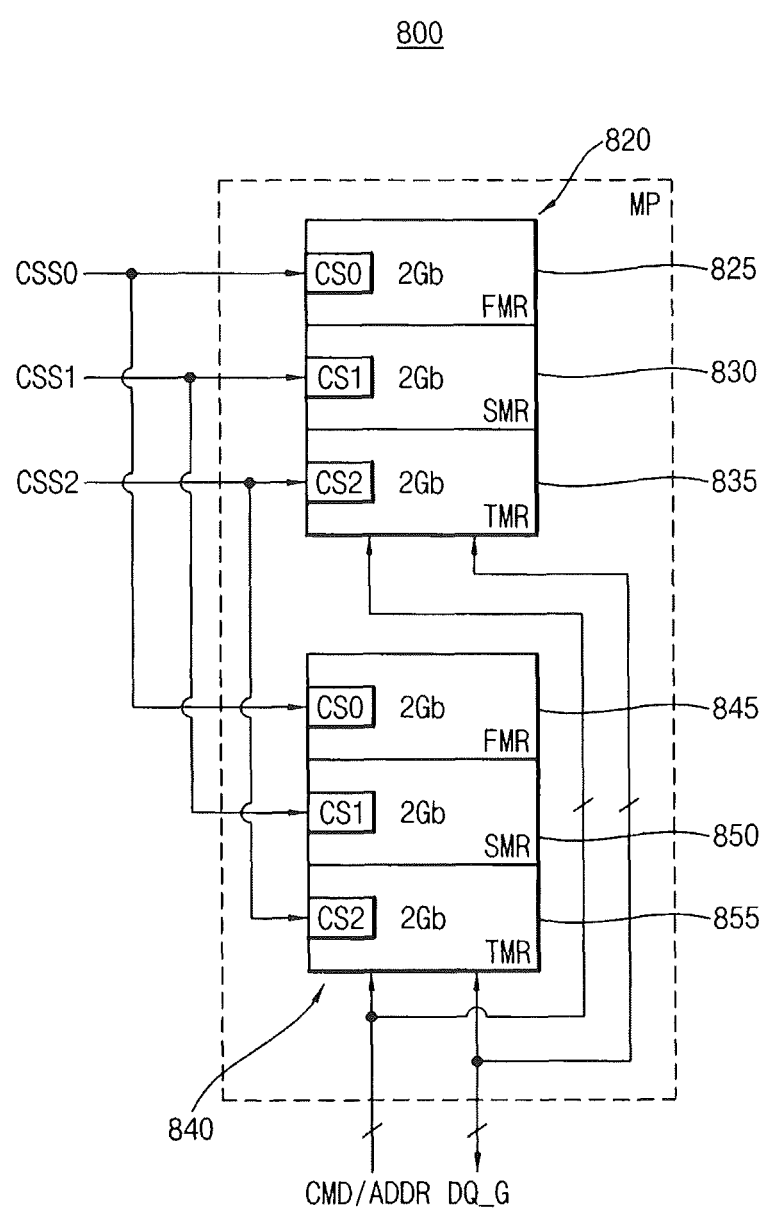
FIG. 12 is a diagram illustrating another example in which an integrated circuit memory package of FIG. 10 is implemented by a monolithic package.

FIG. 12 is a diagram illustrating another example in which an integrated circuit memory package of FIG. 10 is implemented by a monolithic package.

Referring to FIG. 12, the semiconductor memory package 800 may be implemented by a monolithic package in which a first semiconductor memory device 820 is coupled to a second semiconductor memory device 840. The first semiconductor memory device 820 may include a first memory region 825 having a capacity of 2 Gb, a second memory region 830 having a capacity of 2 Gb, and a third memory region 835 having a capacity of 2 Gb. The second semiconductor memory device 840 may include a first memory region 845 having a capacity of 2 Gb, a second memory region 850 having a capacity of 2 Gb, and a third memory region 855 having a capacity of 2 Gb. That is, the first semiconductor memory device 820 may have a capacity of 6 Gb (i.e., 'interim' density), and the second semiconductor memory device 840 may also have a capacity of 6 Gb (i.e., 'interim' density). In addition, the first semiconductor memory device 820 may include a first chip selection terminal CS0 that receives a chip selection signal for activating/deactivating the first memory region 825, a second chip selection terminal CS1 that receives a chip selection signal for activating/deactivating the second memory region 830, and a third chip selection terminal CS2 that receives a chip selection signal for activating/deactivating the third memory region 835. Similarly, the second semiconductor memory device 840 may include a first chip selection terminal CS0 that receives a chip selection signal for activating/deactivating the first memory region 845, a second chip selection terminal CS1 that receives a chip selection signal for activating/deactivating the second memory region 850, and a third chip selection terminal CS2 that receives a chip selection signal for activating/deactivating the third memory region 855. In the first semiconductor memory device 820, the first memory region 825 having a capacity of 2 Gb, the second memory region 830 having a capacity of 2 Gb, and the third memory region 835 having a capacity of 2 Gb may belong to different ranks of a semiconductor memory module. In the second semiconductor memory device 840, the first memory region 845 having a capacity of 2 Gb, the second memory region 850 having a capacity of 2 Gb, and the third memory region 855 having a capacity of 2 Gb may belong to different ranks of a semiconductor memory module.

When first through third chip selection signals CSS0, CSS1, and CSS2 are input to the semiconductor memory package 800, the first through third chip selection signals CSS0, CSS1, and CSS2 are input to the first semiconductor memory device 820, and the first through third chip selection signals CSS0, CSS1, and CSS2 are input to the second semiconductor memory device 840. Here, the first through third chip selection signals CSS0, CSS1, and CSS2 may be simultaneously input to the first and second semiconductor memory devices 820 and 840. In detail, the first memory region 825 of the first semiconductor memory device 820 and the first memory region 845 of the second semiconductor memory device 840 may receive the first chip selection signal CSS0, the second memory region 830 of the first semiconductor memory region 820 and the second memory region 850 of the second semiconductor memory device 840 may receive the second chip selection signal CSS1, and the third memory region 835 of the first semiconductor memory device 820 and the third memory region 855 of the second semiconductor memory device 840 may receive the third chip selection signal CSS2. As a result, the semiconductor memory package 800 may substantially operate as having one semiconductor memory module of three ranks. For example, the first memory region 825 of the first semiconductor memory device 820 and the first memory region 845 of the second semiconductor memory device 840 may correspond to a first rank RANK1 (i.e., 4 Gb) of the semiconductor memory module, the second memory region 830 of the first semiconductor memory device 820 and the second memory region 850 of the second semiconductor memory device 840 may correspond to a second rank RANK2 (i.e., 4 Gb) of the semiconductor memory module, and the third memory region 835 of the first semiconductor memory device 820 and the third memory region 855 of the second semiconductor memory device 840 may correspond to a third rank RANK3 (i.e., 4 Gb) of the semiconductor memory module.

As illustrated in FIG. 12, in the semiconductor memory package 800, the first semiconductor memory device 820 and the second semiconductor memory device 840 may share command pins CMD, address pins ADDR, and chip I/O pins DQ_G. In addition, the first through third chip selection signals CSS0, CSS1, and CSS2 are simultaneously input to the first through third memory regions 825, 830, and 835 of the first semiconductor memory device 820 and the first through third memory regions 845, 850, and 855 of the second semiconductor memory device 840. Thus, the first through third memory regions 825, 830, 835 of the first semiconductor memory device 820 may be distinguished from the first through third memory regions 845, 850, 855 of the second semiconductor memory device 840 by a bank address, a row address, or a column address. Hence, various means such as a package/bonding option, a fuse option, a chip counter, etc., may be used. As described above, the semiconductor memory package 800 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 800 reduces the number of semiconductor memory modules per channel compared to some conventional semiconductor memory packages. Although it is illustrated above that the monolithic package includes the first and second semiconductor memory devices 820 and 840, the number of semiconductor memory devices included in the monolithic package is not limited thereto.

Figure 13:
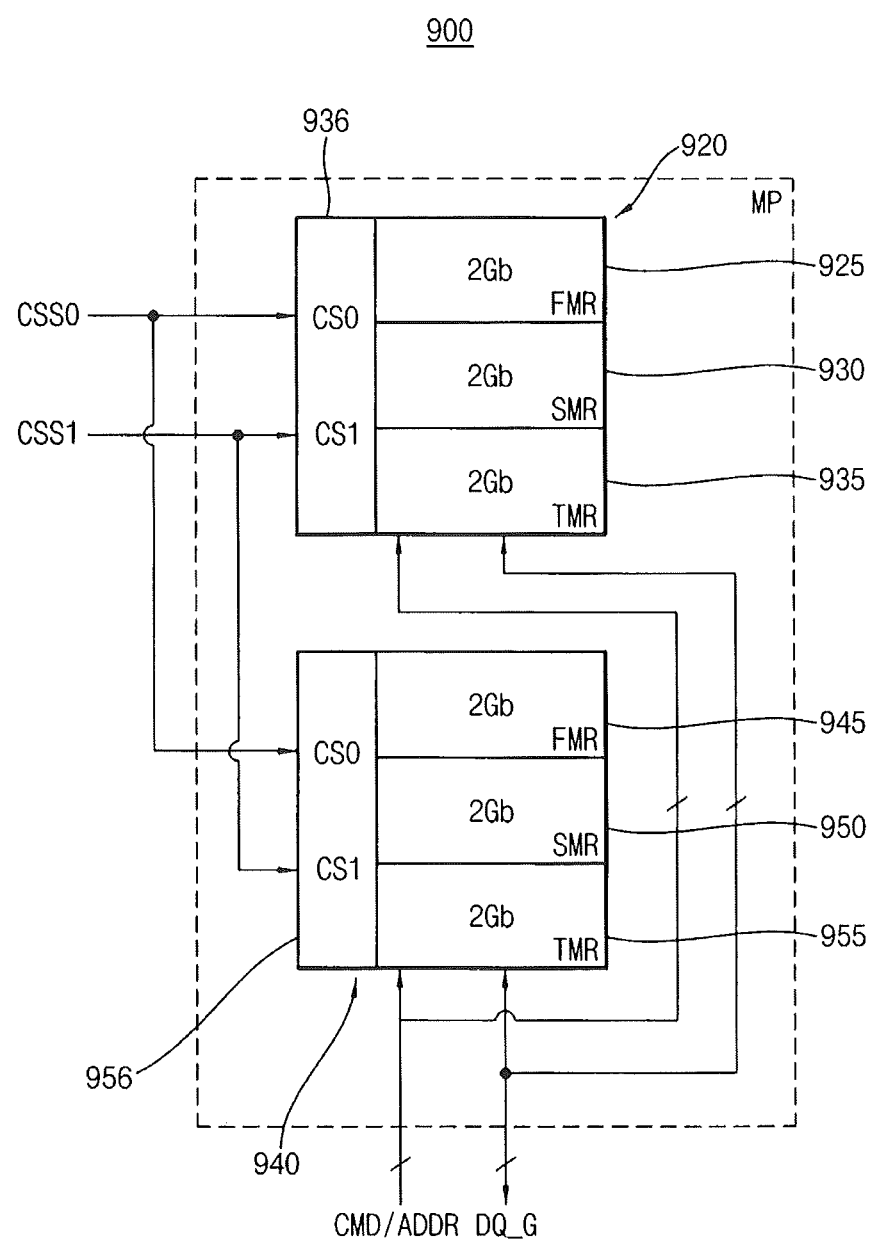
FIG. 13 is a diagram illustrating still another example in which an integrated circuit memory package of FIG. 10 is implemented by a monolithic package.

FIG. 13 is a diagram illustrating still another example in which an integrated circuit memory package of FIG. 10 is implemented by a monolithic package.

Referring to FIG. 13, the semiconductor memory package 900 may be implemented by a monolithic package in which a first semiconductor memory device 920 is coupled to a second semiconductor memory device 940. The first semiconductor memory device 920 may include a first memory region 925 having a capacity of 2 Gb, a second memory region 930 having a capacity of 2 Gb, and a third memory region 935 having a capacity of 2 Gb. The second semiconductor memory device 940 may include a first memory region 945 having a capacity of 2 Gb, a second memory region 950 having a capacity of 2 Gb, and a third memory region 955 having a capacity of 2 Gb. That is, the first semiconductor memory device 920 may have a capacity of 6 Gb (i.e., 'interim' density), and the second semiconductor memory device 940 may also have a capacity of 6 Gb (i.e., 'interim' density). In addition, the first semiconductor memory device 920 may include a first chip selection terminal CS0 and a second chip selection terminal CS1. Here, the first through third memory regions 925, 930, and 935 of the first semiconductor memory device 920 may be selectively activated based on a logic combination of a first chip selection signal CSS0 that is input to the first chip selection terminal CS0 and a second chip selection signal CSS1 that is input to the second chip selection terminal CS1. Similarly, the second semiconductor memory device 940 may include a first chip selection terminal CS0 and a second chip selection terminal CS1. Here, the first through third memory regions 945, 950, and 955 of the second semiconductor memory device 920 may be selectively activated based on a logic combination of a first chip selection signal CSS0 that is input to the first chip selection terminal CS0 and a second chip selection signal CSS1 that is input to the second chip selection terminal CS1.

In the first semiconductor memory device 920, the first memory region 925 having a capacity of 2 Gb, the second memory region 930 having a capacity of 2 Gb, and the third memory region 935 having a capacity of 2 Gb may belong to different ranks of a semiconductor memory module. In the second semiconductor memory device 940, the first memory region 945 having a capacity of 2 Gb, the second memory region 950 having a capacity of 2 Gb, and the third memory region 955 having a capacity of 2 Gb may belong to different ranks of a semiconductor memory module.

When first and second chip selection signals CSS0 and CSS1 are input to the semiconductor memory package 900, the first and second chip selection signals CSS0 and CSS1 are input to the first semiconductor memory device 920, and the first and second chip selection signals CSS0 and CSS1 are input to the second semiconductor memory device 940. Here, the first and second chip selection signals CSS0 and CSS1 may be simultaneously input to the first and second semiconductor memory devices 920 and 940. In detail, as a logic combination of the first and second chip selection signals CSS0 and CSS1 is detected by a first chip selection region 936 of the first semiconductor memory device 920, one of the first through third memory regions 925, 930, and 935 may be selected according to the logic combination of the first and second chip selection signals CSS0 and CSS1. Similarly, as a logic combination of the first and second chip selection signals CSS0 and CSS1 is detected by a second chip selection region 956 of the second semiconductor memory device 940, one of the first through third memory regions 945, 950, and 955 may be selected according to of the first and second chip selection signals CSS0 and CSS1. For example, in the first and second semiconductor memory devices 920 and 940, when the first and second chip selection signals CSS0 and CSS1 has a first logic level (e.g., enable level), the first memory regions 925 and 945 of the first and second semiconductor memory devices 920 and 940 may be selected. In addition, when the first chip selection signal CSS0 has a first logic level and the second chip selection signal CSS1 has a second logic level, the second memory regions 930 and 950 of the first and second semiconductor memory devices 920 and 940 may be selected. In addition, when the first chip selection signal CSS0 has a second logic level and the second chip selection signal CSS1 has a first logic level, the third memory regions 935 and 955 of the first and second semiconductor memory devices 920 and 940 may be selected. Further, when the first and second chip selection signals CSS0 and CSS1 has a second logic level, no memory regions of the first and second semiconductor memory devices 920 and 940 may be selected. As a result, the semiconductor memory package 900 may substantially operate as having one semiconductor memory module of three ranks. For example, the first memory region 925 of the first semiconductor memory device 920 and the first memory region 945 of the second semiconductor memory device 940 may correspond to a first rank RANK1 (i.e., 4 Gb) of the semiconductor memory module, the second memory region 930 of the first semiconductor memory device 920 and the second memory region 950 of the second semiconductor memory device 940 may correspond to a second rank RANK2 (i.e., 4 Gb) of the semiconductor memory module, and the third memory region 935 of the first semiconductor memory device 920 and the third memory region 955 of the second semiconductor memory device 940 may correspond to a third rank RANK3 (i.e., 4 Gb) of the semiconductor memory module.

As illustrated in FIG. 13, in the semiconductor memory package 900, the first semiconductor memory device 920 and the second semiconductor memory device 940 may share command pins CMD, address pins ADDR, and chip I/O pins DQ_G. In addition, the first and second chip selection signals CSS0 and CSS1 are simultaneously input to the first and second semiconductor memory devices 920 and 940. Thus, the first through third memory regions 925, 930, and 935 of the first semiconductor memory device 920 may be distinguished from the first through third memory regions 945, 950, and 955 of the second semiconductor memory device 940 by a bank address, a row address, or a column address. Hence, various means such as a package/bonding option, a fuse option, a chip counter, etc., may be used. As described above, the semiconductor memory package 900 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 900 reduces the number of semiconductor memory modules per channel compared to some conventional semiconductor memory packages. Although it is illustrated above that the monolithic package includes the first and second semiconductor memory devices 920 and 940, the number of semiconductor memory devices included in the monolithic package is not limited thereto.

Figure 14:
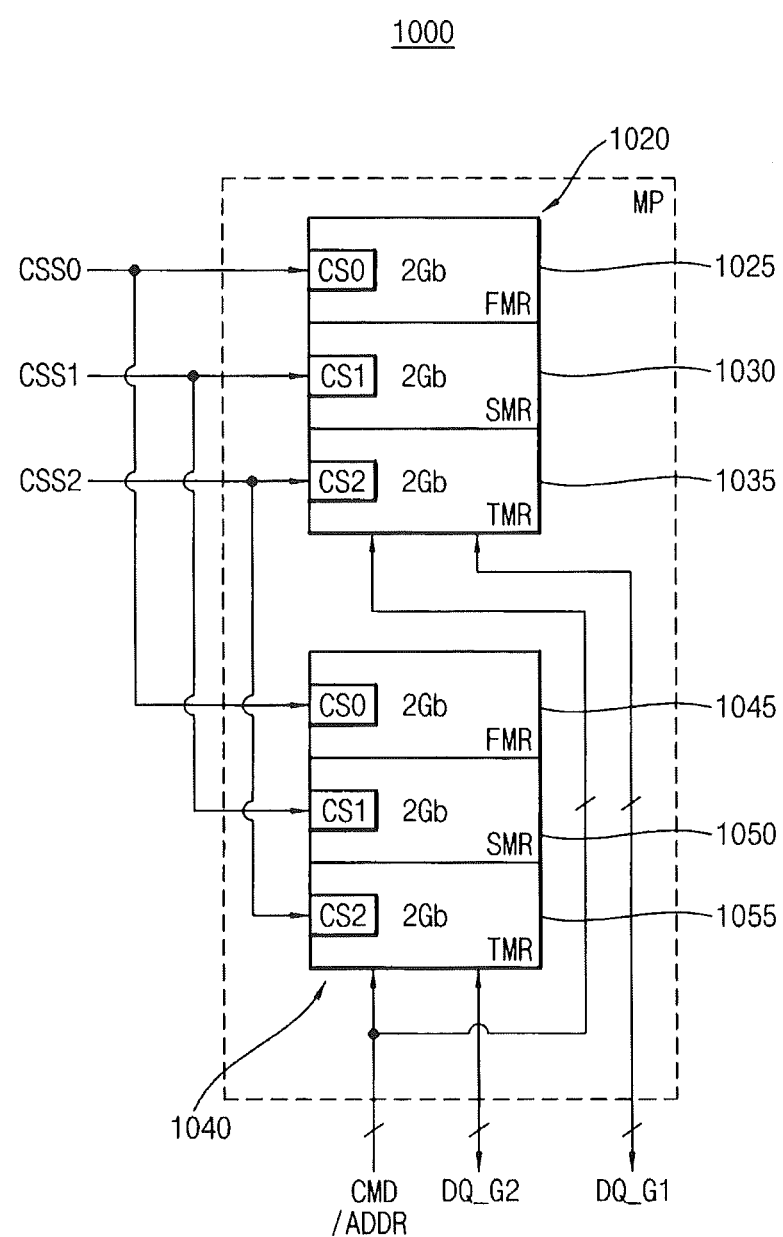
FIG. 14 is a diagram illustrating still another example in which an integrated circuit memory package of FIG. 10 is implemented by a monolithic package.

FIG. 14 is a diagram illustrating still another example in which an integrated circuit memory package of FIG. 10 is implemented by a monolithic package.

Referring to FIG. 14, the semiconductor memory package 1000 may be implemented by a monolithic package in which a first semiconductor memory device 1020 is coupled to a second semiconductor memory device 1040. The first semiconductor memory device 1020 may include a first memory region 1025 having a capacity of 2 Gb, a second memory region 1030 having a capacity of 2 Gb, and a third memory region 1035 having a capacity of 2 Gb. The second semiconductor memory device 1040 may include a first memory region 1045 having a capacity of 2 Gb, a second memory region 1050 having a capacity of 2 Gb, and a third memory region 1055 having a capacity of 2 Gb. That is, the first semiconductor memory device 1020 may have a capacity of 6 Gb (i.e., 'interim' density), and the second semiconductor memory device 1040 may also have a capacity of 6 Gb (i.e., 'interim' density). In addition, the first semiconductor memory device 1020 may include a first chip selection terminal CS0 that receives a chip selection signal for activating/deactivating the first memory region 1025, a second chip selection terminal CS1 that receives a chip selection signal for activating/deactivating the second memory region 1030, and a third chip selection terminal CS2 that receives a chip selection signal for activating/deactivating the third memory region 1035. Similarly, the second semiconductor memory device 1040 may include a first chip selection terminal CS0 that receives a chip selection signal for activating/deactivating the first memory region 1045, a second chip selection terminal CS1 that receives a chip selection signal for activating/deactivating the second memory region 1050, and a third chip selection terminal CS2 that receives a chip selection signal for activating/deactivating the third memory region 1055. In the first semiconductor memory device 1020, the first memory region 1025 having a capacity of 2 Gb, the second memory region 1030 having a capacity of 2 Gb, and the third memory region 1035 having a capacity of 2 Gb may belong to different ranks of a semiconductor memory module. In the second semiconductor memory device 1040, the first memory region 1045 having a capacity of 2 Gb, the second memory region 1050 having a capacity of 2 Gb, and the third memory region 1055 having a capacity of 2 Gb may belong to different ranks of a semiconductor memory module.

When first through third chip selection signals CSS0, CSS1, and CSS2 are input to the semiconductor memory package 1000, the first through third chip selection signals CSS0, CSS1, and CSS2 are input to the first semiconductor memory device 1020, and the first through third chip selection signals CSS0, CSS1, and CSS2 are input to the second semiconductor memory device 1040. Here, the first through third chip selection signals CSS0, CSS1, and CSS2 may be simultaneously input to the first and second semiconductor memory devices 1020 and 1040. In detail, the first chip selection signal CSS0 is input to the first memory region 1025 of the first semiconductor memory device 1020 and the first memory region 1045 of the second semiconductor memory device 1040, the second chip selection signal CSS1 is input to the second memory region 1030 of the first semiconductor memory device 1020 and the second memory region 1050 of the second semiconductor memory device 1040, and the third chip selection signal CSS2 is input to the third memory region 1035 of the first semiconductor memory device 1020 and the third memory region 1055 of the second semiconductor memory device 1040. As a result, the semiconductor memory package 1000 may substantially operate as having one semiconductor memory module of three ranks. For example, the first memory region 1025 of the first semiconductor memory device 1020 and the first memory region 1045 of the second semiconductor memory device 1040 may correspond to a first rank RANK1 (i.e., 4 Gb) of the semiconductor memory module, the second memory region 1030 of the first semiconductor memory device 1020 and the second memory region 1050 of the second semiconductor memory device 1040 may correspond to a second rank RANK2 (i.e., 4 Gb) of the semiconductor memory module, and the third memory region 1035 of the first semiconductor memory device 1020 and the third memory region 1055 of the second semiconductor memory device 1040 may correspond to a third rank RANK3 (i.e., 4 Gb) of the semiconductor memory module.

As illustrated in FIG. 14, in the semiconductor memory package 1000, the first semiconductor memory device 1020 and the second semiconductor memory device 1040 may share command pins CMD and address pins ADDR. However, the first semiconductor memory device 1020 and the second semiconductor memory device 1040 may not share chip I/O pins. That is, the first semiconductor memory device 1020 may include first I/O pins DQ_G1, and the second semiconductor memory device 1040 may include second chip I/O pins DQ_G2. Since the chip I/O pins are not shared by the first semiconductor memory device 1020 and the second semiconductor memory device 1040, the first through third memory regions 1025, 1030, and 1035 of the first semiconductor memory device 1020 may not be distinguished from the first through third memory regions 1045, 1050, and 1055 of the second semiconductor memory device 1040 by a bank address, a row address, or a column address. Hence, various means such as a package/bonding option, a fuse option, a chip counter, etc., may not be used. Furthermore, since the chip I/O pins are not shared by the first semiconductor memory device 1020 and the second semiconductor memory device 1040, seamless operations can be reduced or eliminated between the first semiconductor memory device 1020 and the second semiconductor memory device 1040 so that a channel efficiency may not be degraded. As described above, the semiconductor memory package 1000 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1000 reduces the number of semiconductor memory modules per channel compared to some conventional semiconductor memory packages. Although it is illustrated above that the monolithic package includes the first and second semiconductor memory devices 1020 and 1040, the number of semiconductor memory devices included in the monolithic package is not limited thereto.

Figure 15:
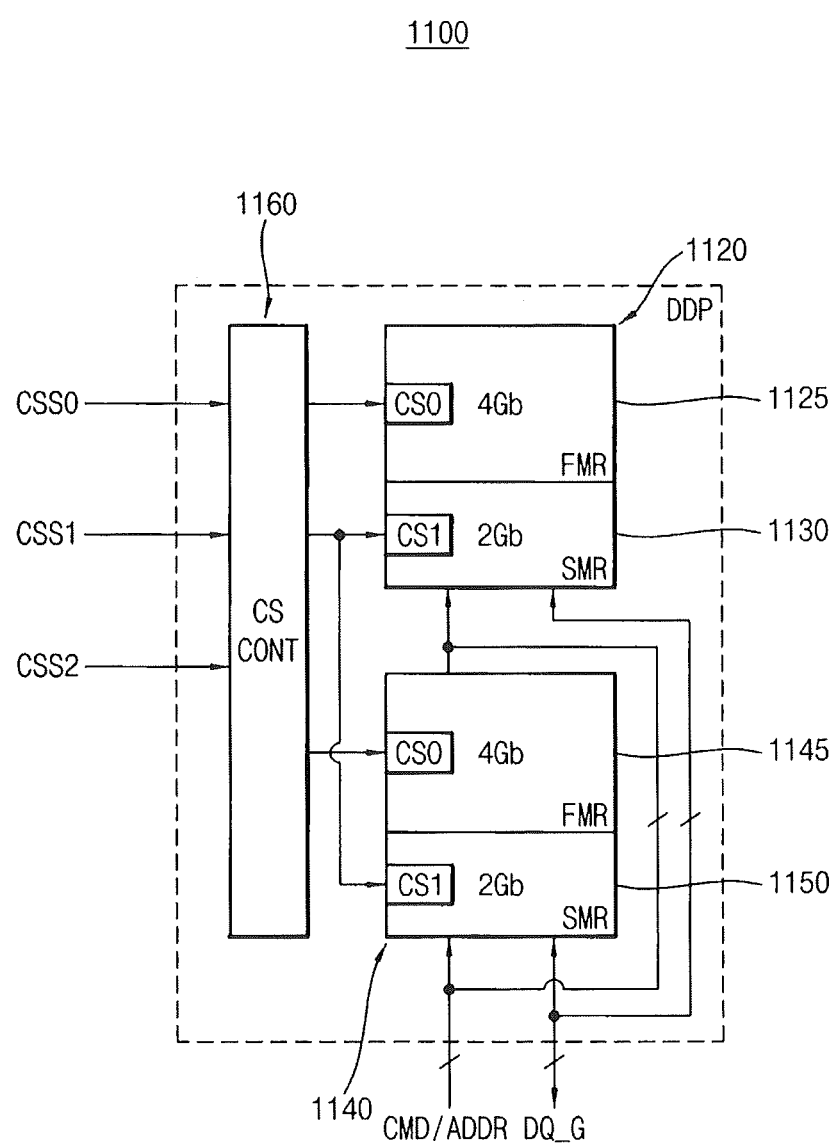
FIG. 15 is a diagram illustrating an example in which an integrated circuit memory package of FIG. 10 is implemented by a dual-die package.

FIG. 15 is a diagram illustrating an example in which an integrated circuit memory package of FIG. 10 is implemented by a dual-die package.

Referring to FIG. 15, the semiconductor memory package 1100 may be implemented by a dual-die package in which a first semiconductor memory device 1120 is coupled to a second semiconductor memory device 1140. The first semiconductor memory device 1120 may correspond to an upper die, and the second semiconductor memory device 1140 may correspond to a lower die. According to some example embodiments, the semiconductor memory package 1100 may include more semiconductor memory devices (i.e., multiple dies, also referred to herein as a 'multi-die' package). For example, if the semiconductor memory package 1100 includes four semiconductor memory devices, the semiconductor memory package 1100 may be referred to as a quad-die package. In the semiconductor memory package 1100, an upper die and a lower die may be determined by various methods.

As illustrated in FIG. 15, the first semiconductor memory device 1120 may include a first memory region 1125 having a capacity of 4 Gb and a second memory region 1130 having a capacity of 2 Gb. The second semiconductor memory device 1140 may include a first memory region 1145 having a capacity of 4 Gb and a second memory region 1150 having a capacity of 2 Gb. That is, the first semiconductor memory device 1120 may have a capacity of 6 Gb (i.e., 'interim' density), and the second semiconductor memory device 1140 may also have a capacity of 6 Gb (i.e., 'interim' density). In addition, the semiconductor memory package 1100 may include a chip selection signal control unit 1160 that provides first through third chip selection signals CSS0, CSS1, and CSS2 to the first and second semiconductor memory devices 1120 and 1140 when the first through third chip selection signals CSS0, CSS1, and CSS2 are received. Namely, by using the chip selection signal control unit 1160, the semiconductor memory package 1100 may selectively activate the first memory region 1125 and the second memory region 1130 of the first semiconductor memory device 1120, and may selectively activate the first memory region 1145 and the second memory region 1150 of the second semiconductor memory device 1140. In the first semiconductor memory device 1120, the first memory region 1125 having a capacity of 4 Gb and the second memory region 1130 having a capacity of 2 Gb may belong to different ranks of a semiconductor memory module. In the second semiconductor memory device 1140, the first memory region 1145 having a capacity of 4 Gb and the second memory region 1150 having a capacity of 2 Gb may belong to different ranks of a semiconductor memory module. For example, the first memory region 1125 of the first semiconductor memory device 1120 may correspond to a first rank RANK1 (i.e., 4 Gb) of the semiconductor memory module, the first memory region 1145 of the second semiconductor memory device 1140 may correspond to a second rank RANK2 (i.e., 4 Gb) of the semiconductor memory module, and the second memory region 1130 of the first semiconductor memory device 1120 and the second memory region 1150 of the second semiconductor memory device 1140 may correspond to a third rank RANK3 (i.e., 4 Gb) of the semiconductor memory module. That is, the semiconductor memory package 1100 may substantially operate as having one semiconductor memory module of three ranks.

In the semiconductor memory package 1100, the first semiconductor memory device 1120 and the second semiconductor memory device 1140 may share command pins CMD, address pins ADDR, and chip I/O pins DQ_G. In addition, the second chip selection signal CSS1 output from the chip selection signal control unit 1160 is simultaneously input to the second memory region 1130 of the first semiconductor memory device 1120 and the second memory region 1150 of the second semiconductor memory device 1140. Thus, the second memory region 1130 of the first semiconductor memory device 1120 may be distinguished from the second memory region 1150 of the second semiconductor memory device 1140 by a bank address, a row address, or a column address. Hence, various means such as a package/bonding option, a fuse option, a chip counter, etc., may be used. As described above, the semiconductor memory package 1100 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1100 reduces the number of semiconductor memory modules per channel compared to some conventional semiconductor memory packages. Although it is illustrated above that the dual-die package includes the first and second semiconductor memory devices 1120 and 1140, the number of semiconductor memory devices included in the dual-die package is not limited thereto.

Figure 16:
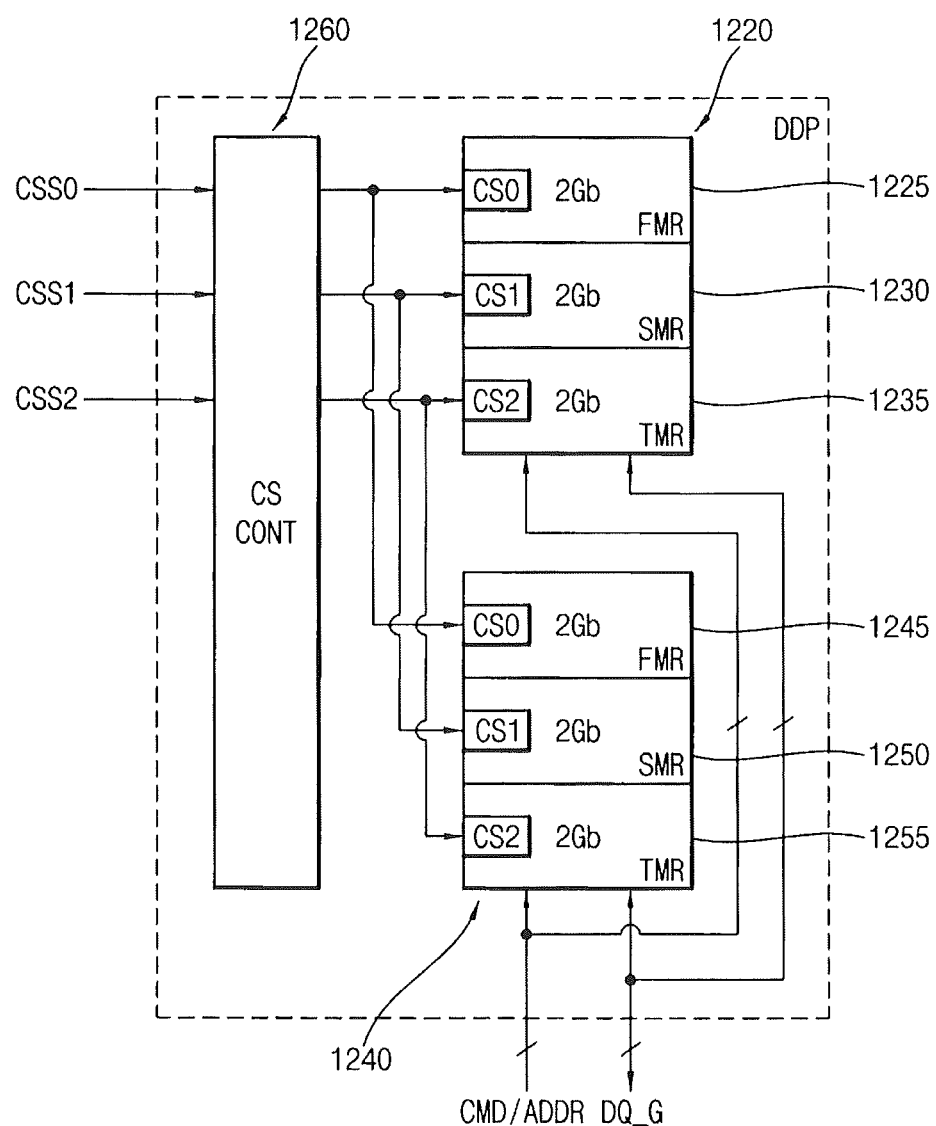
FIG. 16 is a diagram illustrating another example in which an integrated circuit memory package of FIG. 10 is implemented by a dual-die package.

FIG. 16 is a diagram illustrating another example in which an integrated circuit memory package of FIG. 10 is implemented by a dual-die package.

Referring to FIG. 16, the semiconductor memory package 1200 may be implemented by a dual-die package in which a first semiconductor memory device 1220 is coupled to a second semiconductor memory device 1240. The first semiconductor memory device 1220 may correspond to an upper die, and the second semiconductor memory device 1240 may correspond to a lower die. In the semiconductor memory package 1200, an upper die and a lower die may be determined by various methods. According to some example embodiments, the semiconductor memory package 1200 may include more semiconductor memory devices (i.e., multiple dies, also referred to herein as a 'multi-die' package).

As illustrated in FIG. 16, the first semiconductor memory device 1220 may include a first memory region 1225 having a capacity of 2 Gb, a second memory region 1230 having a capacity of 2 Gb, and a third memory region 1235 having a capacity of 2 Gb. The second semiconductor memory device 1240 may include a first memory region 1245 having a capacity of 2 Gb, a second memory region 1250 having a capacity of 2 Gb, and a third memory region 1255 having a capacity of 2 Gb. That is, the first semiconductor memory device 1220 may have a capacity of 6 Gb (i.e., 'interim' density), and the second semiconductor memory device 1240 may also have a capacity of 6 Gb (i.e., 'interim' density). In addition, the semiconductor memory package 1200 may include a chip selection signal control unit 1260 that provides first through third chip selection signals CSS0, CSS1, and CSS2 to the first and second semiconductor memory devices 1220 and 1240 when the first through third chip selection signals CSS0, CSS1, and CSS2 are received. Namely, by using the chip selection signal control unit 1260, the semiconductor memory package 1200 may selectively activate the first memory region 1225, the second memory region 1230, and the third memory region 1235 of the first semiconductor memory device 1220, and may selectively activate the first memory region 1145, the second memory region 1250, and the third memory region 1255 of the second semiconductor memory device 1240. In the first semiconductor memory device 1220, the first memory region 1225 having a capacity of 2 Gb, the second memory region 1230 having a capacity of 2 Gb, and the third memory region 1235 having a capacity of 2 Gb may belong to different ranks of a semiconductor memory module. In the second semiconductor memory device 1240, the first memory region 1245 having a capacity of 2 Gb, the second memory region 1250 having a capacity of 2 Gb, and the third memory region 1255 having a capacity of 2 Gb may belong to different ranks of a semiconductor memory module. For example, the first memory region 1225 of the first semiconductor memory device 1220 and the first memory region 1245 of the second semiconductor memory device 1240 may correspond to a first rank RANK1 (i.e., 4 Gb) of the semiconductor memory module, the second memory region 1230 of the first semiconductor memory device 1220 and the second memory region 1250 of the second semiconductor memory device 1240 may correspond to a second rank RANK2 (i.e., 4 Gb) of the semiconductor memory module, and the third memory region 1235 of the first semiconductor memory device 1220 and the third memory region 1255 of the second semiconductor memory device 1240 may correspond to a third rank RANK3 (i.e., 4 Gb) of the semiconductor memory module. That is, the semiconductor memory package 1200 may substantially operate as having one semiconductor memory module of three ranks.

In the semiconductor memory package 1200, the first semiconductor memory device 1220 and the second semiconductor memory device 1240 may share command pins CMD, address pins ADDR, and chip I/O pins DQ_G. In addition, the first through third chip selection signals CSS0, CSS1, and CSS2 output from the chip selection signal control unit 1260 are simultaneously input to the first through third memory regions 1225, 1230, and 1235 of the first semiconductor memory device 1220 and the first through third memory regions 1245, 1250, and 1255 of the second semiconductor memory device 1240. Thus, the first through third memory regions 1225, 1230, and 1235 of the first semiconductor memory device 1220 may be distinguished from the first through third memory regions 1245, 1250, and 1255 of the second semiconductor memory device 1240 by a bank address, a row address, or a column address. Hence, various means such as a package/bonding option, a fuse option, a chip counter, etc., may be used. As described above, the semiconductor memory package 1200 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1200 reduces the number of semiconductor memory modules per channel compared to some conventional semiconductor memory packages. Although it is illustrated above that the dual-die package includes the first and second semiconductor memory devices 1220 and 1240, the number of semiconductor memory devices included in the dual-die package is not limited thereto.

Figure 17:
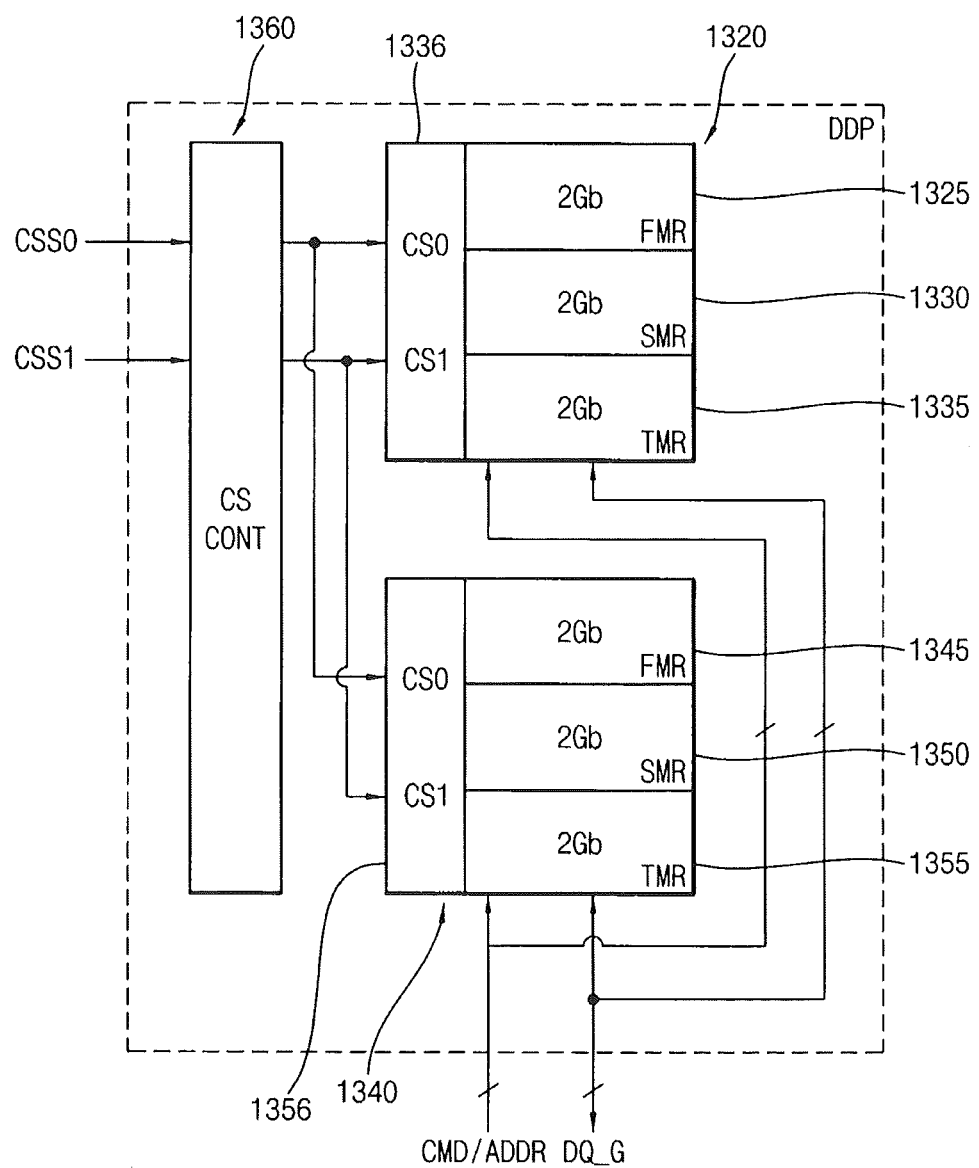
FIG. 17 is a diagram illustrating still another example in which an integrated circuit memory package of FIG. 10 is implemented by a dual-die package.

FIG. 17 is a diagram illustrating still another example in which an integrated circuit memory package of FIG. 10 is implemented by a dual-die package.

Referring to FIG. 17, the semiconductor memory package 1300 may be implemented by a dual-die package in which a first semiconductor memory device 1320 is coupled to a second semiconductor memory device 1340. The first semiconductor memory device 1320 may correspond to an upper die, and the second semiconductor memory device 1340 may correspond to a lower die. In the semiconductor memory package 1300, an upper die and a lower die may be determined by various methods. According to some example embodiments, the semiconductor memory package 1300 may include more semiconductor memory devices (i.e., multiple dies, also referred to herein as a 'multi-die' package).

As illustrated in FIG. 17, the first semiconductor memory device 1320 may include a first memory region 1325 having a capacity of 2 Gb, a second memory region 1330 having a capacity of 2 Gb, and a third memory region 1335 having a capacity of 2 Gb. The second semiconductor memory device 1340 may include a first memory region 1345 having a capacity of 2 Gb, a second memory region 1350 having a capacity of 2 Gb, and a third memory region 1355 having a capacity of 2 Gb. That is, the first semiconductor memory device 1320 may have a capacity of 6 Gb (i.e., 'interim' density), and the second semiconductor memory device 1340 may also have a capacity of 6 Gb (i.e., 'interim' density). In addition, the semiconductor memory package 1300 may include a chip selection signal control unit 1360 that provides first and second chip selection signals CSS0 and CSS1 to the first and second semiconductor memory devices 1320 and 1340 when the first and second chip selection signals CSS0 and CSS1 are received. Namely, by using the chip selection signal control unit 1360, the semiconductor memory package 1300 may selectively activate the first memory region 1325, the second memory region 1330, and the third memory region 1335 of the first semiconductor memory device 1320, and may selectively activate the first memory region 1345, the second memory region 1350, and the third memory region 1355 of the second semiconductor memory device 1340 based on a logic combination of the first and second chip selection signals CSS0 and CSS1. In the first semiconductor memory device 1320, the first memory region 1325 having a capacity of 2 Gb, the second memory region 1330 having a capacity of 2 Gb, and the third memory region 1335 having a capacity of 2 Gb may belong to different ranks of a semiconductor memory module. In the second semiconductor memory device 1340, the first memory region 1345 having a capacity of 2 Gb, the second memory region 1350 having a capacity of 2 Gb, and the third memory region 1355 having a capacity of 2 Gb may belong to different ranks of a semiconductor memory module. For example, the first memory region 1325 of the first semiconductor memory device 1320 and the first memory region 1345 of the second semiconductor memory device 1340 may correspond to a first rank RANK1 (i.e., 4 Gb) of the semiconductor memory module, the second memory region 1330 of the first semiconductor memory device 1320 and the second memory region 1350 of the second semiconductor memory device 1340 may correspond to a second rank RANK2 (i.e., 4 Gb) of the semiconductor memory module, and the third memory region 1335 of the first semiconductor memory device 1320 and the third memory region 1355 of the second semiconductor memory device 1340 may correspond to a third rank RANK3 (i.e., 4 Gb) of the semiconductor memory module. That is, the semiconductor memory package 1300 may substantially operate as having one semiconductor memory module of three ranks.

In the semiconductor memory package 1300, the first semiconductor memory device 1320 and the second semiconductor memory device 1340 may share command pins CMD, address pins ADDR, and chip I/O pins DQ_G. In addition, the first and second chip selection signals CSS0 and CSS1 output from the chip selection signal control unit 1360 are simultaneously input to the first and second semiconductor memory device 1320 and 1340. Thus, the first through third memory regions 1325, 1330, and 1335 of the first semiconductor memory device 1320 may be distinguished from the first through third memory regions 1345, 1350, and 1355 of the second semiconductor memory device 1340 by a bank address, a row address, or a column address. Hence, various means such as a package/bonding option, a fuse option, a chip counter, etc., may be used. As described above, the semiconductor memory package 1300 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1300 reduces the number of semiconductor memory modules per channel compared to some conventional semiconductor memory packages. Although it is illustrated above that the dual-die package includes the first and second semiconductor memory devices 1320 and 1340, the number of semiconductor memory devices included in the dual-die package is not limited thereto.

Figure 18:
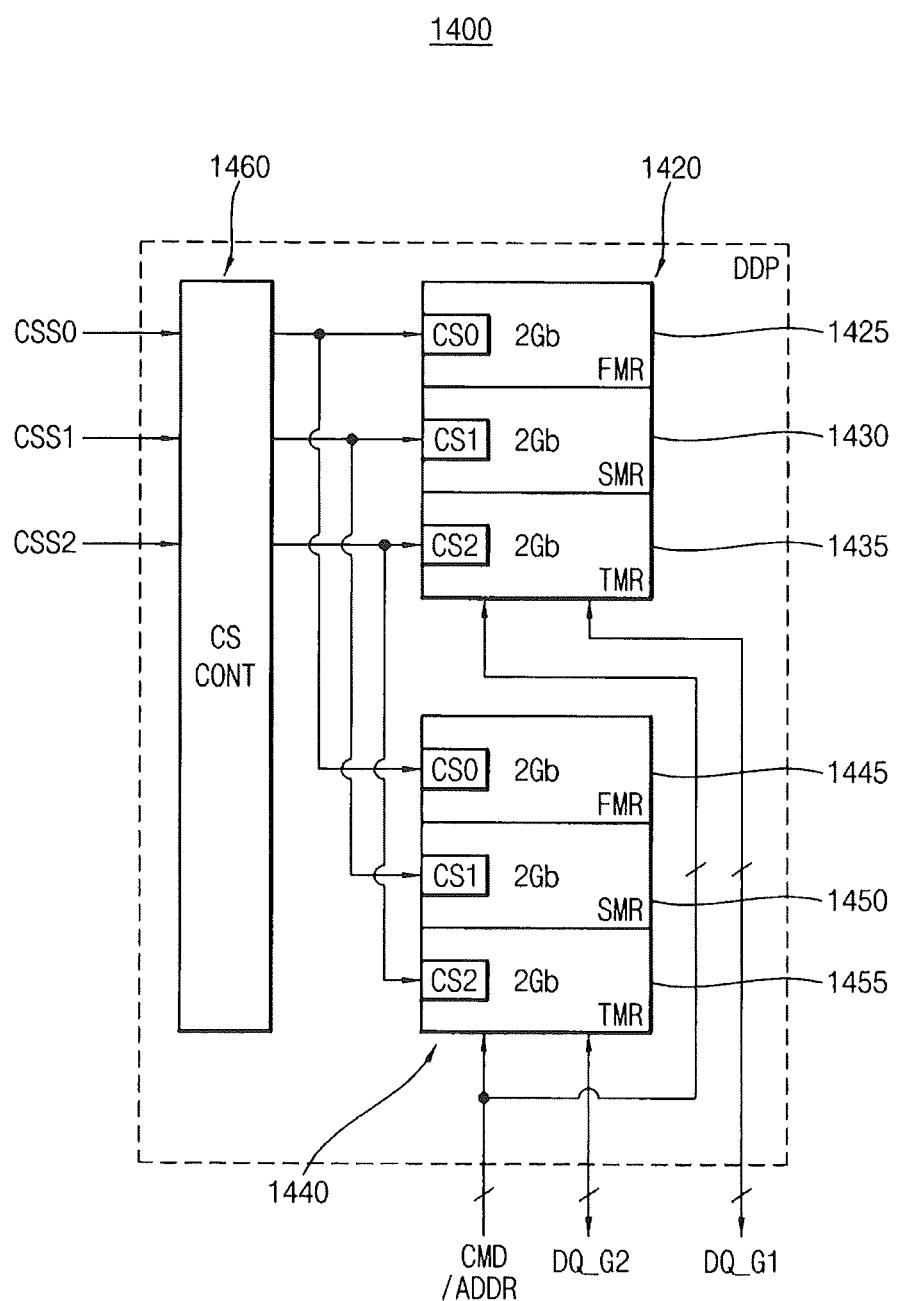
FIG. 18 is a diagram illustrating still another example in which an integrated circuit memory package of FIG. 10 is implemented by a dual-die package.

FIG. 18 is a diagram illustrating still another example in which an integrated circuit memory package of FIG. 10 is implemented by a dual-die package.

Referring to FIG. 18, the semiconductor memory package 1400 may be implemented by a dual-die package in which a first semiconductor memory device 1420 is coupled to a second semiconductor memory device 1440. The first semiconductor memory device 1420 may correspond to an upper die, and the second semiconductor memory device 1440 may correspond to a lower die. In the semiconductor memory package 1400, an upper die and a lower die may be determined by various methods. According to some example embodiments, the semiconductor memory package 1400 may include more semiconductor memory devices (i.e., multiple dies, also referred to herein as a 'multi-die' package).

As illustrated in FIG. 18, the first semiconductor memory device 1420 may include a first memory region 1425 having a capacity of 2 Gb, a second memory region 1430 having a capacity of 2 Gb, and a third memory region 1435 having a capacity of 2 Gb. The second semiconductor memory device 1440 may include a first memory region 1445 having a capacity of 2 Gb, a second memory region 1450 having a capacity of 2 Gb, and a third memory region 1455 having a capacity of 2 Gb. That is, the first semiconductor memory device 1420 may have a capacity of 6 Gb (i.e., 'interim' density), and the second semiconductor memory device 1440 may also have a capacity of 6 Gb (i.e., 'interim' density). In addition, the semiconductor memory package 1400 may include a chip selection signal control unit 1460 that provides first through third chip selection signals CSS0, CSS1, and CSS2 to the first and second semiconductor memory devices 1420 and 1440 when the first through third chip selection signals CSS0, CSS1, and CSS2 are received. Namely, by using the chip selection signal control unit 1460, the semiconductor memory package 1400 may selectively activate the first memory region 1425, the second memory region 1430, and the third memory region 1435 of the first semiconductor memory device 1420, and may selectively activate the first memory region 1445, the second memory region 1450, and the third memory region 1455 of the second semiconductor memory device 1440. In the first semiconductor memory device 1420, the first memory region 1425 having a capacity of 2 Gb, the second memory region 1430 having a capacity of 2 Gb, and the third memory region 1435 having a capacity of 2 Gb may belong to different ranks of a semiconductor memory module. In the second semiconductor memory device 1440, the first memory region 1445 having a capacity of 2 Gb, the second memory region 1450 having a capacity of 2 Gb, and the third memory region 1455 having a capacity of 2 Gb may belong to different ranks of a semiconductor memory module. For example, the first memory region 1425 of the first semiconductor memory device 1420 and the first memory region 1445 of the second semiconductor memory device 1440 may correspond to a first rank RANK1 (i.e., 4 Gb) of the semiconductor memory module, the second memory region 1430 of the first semiconductor memory device 1420 and the second memory region 1450 of the second semiconductor memory device 1440 may correspond to a second rank RANK2 (i.e., 4 Gb) of the semiconductor memory module, and the third memory region 1435 of the first semiconductor memory device 1420 and the third memory region 1455 of the second semiconductor memory device 1440 may correspond to a third rank RANK3 (i.e., 4 Gb) of the semiconductor memory module. That is, the semiconductor memory package 1400 may substantially operate as having one semiconductor memory module of three ranks.

In the semiconductor memory package 1400, the first semiconductor memory device 1420 and the second semiconductor memory device 1440 may share command pins CMD and address pins ADDR. However, the first semiconductor memory device 1420 and the second semiconductor memory device 1440 may not share chip I/O pins. That is, the first semiconductor memory device 1420 may include first I/O pins DQ_G1, and the second semiconductor memory device 1440 may include second chip I/O pins DQ_G2. Since the chip I/O pins are not shared by the first semiconductor memory device 1420 and the second semiconductor memory device 1440, the first through third memory regions 1425, 1430, and 1435 of the first semiconductor memory device 1420 may not be distinguished from the first through third memory regions 1445, 1450, and 1455 of the second semiconductor memory device 1440 by a bank address, a row address, or a column address. Hence, various means such as a package/bonding option, a fuse option, a chip counter, etc., may not be used. Furthermore, since the chip I/O pins are not shared by the first semiconductor memory device 1420 and the second semiconductor memory device 1440, seamless operations can be reduced or eliminated between the first semiconductor memory device 1420 and the second semiconductor memory device 1440 so that a channel efficiency may not be degraded. As described above, the semiconductor memory package 1400 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1400 reduces the number of semiconductor memory modules per channel compared to some conventional semiconductor memory packages. Although it is illustrated above that the dual-die package includes the first and second semiconductor memory devices 1420 and 1440, the number of semiconductor memory devices included in the dual-die package is not limited thereto.

Figure 19:
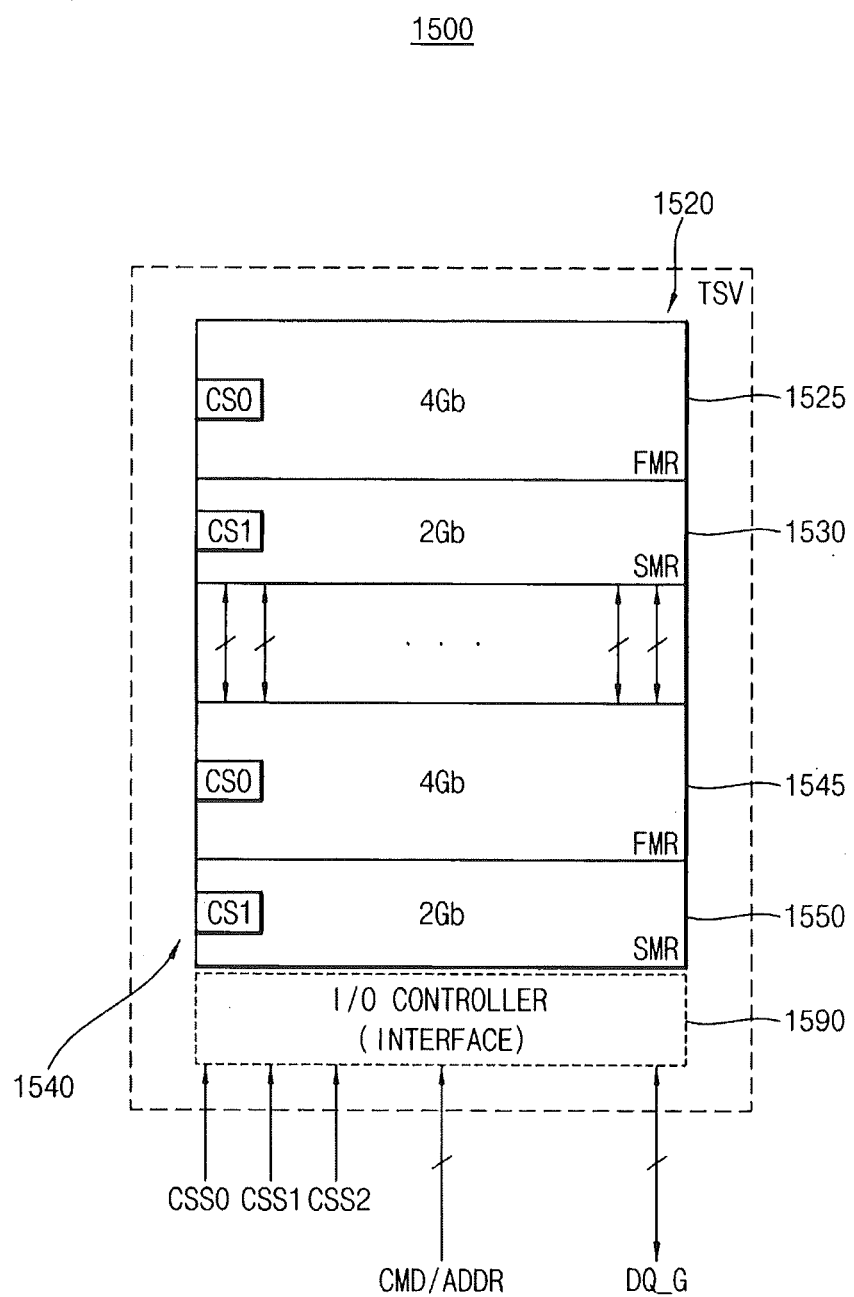
FIG. 19 is a diagram illustrating an example in which an integrated circuit memory package of FIG. 10 is implemented by a dual-die stack package using through silicon via.

FIG. 19 is a diagram illustrating an example in which an integrated circuit memory package of FIG. 10 is implemented by a through-silicon via dual-die stack package.

Referring to FIG. 19, the semiconductor memory package 1500 may be implemented by a through-silicon via dual-die stack package in which a first semiconductor memory device 1520 is coupled to a second semiconductor memory device 1540. Generally, a dual-die stack package includes a plurality of dies (i.e., semiconductor memory devices) that are stacked. Particularly, the through-silicon via dual-die stack package may have a structure in which the stacked dies (i.e., semiconductor memory devices) are electrically and physically coupled to each other by at least one through-silicon via TSV that is formed in a vertical direction extending through one or more dies. According to some example embodiments, the semiconductor memory package 1500 may include a bump for a space between the stacked dies (i.e., semiconductor memory devices). As illustrated in FIG. 19, the semiconductor memory package 1500 may include the first semiconductor memory device 1520 and the second semiconductor memory device 1540. Here, the first semiconductor memory device 1520 may be a slave device, and the second semiconductor memory device 1540 may be a master device. In one example embodiment, the master device (i.e., the second semiconductor memory device 1540) may include an I/O control unit 1590 for interfacing with outside. The I/O control unit 1590 of the second semiconductor memory device 1540 may provide first through third chip selection signals CSS0, CSS1, and CSS2, a command CMD, an address ADDR, and/or I/O data to the first and second semiconductor memory devices 1520 and 1540 through the at least one through-silicon via TSV. According to some example embodiments, the semiconductor memory package 1500 may include more semiconductor memory devices (i.e., multiple dies, also referred to herein as a 'multi-die' package).

As illustrated in FIG. 19, the first semiconductor memory device 1520 may include a first memory region 1525 having a capacity of 4 Gb and a second memory region 1530 having a capacity of 2 Gb. The second semiconductor memory device 1540 may include a first memory region 1545 having a capacity of 4 Gb and a second memory region 1550 having a capacity of 2 Gb. That is, the first semiconductor memory device 1520 may have a capacity of 6 Gb (i.e., 'interim' density), and the second semiconductor memory device 1540 may also have a capacity of 6 Gb (i.e., 'interim' density). In addition, when the semiconductor memory package 1500 receives the first through third chip selection signals CSS0, CSS1, and CSS2, the semiconductor memory package 1500 may provide the first through third chip selection signals CSS0, CSS1, and CSS2 to the first and second semiconductor memory devices 1520 and 1540 through the at least one through-silicon via TSV coupled to the I/O control unit 1590 of the second semiconductor memory device 1540. Thus, the first memory region 1525 and the second memory region 1530 of the first semiconductor memory device 1520 may be selectively activated, and the first memory region 1545 and the second memory region 1550 of the second semiconductor memory device 1540 may be selectively activated.

In the first semiconductor memory device 1520, the first memory region 1525 having a capacity of 4 Gb and the second memory region 1530 having a capacity of 2 Gb may belong to different ranks of a semiconductor memory module. In the second semiconductor memory device 1540, the first memory region 1545 having a capacity of 4 Gb and the second memory region 1550 having a capacity of 2 Gb may belong to different ranks of a semiconductor memory module. For example, the first memory region 1525 of the first semiconductor memory device 1520 may correspond to a first rank RANK1 (i.e., 4 Gb) of the semiconductor memory module, the first memory region 1545 of the second semiconductor memory device 1540 may correspond to a second rank RANK2 (i.e., 4 Gb) of the semiconductor memory module, and the second memory region 1530 of the first semiconductor memory device 1520 and the second memory region 1550 of the second semiconductor memory device 1540 may correspond to a third rank RANK3 (i.e., 4 Gb) of the semiconductor memory module. That is, the semiconductor memory package 1500 may substantially operate as having one semiconductor memory module of three ranks In the semiconductor memory package 1500, the first semiconductor memory device 1520 and the second semiconductor memory device 1540 may share command pins CMD, address pins ADDR, and chip I/O pins DQ_G. In addition, the second chip selection signal CSS1 is simultaneously input to the second memory region 1530 of the first semiconductor memory device 1520 and the second memory region 1550 of the second semiconductor memory device 1540 through the at least one through-silicon via TSV coupled to the I/O control unit 1590 of the second semiconductor memory device 1540. Thus, the second memory region 1530 of the first semiconductor memory device 1520 may be distinguished from the second memory region 1550 of the second semiconductor memory device 1540 by a bank address, a row address, or a column address. Hence, various means such as a package/ bonding option, a fuse option, a chip counter, etc., may be used. As described above, the semiconductor memory package 1500 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1500 reduces the number of semiconductor memory modules per channel compared to some conventional semiconductor memory packages. Although it is illustrated above that the through-silicon via dual-die stack package includes the first and second semiconductor memory devices 1520 and 1540, the number of semiconductor memory devices included in the through-silicon via dual-die stack package is not limited thereto.

Figure 20:
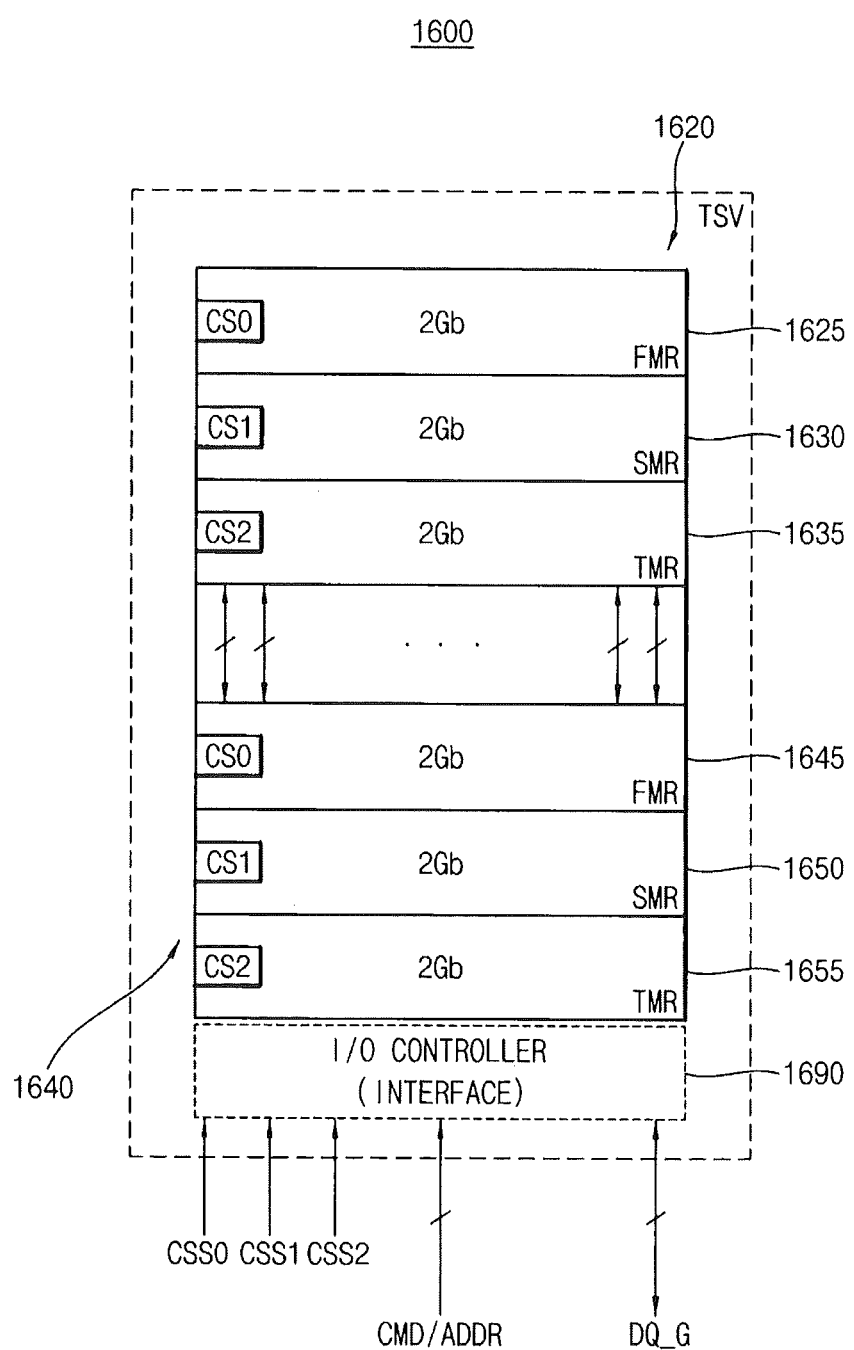
FIG. 20 is a diagram illustrating another example in which an integrated circuit memory package of FIG. 10 is implemented by a dual-die stack package using through silicon via.

FIG. 20 is a diagram illustrating another example in which an integrated circuit memory package of FIG. 10 is implemented by a through-silicon via dual-die stack package.

Referring to FIG. 20, the semiconductor memory package 1600 may be implemented by a through-silicon via dual-die stack package in which a first semiconductor memory device 1620 is coupled to a second semiconductor memory device 1640. As illustrated in FIG. 20, the first semiconductor memory device 1620 may be a slave device, and the second semiconductor memory device 1640 may be a master device. The second semiconductor memory device 1640 may include an I/O control unit 1690 for interfacing with outside. The I/O control unit 1690 of the second semiconductor memory device 1640 may provide first through third chip selection signals CSS0, CSS1, and CSS2, a command CMD, an address ADDR, and/or I/O data to the first and second semiconductor memory devices 1620 and 1640 through the at least one through-silicon via. According to some example embodiments, the semiconductor memory package 1600 may include more semiconductor memory devices (i.e., multiple dies, also referred to herein as a 'multi-die' package).

As illustrated in FIG. 20, the first semiconductor memory device 1620 may include a first memory region 1625 having a capacity of 2 Gb, a second memory region 1630 having a capacity of 2 Gb, and a third memory region 1635 having a capacity of 2 Gb. The second semiconductor memory device 1640 may include a first memory region 1645 having a capacity of 2 Gb, a second memory region 1650 having a capacity of 2 Gb, and a third memory region 1655 having a capacity of 2 Gb. That is, the first semiconductor memory device 1620 may have a capacity of 6 Gb (i.e., 'interim' density), and the second semiconductor memory device 1640 may also have a capacity of 6 Gb (i.e., 'interim' density). In addition, when the semiconductor memory package 1600 receives the first through third chip selection signals CSS0, CSS1, and CSS2, the semiconductor memory package 1600 may provide the first through third chip selection signals CSS0, CSS1, and CSS2 to the first and second semiconductor memory devices 1620 and 1640 through the at least one through-silicon via TSV coupled to the I/O control unit 1690 of the second semiconductor memory device 1640. Thus, the first memory region 1625, the second memory region 1630, and the third memory region 1635 of the first semiconductor memory device 1620 may be selectively activated, and the first memory region 1645, the second memory region 1650, and the third memory region 1655 of the second semiconductor memory device 1640 may be selectively activated.

In the first semiconductor memory device 1620, the first memory region 1625 having a capacity of 2 Gb, the second memory region 1630 having a capacity of 2 Gb, and the third memory region 1635 having a capacity of 2 Gb may belong to different ranks of a semiconductor memory module. In the second semiconductor memory device 1640, the first memory region 1645 having a capacity of 2 Gb, the second memory region 1650 having a capacity of 2 Gb, and the third memory region 1655 having a capacity of 2 Gb may belong to different ranks of a semiconductor memory module. For example, the first memory region 1625 of the first semiconductor memory device 1620 and the first memory region 1645 of the second semiconductor memory device 1640 may correspond to a first rank RANK1 (i.e., 4 Gb) of the semiconductor memory module, the second memory region 1630 of the first semiconductor memory device 1620 and the second memory region 1650 of the second semiconductor memory device 1640 may correspond to a second rank RANK2 (i.e., 4 Gb) of the semiconductor memory module, and the third memory region 1635 of the first semiconductor memory device 1620 and the third memory region 1655 of the second semiconductor memory device 1640 may correspond to a third rank RANK3 (i.e., 4 Gb) of the semiconductor memory module. That is, the semiconductor memory package 1600 may substantially operate as having one semiconductor memory module of three ranks.

In the semiconductor memory package 1600, the first semiconductor memory device 1620 and the second semiconductor memory device 1640 may share command pins CMD, address pins ADDR, and chip I/O pins DQ_G. In addition, the first through third chip selection signals CSS0, CSS1, and CSS2 are simultaneously input to the first through third memory regions 1625, 1630, and 1635 of the first semiconductor memory device 1620 and the first through third memory regions 1645, 1650, and 1655 of the second semiconductor memory device 1640 through the at least one through-silicon via TSV coupled to the I/O control unit 1690 of the second semiconductor memory device 1640. Thus, the first through third memory regions 1625, 1630, and 1635 of the first semiconductor memory device 1620 may be distinguished from the first through third memory regions 1645, 1650, and 1655 of the second semiconductor memory device 1640 by a bank address, a row address, or a column address. Hence, various means such as a package/bonding option, a fuse option, a chip counter, etc., may be used. As described above, the semiconductor memory package 1600 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1600 reduces the number of semiconductor memory modules per channel compared to some conventional semiconductor memory packages. Although it is illustrated above that the through-silicon via dual-die stack package includes the first and second semiconductor memory devices 1620 and 1640, the number of semiconductor memory devices included in the through-silicon via dual-die stack package is not limited thereto.

Figure 21:
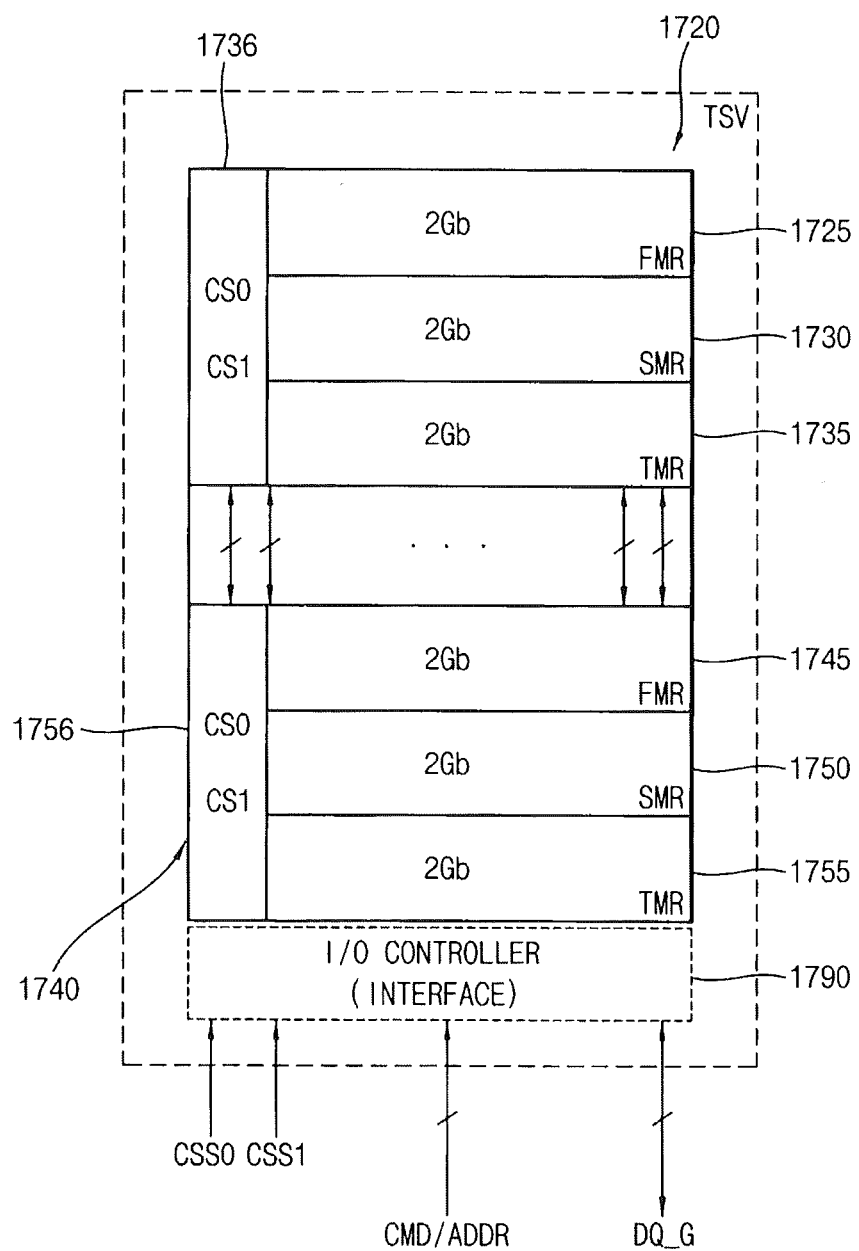
FIG. 21 is a diagram illustrating still another example in which an integrated circuit memory package of FIG. 10 is implemented by a dual-die stack package using through silicon via.

FIG. 21 is a diagram illustrating still another example in which an integrated circuit memory package of FIG. 10 is implemented by a through-silicon via dual-die stack package.

Referring to FIG. 21, the semiconductor memory package 1700 may be implemented by a through-silicon via dual-die stack package in which a first semiconductor memory device 1720 is coupled to a second semiconductor memory device 1740. As illustrated in FIG. 21, the first semiconductor memory device 1720 may be a slave device, and the second semiconductor memory device 1740 may be a master device. The second semiconductor memory device 1740 may include an I/O control unit 1790 for interfacing with outside. The I/O control unit 1790 of the second semiconductor memory device 1740 may provide first and second chip selection signals CSS0 and CSS1, a command CMD, an address ADDR, and/or I/O data to the first and second semiconductor memory devices 1720 and 1740 through the at least one through-silicon via. According to some example embodiments, the semiconductor memory package 1700 may include more semiconductor memory devices (i.e., multiple dies, also referred to herein as a 'multi-die' package).

As illustrated in FIG. 21, the first semiconductor memory device 1720 may include a first memory region 1725 having a capacity of 2 Gb, a second memory region 1730 having a capacity of 2 Gb, and a third memory region 1735 having a capacity of 2 Gb. The second semiconductor memory device 1740 may include a first memory region 1745 having a capacity of 2 Gb, a second memory region 1750 having a capacity of 2 Gb, and a third memory region 1755 having a capacity of 2 Gb. That is, the first semiconductor memory device 1720 may have a capacity of 6 Gb (i.e., 'interim' density), and the second semiconductor memory device 1740 may also have a capacity of 6 Gb (i.e., 'interim' density). In addition, when the semiconductor memory package 1700 receives the first and second chip selection signals CSS0 and CSS1, the semiconductor memory package 1700 may provide the first and second chip selection signals CSS0 and CSS1 to the first and second semiconductor memory devices 1720 and 1740 through the at least one through-silicon via TSV coupled to the I/O control unit 1790 of the second semiconductor memory device 1740. Thus, the first memory region 1725, the second memory region 1730, and the third memory region 1735 of the first semiconductor memory device 1720 may be selectively activated, and the first memory region 1745, the second memory region 1750, and the third memory region 1755 of the second semiconductor memory device 1740 may be selectively activated based on a logic combination of the first and second chip selection signals CSS0 and CSS1.

In the first semiconductor memory device 1720, the first memory region 1725 having a capacity of 2 Gb, the second memory region 1730 having a capacity of 2 Gb, and the third memory region 1735 having a capacity of 2 Gb may belong to different ranks of a semiconductor memory module. In the second semiconductor memory device 1740, the first memory region 1745 having a capacity of 2 Gb, the second memory region 1750 having a capacity of 2 Gb, and the third memory region 1755 having a capacity of 2 Gb may belong to different ranks of a semiconductor memory module. For example, the first memory region 1725 of the first semiconductor memory device 1720 and the first memory region 1745 of the second semiconductor memory device 1740 may correspond to a first rank RANK1 (i.e., 4 Gb) of the semiconductor memory module, the second memory region 1730 of the first semiconductor memory device 1720 and the second memory region 1750 of the second semiconductor memory device 1740 may correspond to a second rank RANK2 (i.e., 4 Gb) of the semiconductor memory module, and the third memory region 1735 of the first semiconductor memory device 1720 and the third memory region 1755 of the second semiconductor memory device 1740 may correspond to a third rank RANK3 (i.e., 4 Gb) of the semiconductor memory module. That is, the semiconductor memory package 1700 may substantially operate as having one semiconductor memory module of three ranks.

In the semiconductor memory package 1700, the first semiconductor memory device 1720 and the second semiconductor memory device 1740 may share command pins CMD, address pins ADDR, and chip I/O pins DQ_G. In addition, the first and second chip selection signals CSS0 and CSS1 are simultaneously input to the first through third memory regions 1725, 1730, and 1735 of the first semiconductor memory device 1720 and the first through third memory regions 1745, 1750, and 1755 of the second semiconductor memory device 1740 through the at least one through-silicon via TSV coupled to the I/O control unit 1790 of the second semiconductor memory device 1740. Thus, the first through third memory regions 1725, 1730, and 1735 of the first semiconductor memory device 1720 may be distinguished from the first through third memory regions 1745, 1750, and 1755 of the second semiconductor memory device 1740 by a bank address, a row address, or a column address. Hence, various means such as a package/bonding option, a fuse option, a chip counter, etc., may be used. As described above, the semiconductor memory package 1700 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1700 reduces the number of semiconductor memory modules per channel compared to some conventional semiconductor memory packages. Although it is illustrated above that the through-silicon via dual-die stack package includes the first and second semiconductor memory devices 1720 and 1740, the number of semiconductor memory devices included in the through-silicon via dual-die stack package is not limited thereto.

Figure 22:
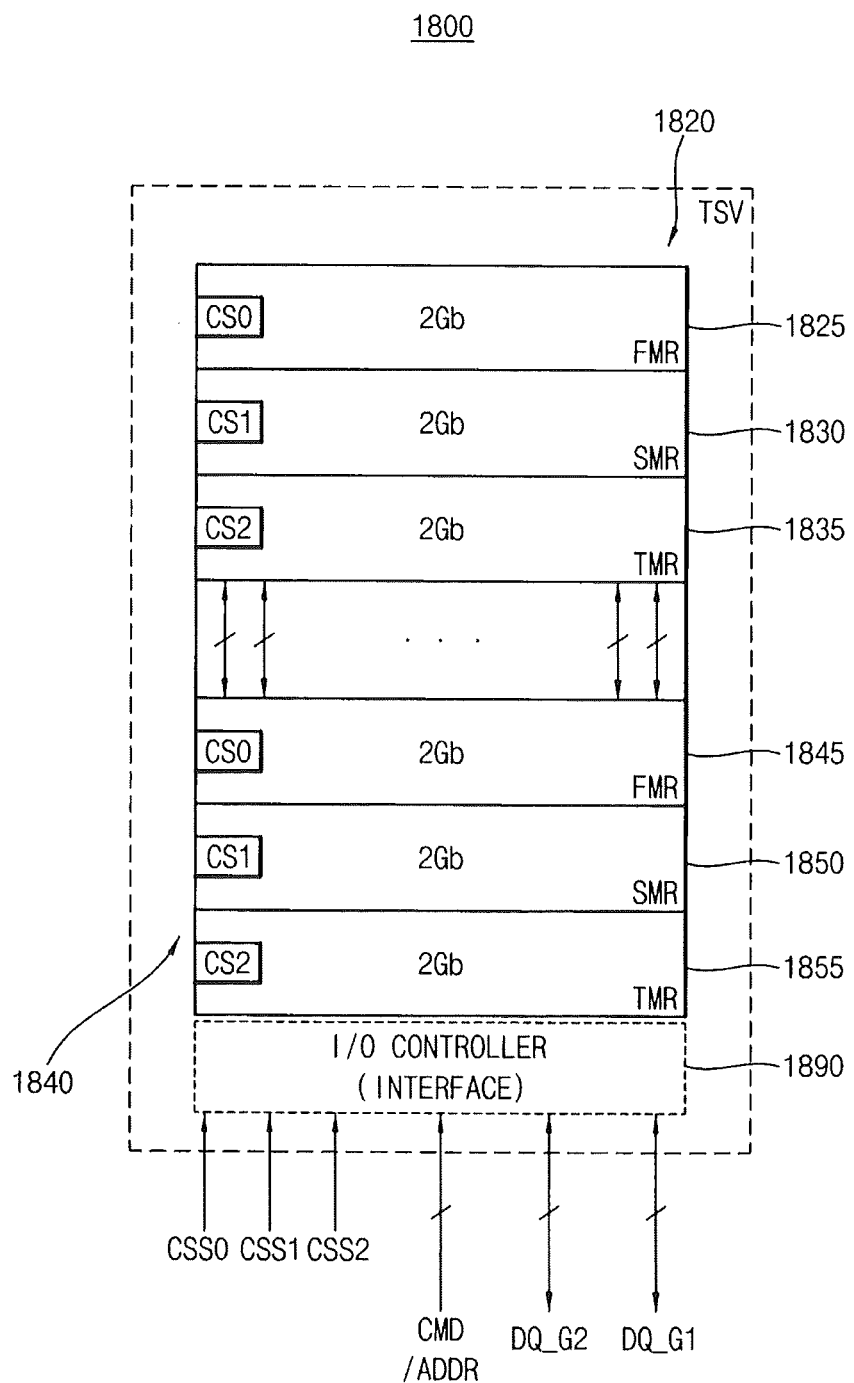
FIG. 22 is a diagram illustrating still another example in which an integrated circuit memory package of FIG. 10 is implemented by a dual-die stack package using through silicon via.

FIG. 22 is a diagram illustrating still another example in which an integrated circuit memory package of FIG. 10 is implemented by a through-silicon via dual-die stack package.

Referring to FIG. 22, the semiconductor memory package 1800 may be implemented by a through-silicon via dual-die stack package in which a first semiconductor memory device 1820 is coupled to a second semiconductor memory device 1840. As illustrated in FIG. 22, the first semiconductor memory device 1820 may be a slave device, and the second semiconductor memory device 1840 may be a master device. The second semiconductor memory device 1840 may include an I/O control unit 1890 for interfacing with outside. The I/O control unit 1890 of the second semiconductor memory device 1840 may provide first through third chip selection signals CSS0, CSS1, and CSS2, a command CMD, an address ADDR, and/or I/O data to the first and second semiconductor memory devices 1820 and 1840 through the at least one through-silicon via. According to some example embodiments, the semiconductor memory package 1800 may include more semiconductor memory devices (i.e., multiple dies, also referred to herein as a 'multi-die' package).

As illustrated in FIG. 22, the first semiconductor memory device 1820 may include a first memory region 1825 having a capacity of 2 Gb, a second memory region 1830 having a capacity of 2 Gb, and a third memory region 1835 having a capacity of 2 Gb. The second semiconductor memory device 1840 may include a first memory region 1845 having a capacity of 2 Gb, a second memory region 1850 having a capacity of 2 Gb, and a third memory region 1855 having a capacity of 2 Gb. That is, the first semiconductor memory device 1820 may have a capacity of 6 Gb (i.e., 'interim' density), and the second semiconductor memory device 1840 may also have a capacity of 6 Gb (i.e., 'interim' density). In addition, when the semiconductor memory package 1800 receives the first through third chip selection signals CSS0, CSS1, and CSS2, the semiconductor memory package 1800 may provide the first through third chip selection signals CSS0, CSS1, and CSS2 to the first and second semiconductor memory devices 1820 and 1840 through the at least one through-silicon via TSV coupled to the I/O control unit 1890 of the second semiconductor memory device 1840. Thus, the first memory region 1825, the second memory region 1830, and the third memory region 1835 of the first semiconductor memory device 1820 may be selectively activated, and the first memory region 1845, the second memory region 1850, and the third memory region 1855 of the second semiconductor memory device 1840 may be selectively activated.

In the first semiconductor memory device 1820, the first memory region 1825 having a capacity of 2 Gb, the second memory region 1830 having a capacity of 2 Gb, and the third memory region 1835 having a capacity of 2 Gb may belong to different ranks of a semiconductor memory module. In the second semiconductor memory device 1840, the first memory region 1845 having a capacity of 2 Gb, the second memory region 1850 having a capacity of 2 Gb, and the third memory region 1855 having a capacity of 2 Gb may belong to different ranks of a semiconductor memory module. For example, the first memory region 1825 of the first semiconductor memory device 1820 and the first memory region 1845 of the second semiconductor memory device 1840 may correspond to a first rank RANK1 (i.e., 4 Gb) of the semiconductor memory module, the second memory region 1830 of the first semiconductor memory device 1820 and the second memory region 1850 of the second semiconductor memory device 1840 may correspond to a second rank RANK2 (i.e., 4 Gb) of the semiconductor memory module, and the third memory region 1835 of the first semiconductor memory device 1820 and the third memory region 1855 of the second semiconductor memory device 1840 may correspond to a third rank RANK3 (i.e., 4 Gb) of the semiconductor memory module. That is, the semiconductor memory package 1800 may substantially operate as having one semiconductor memory module of three ranks.

In the semiconductor memory package 1800, the first semiconductor memory device 1820 and the second semiconductor memory device 1840 may share command pins CMD and address pins ADDR. However, the first semiconductor memory device 1820 and the second semiconductor memory device 1840 may not share chip I/O pins. That is, the first semiconductor memory device 1820 may include first I/O pins DQ_G1, and the second semiconductor memory device 1840 may include second chip I/O pins DQ_G2. Since the chip I/O pins are not shared by the first semiconductor memory device 1820 and the second semiconductor memory device 1840, the first through third memory regions 1825, 1830, and 1835 of the first semiconductor memory device 1820 may not be distinguished from the first through third memory regions 1845, 1850, and 1855 of the second semiconductor memory device 1840 by a bank address, a row address, or a column address. Hence, various means such as a package/bonding option, a fuse option, a chip counter, etc., may not be used. Furthermore, since the chip I/O pins are not shared by the first semiconductor memory device 1820 and the second semiconductor memory device 1840, seamless operations can be reduced or eliminated between the first semiconductor memory device 1820 and the second semiconductor memory device 1840 so that a channel efficiency may not be degraded. As described above, the semiconductor memory package 1800 may substantially operate as having one semiconductor memory module of three ranks, whereas some conventional memory packages may include one semiconductor memory module of two ranks and another semiconductor memory module of one rank. Therefore, system characteristics can be improved because the semiconductor memory package 1400 reduces the number of semiconductor memory modules per channel compared to some conventional semiconductor memory packages. Although it is illustrated above that the through-silicon via dual-die stack package includes the first and second semiconductor memory devices 1820 and 1840, the number of semiconductor memory devices included in the through-silicon via dual-die stack package is not limited thereto.

Figure 23:
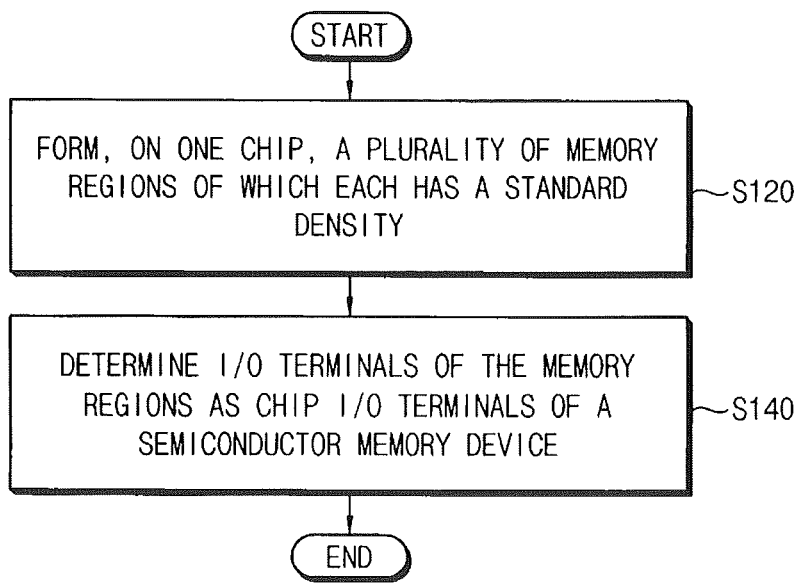
FIG. 23 is a flow chart illustrating a method of increasing a density of an integrated circuit memory device according to example embodiments.

FIG. 23 is a flow chart illustrating methods of increasing a density of an integrated circuit memory device according to example embodiments.

Referring to FIG. 23, the method of FIG. 23 may form a plurality of memory regions on one chip (S120), each of the memory regions including a plurality of volatile memory cells that are formed as a 'standard' density or capacity of $2^K$ bits (where K is an integer greater than or equal to 0), and a plurality of I/O terminals for inputting/outputting data of the volatile memory cells. Then, the method of FIG. 23 may determine the I/O terminals included in each of the memory regions as a plurality of chip I/O terminals of an integrated circuit memory device (S140). Here, the number of the I/O terminals included in the memory regions may be determined to be a form of $2^L$ (where L is an integer greater than or equal to 0), respectively. However, the number of the I/O terminals included in each of the memory regions is not limited thereto. In one example embodiment, the memory regions may belong to the same rank of an integrated circuit memory module. In this case, the I/O terminals included in the memory regions may simultaneously operate as the chip I/O terminals of the semiconductor memory device. Here, the number of the chip I/O terminals may correspond to the total number of the I/O terminals of all memory regions. In another example embodiment, the memory regions may belong to different ranks of an integrated circuit memory module. In this case, the I/O terminals included in the memory regions may selectively operate as the chip I/O terminals of the semiconductor memory device in response to at least one chip selection signal. Here, the number of the chip I/O terminals may correspond to the number of the I/O terminals of one memory region.

As described above, since each memory region has a density (i.e., standard density) of $2^K$ bits (here, K is an integer greater than or equal to 0), and a density of one memory region is different from a density of another memory region, the semiconductor memory device including the memory regions that are formed on one chip may have a density (i.e., 'interim' density) of $2^M + 2^N + 2^O + \ldots$ (here, M, N, and O are integers greater than or equal to 0, and M, N, and O are different from each other). In addition, the semiconductor memory device may use the I/O terminals of each memory region as the chip I/O terminals. As a result, the method of FIG. 23 may allow the semiconductor memory device to have a smaller size, and to consume less power compared to conventional semiconductor memory device.

Figure 24:
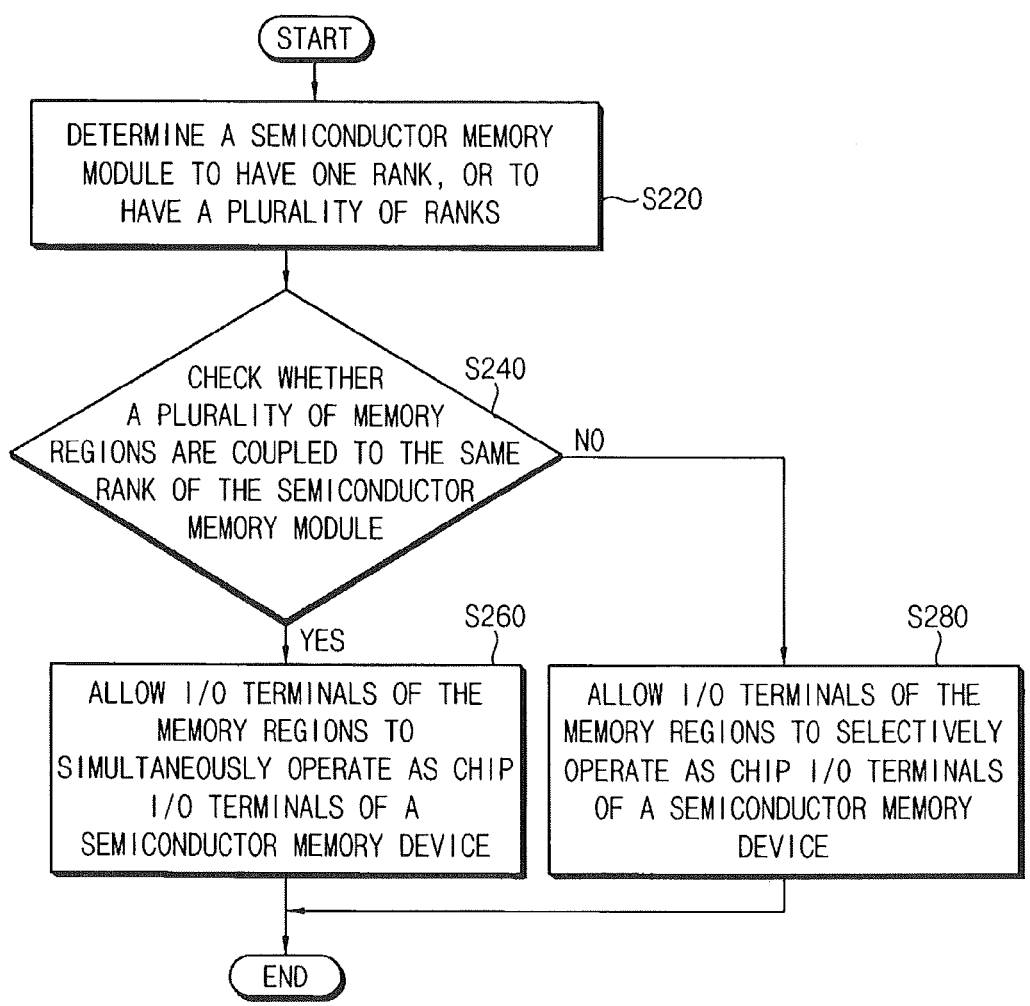
FIG. 24 is a flow chart illustrating an example in which I/O terminals of memory regions are determined as chip I/O terminals when the memory regions are coupled to at least one rank of an integrated circuit memory module in FIG. 23.

FIG. 24 is a flow chart illustrating an example in which I/O terminals of memory regions are determined as chip I/O terminals when the memory regions are coupled to at least one rank of an integrated circuit memory module in FIG. 23.

Referring to FIG. 24, the I/O terminals of the memory regions may be determined as the chip I/O terminals according to how the memory regions are coupled to at least one rank of the semiconductor memory module. In detail, the method of FIG. 23 may determine the semiconductor memory module to have one rank (i.e., single-rank), or to have a plurality of ranks (i.e., multi-rank) (S220). Then, the method of FIG. 23 may check whether the memory regions are coupled to the same rank of the semiconductor memory module (S240). At this time, if the memory regions are coupled to the same rank of the semiconductor memory module, the method of FIG. 23 may allow the I/O terminals of the memory regions to simultaneously operate as the chip I/O terminals of the semiconductor memory device (S260). On the other hand, if the memory regions are coupled to different ranks of the semiconductor memory module, the method of FIG. 23 may allow the I/O terminals of the memory regions to selectively operate as the chip I/O terminals of the semiconductor memory device in response to at least one chip selection signal (S280). Meanwhile, if the memory regions are coupled to the same rank of the semiconductor memory module, the number of the chip I/O terminals may correspond to the total number of the I/O terminals of all memory regions. In addition, if the memory regions are coupled to different ranks of the semiconductor memory module, the number of the chip I/O terminals may correspond to the number of the I/O terminals of one memory region.

FIGS. 25A through 25F are diagrams illustrating examples of an integrated circuit memory module including a plurality of semiconductor memory devices.

Figure 25A:
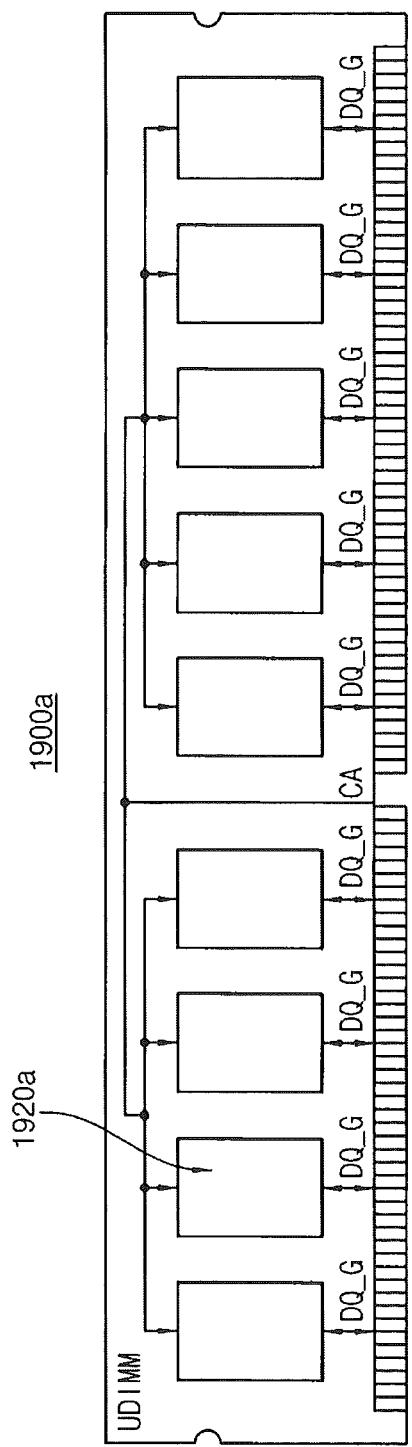
FIGS. 25A through 25F are diagrams illustrating examples of an integrated circuit memory module including a plurality of semiconductor memory devices.

Referring to FIG. 25A, an integrated circuit memory module 1900a may be implemented by an unbuffered dual in-line memory module (UDIMM). The semiconductor memory module 1900a may include a plurality of semiconductor memory packages 1920a, and each of the semiconductor memory packages 1920a may include at least one semiconductor memory device. As described above, the semiconductor memory device including a plurality of memory regions may have a non-standard density (i.e., 'interim' density) of $2^M+2^N+2^O+\ldots$ (where M, N, and O are integers greater than or equal to 0, and M, N, and O are different from each other), and the number of chip I/O terminals of the semiconductor memory device may be an 'interim' number (e.g., not corresponding to a power of 2). Meanwhile, in one semiconductor memory package 1920a, the chip I/O terminals of one semiconductor memory device and the chip I/O terminals of another semiconductor memory device may be simultaneously or selectively coupled to chip I/O pins DQ_G. As illustrated in FIG. 25A, the semiconductor memory packages 1920a may be coupled to command/address transmission lines CA in a tree topology. In one example embodiment, a pseudo-differential signaling using a reference data voltage and a reference command/address voltage may be employed.

Figure 25B:
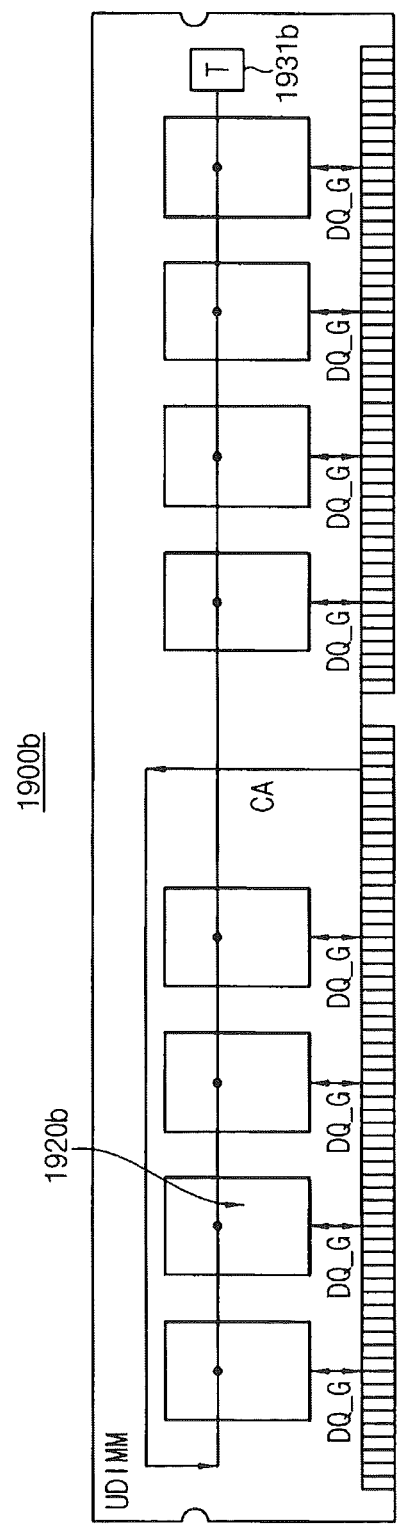

Referring to FIG. 25B, an integrated circuit memory module 1900b may be implemented by an UDIMM. The semiconductor memory module 1900b may include a plurality of semiconductor memory packages 1920b, and each of the semiconductor memory packages 1920b may include at least one semiconductor memory device. As described above, the semiconductor memory device including a plurality of memory regions may have a non-standard density (i.e., 'interim' density) of $2^M+2^N+2^O+\ldots$ (here, M, N, and O are integers greater than or equal to 0, and M, N, and O are different from each other), and the number of chip I/O terminals of the semiconductor memory device may be an 'interim' number. Meanwhile, in one semiconductor memory package 1920b, the chip I/O terminals of one semiconductor memory device and the chip I/O terminals of another semiconductor memory device may be simultaneously or selectively coupled to chip I/O pins DQ_G. As illustrated in FIG. 25B, the command/address transmission lines CA may be coupled to the semiconductor memory packages 1920b in a fly-by daisy-chain topology. A module resistor unit 1931b may be coupled to one end of the command/address transmission lines CA. In one example embodiment, the semiconductor memory module 1900b may perform read/write leveling operations.

Figure 25C:
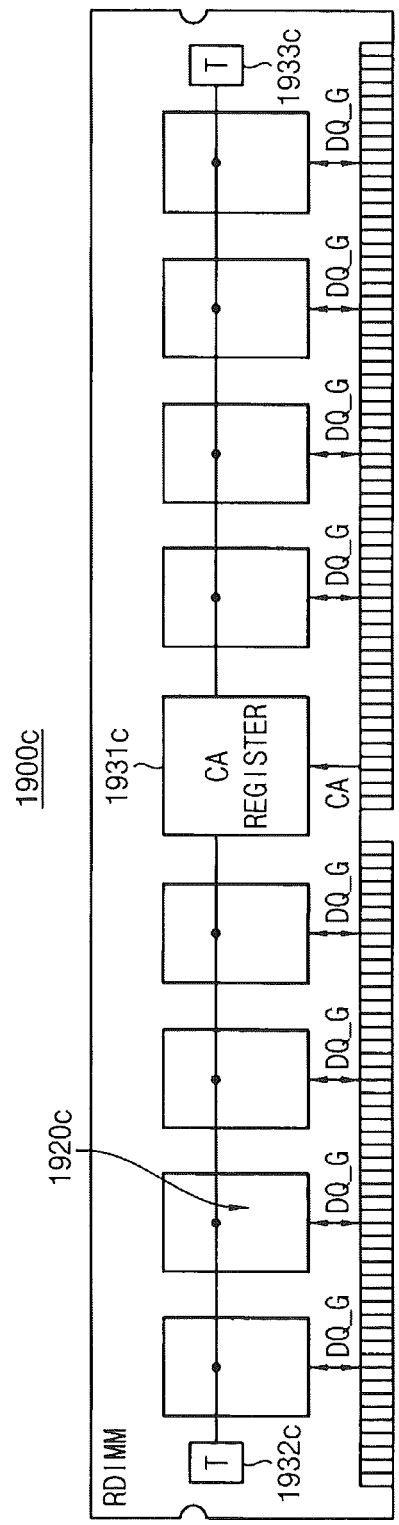

Referring to FIG. 25C, an integrated circuit memory module 1900c may be implemented by a registered dual in-line memory module (RDIMM). The semiconductor memory module 1900c may include a plurality of semiconductor memory packages 1920c, and each of the semiconductor memory packages 1920c may include at least one semiconductor memory device. As described above, the semiconductor memory device including a plurality of memory regions may have a non-standard density (i.e., 'interim' density) of $2^M+2^N+2^O+\ldots$ (here, M, N, and O are integers greater than or equal to 0, and M, N, and O are different from each other), and the number of chip I/O terminals of the semiconductor memory device may be an 'interim' number. Meanwhile, in one semiconductor memory package 1920c, the chip I/O terminals of one semiconductor memory device and the chip I/O terminals of another semiconductor memory device may be simultaneously or selectively coupled to chip I/O pins DQ_G. As illustrated in FIG. 25C, the semiconductor memory module 1900c may include a command/address register 1931c that provides a command/address signal to the semiconductor memory packages 1920c through the command/address transmission lines CA. In addition, module resistor units 1932c and 1933c are coupled to both ends of the command/address transmission lines CA. The command/address register 1931c may be coupled to the semiconductor memory packages 1920c in a daisy-chain topology.

Figure 25D:
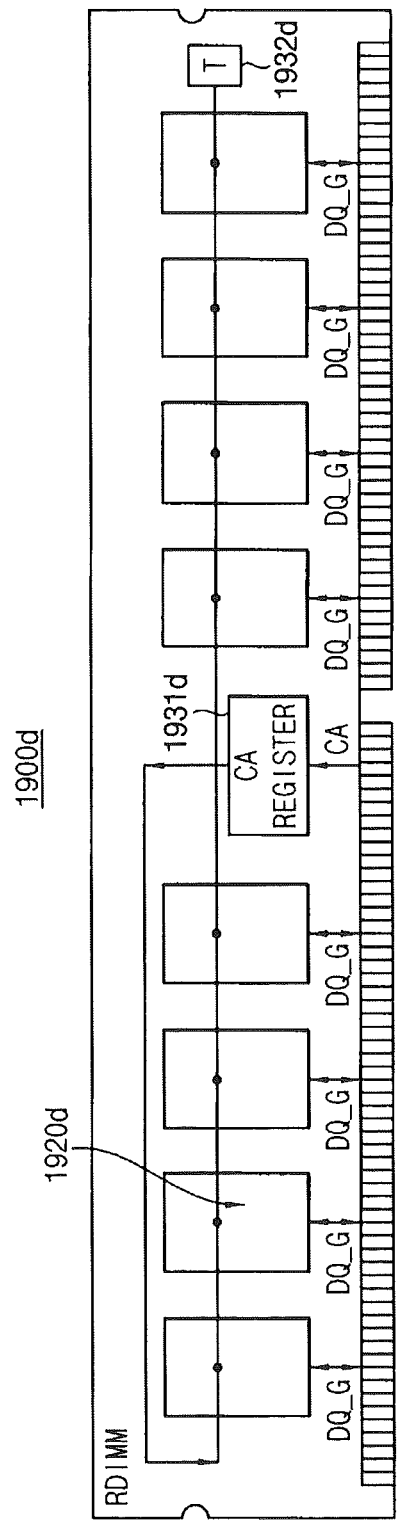

Referring to FIG. 25D, an integrated circuit memory module 1900d may be implemented by a RDIMM. The semiconductor memory module 1900d may include a plurality of semiconductor memory packages 1920d, and each of the semiconductor memory packages 1920d may include at least one semiconductor memory device. As described above, the semiconductor memory device including a plurality of memory regions may have a non-standard density (i.e., 'interim' density) of $2^M+2^N+2^O+\ldots$, (here, M, N, and O are integers greater than or equal to 0, and M, N, and O are different from each other), and the number of chip I/O terminals of the semiconductor memory device may be an 'interim' number. Meanwhile, in one semiconductor memory package 1920d, the chip I/O terminals of one semiconductor memory device and the chip I/O terminals of another semiconductor memory device may be simultaneously or selectively coupled to chip I/O pins DQ_G. As illustrated in FIG. 25D, the semiconductor memory module 1900d may include a command/address register 1931d that provides a command/address signal to the semiconductor memory packages 1920d through the command/address transmission lines CA. In addition, a module resistor unit 1932d is coupled to one end of the command/address transmission lines CA. The command/address register 1931d may be coupled to the semiconductor memory packages 1920d in a fly-by daisy-chain topology. In one example embodiment, the semiconductor memory module 1900d may perform read/write leveling operations.

Figure 25E:
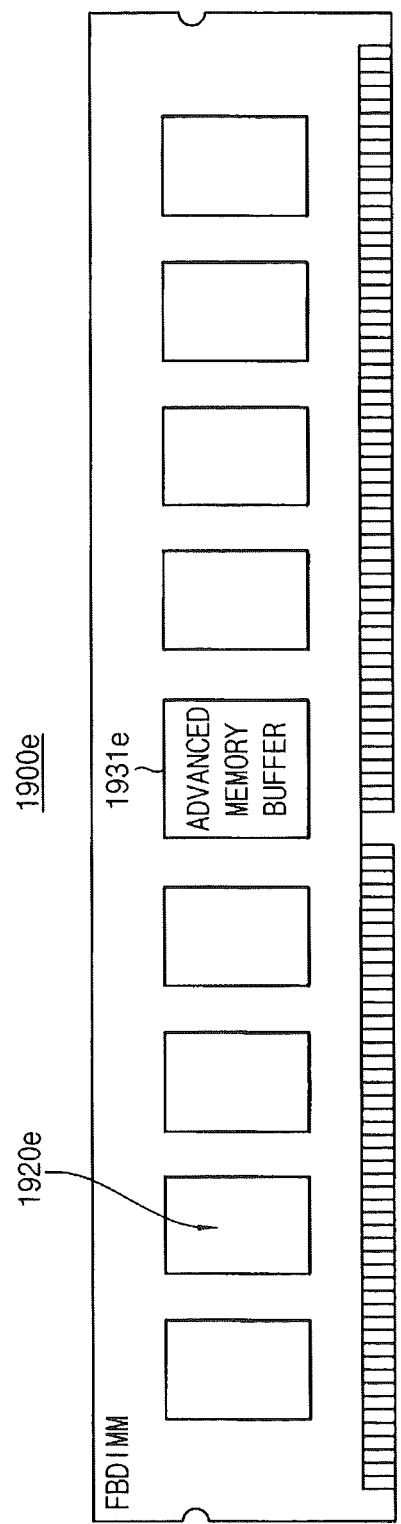

Referring to FIG. 25E, an integrated circuit memory module 1900e may be implemented by a fully buffered dual in-line memory module (FBDIMM). The semiconductor memory module 1900e may include a plurality of semiconductor memory packages 1920e, and each of the semiconductor memory packages 1920e may include at least one semiconductor memory device. As described above, the semiconductor memory device including a plurality of memory regions may have a non-standard density (i.e., 'interim' density) of $2^M+2^N+2^O+\ldots$ (here, M, N, and O are integers greater than or equal to 0, and M, N, and O are different from each other), and the number of chip I/O terminals of the semiconductor memory device may be an 'interim' number. Meanwhile, in one semiconductor memory package 1920e, the chip I/O terminals of one semiconductor memory device and the chip I/O terminals of another semiconductor memory device may be simultaneously or selectively coupled to chip I/O pins DQ_G. As illustrated in FIG. 25E, the semiconductor memory module 1900e may include a hub 1931e that provides a command/address signal and data to the semiconductor memory packages 1920e by converting a high-speed packet received from a memory controller (not illustrated) into the command/address signal and data. In one example embodiment, the hub 1931e may be an advanced memory buffer (AMB).

Figure 25F:
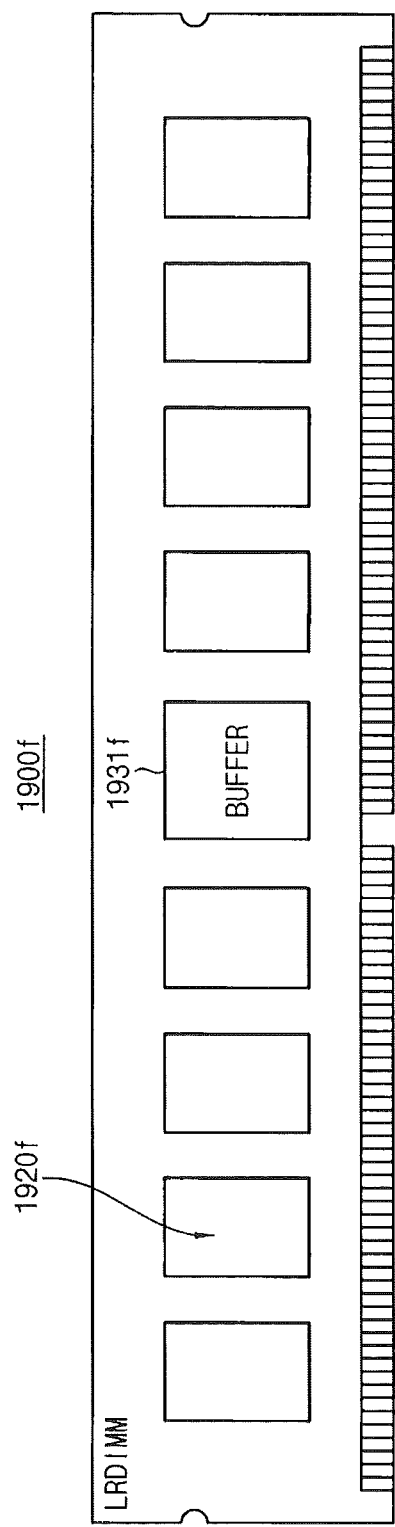

Referring to FIG. 25F, an integrated circuit memory module 1900f may be implemented by a load reduced dual in-line memory module (LRDIMM). The semiconductor memory module 1900f may include a plurality of semiconductor memory packages 1920f, and each of the semiconductor memory packages 1920f may include at least one semiconductor memory device. As described above, the semiconductor memory device including a plurality of memory regions may have a non-standard density (i.e., 'interim' density) of $2^M+2^N+2^O+\ldots$ (here, M, N, and O are integers greater than or equal to 0, and M, N, and O are different from each other), and the number of chip I/O terminals of the semiconductor memory device may be an 'interim' number. Meanwhile, in one semiconductor memory package 1920f, the chip I/O terminals of one semiconductor memory device and the chip I/O terminals of another semiconductor memory device may be simultaneously or selectively coupled to chip I/O pins DQ_G. As illustrated in FIG. 25F, the semiconductor memory module 1900f may include a buffer 1931f that provides a command/address signal and data to the semiconductor memory packages 1920f by buffering the command/address signal and the data input from a memory controller (not illustrated) through a plurality of transmission lines. Here, data transmission lines between the buffer 1931f and the semiconductor memory packages 1920f may be coupled in a point-to-point topology. Command/address transmission lines between the buffer 1931f and the semiconductor memory devices 1920f may be coupled in a multi-drop topology, a daisy-chain topology, or a fly-by daisy-chain topology. Since the buffer 1931f buffers both the command/address signal and the data, the memory controller may interface with the semiconductor memory module 1900f by driving only a load of the buffer 1931f.

Figure 26:
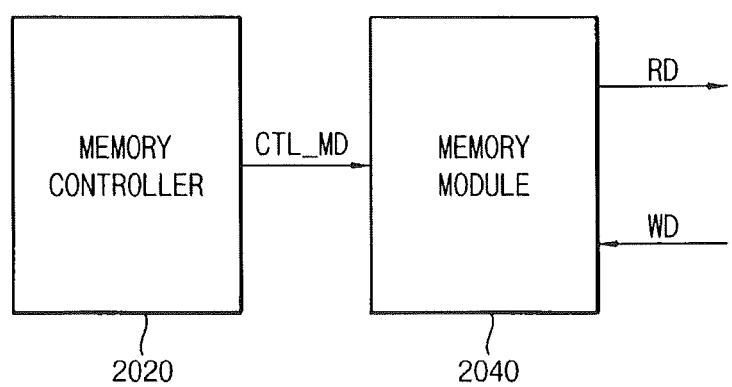
FIG. 26 is a block diagram illustrating a memory system according to example embodiments.

FIG. 26 is a block diagram illustrating a memory system according to example embodiments.

Referring to FIG. 26, the memory system 2000 may include a memory controller 2020 and at least one semiconductor memory module 2040. According to some example embodiments, the semiconductor memory module 2040 may correspond to one or more of the semiconductor memory modules 1900a, 1900b, 1900c, 1900d, 1900e, and 1900f of FIGS. 25A through 25F. The memory controller 2020 may be coupled to the semiconductor memory module 2040 through a bus, and may control the semiconductor memory module 2040 by generating a module control signal CTL_MD. As described above, the semiconductor memory module 2010 may include a plurality of semiconductor memory packages, and each of the semiconductor memory packages includes at least one semiconductor memory device. In addition, the semiconductor memory device includes a plurality of memory regions and at least one peripheral region. Here, each memory region includes a plurality of volatile memory cells that are formed as a density (i.e., standard density) of $2^K$ bits (here, K is an integer greater than or equal to 0) and a plurality of I/O terminals for inputting/outputting data of the volatile memory cells. A density of one memory region is different from a density of another memory region. Based on a command and an address input from outside, the peripheral region controls a write operation for writing data WD into the memory regions and a read operation for reading data RD from the memory regions. As a result, the semiconductor memory device including a plurality of memory regions may have an 'interim' density, and/or the number of chip I/O terminals of the semiconductor memory device may be an 'interim' number.

Figure 27:
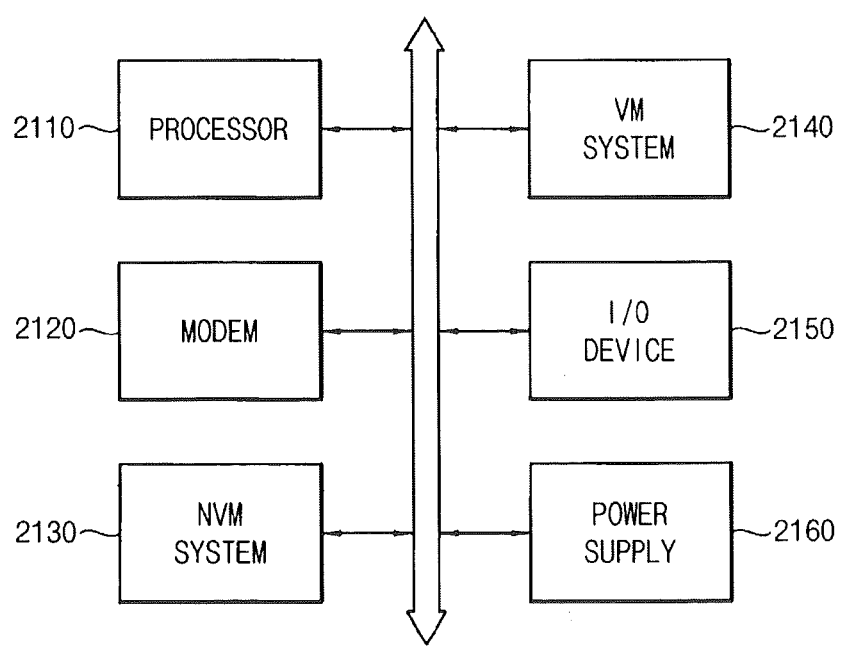
FIG. 27 is a block diagram illustrating a mobile system including a memory system of FIG. 26.

FIG. 27 is a block diagram illustrating a mobile system including a memory system of FIG. 26.

Referring to FIG. 27, the mobile system 2100 may include a processor 2110, a modem 2120, a non-volatile memory system 2130, a volatile memory system 2140, an I/O device 2150, and a power supply 2160. Here, the volatile memory system 2140 may correspond to the memory system 2000 of FIG. 26. The mobile system 2100 may be an electronic device such as a digital camera, a cellular phone, a smart phone, a personal digital assistant (PDA), a portable multimedia player (PMP), a MP3 player, a mobile game console, a navigation system, among others.

The processor 2110 may perform various computing functions. For example, the processor 2110 may execute applications such as an internet browser application, a 3D-map application, etc. The processor 2110 may be coupled to other components via an address bus, a control bus, a data bus, etc. According to some example embodiments, the processor 2110 may be a micro processor, a central processing unit (CPU), etc. The modem 2120 may receive external data from outside, and may transmit internal data to outside. For example, the modem 2120 may be a modem processor that supports a global system for mobile communication (GSM), a general packet radio service (GPRS), a wideband code division multiple access (WCDMA), etc. According to some example embodiments, the processor 2110 and the modem 2120 may be implemented in one chip. The non-volatile memory system 2130 may store data for operations of the mobile system 2100. According to some example embodiments, the non-volatile memory system 2130 may store booting codes for boot-operations of the mobile system 2100. For example, the non-volatile memory system 2130 may correspond to an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc.

The volatile memory system 2140 may store data transferred (i.e., received or transmitted) by the modem 2120 and/or data processed by the processor 2110. For example, the volatile memory system may correspond to a dynamic random access memory (DRAM) device, a static random access memory (SRAM) device, a mobile dynamic random access memory (mobile DRAM) device, etc. As describe above, the volatile memory system 2140 may include a memory controller and at least one semiconductor memory module, the semiconductor memory module may include a plurality of semiconductor memory packages, and each of the semiconductor memory packages may include at least one semiconductor memory device. Here, the semiconductor memory device includes a plurality of memory regions and at least one peripheral region. Each memory region includes a plurality of volatile memory cells that are formed as a density (i.e., standard density) of $2^K$ bits (here, K is an integer greater than or equal to 0) and a plurality of I/O terminals for inputting/outputting data of the volatile memory cells. A density of one memory region is different from a density of another memory region. Based on a command and an address input from outside, the peripheral region controls a write operation for writing data into the memory regions and a read operation for reading data from the memory regions. As a result, the semiconductor memory device including a plurality of memory regions may have an 'interim' density, and/or the number of chip I/O terminals of the semiconductor memory device may be an 'interim' number. However, duplicated description will be omitted.

The I/O device 2150 may include an input device such as a keyboard, a keypad, a mouse, a touch screen, etc, and an output device such as a printer, a display, a speaker, etc. The power supply 2160 may provide a power for operations of the mobile system 2100. The mobile system 2100 may be implemented by various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat-Pack (TQFP), Small Outline Integrated Circuit (SOIC), Shrink Small Outline Package (SSOP), Thin Small Outline Package (TSOP), Thin Quad Flat-Pack (TQFP), System In Package (SIP), Multi Chip Package (MCP), Wafer-level Fabricated Package (WFP), Wafer-Level Processed Stack Package (WSP).

Figure 28:
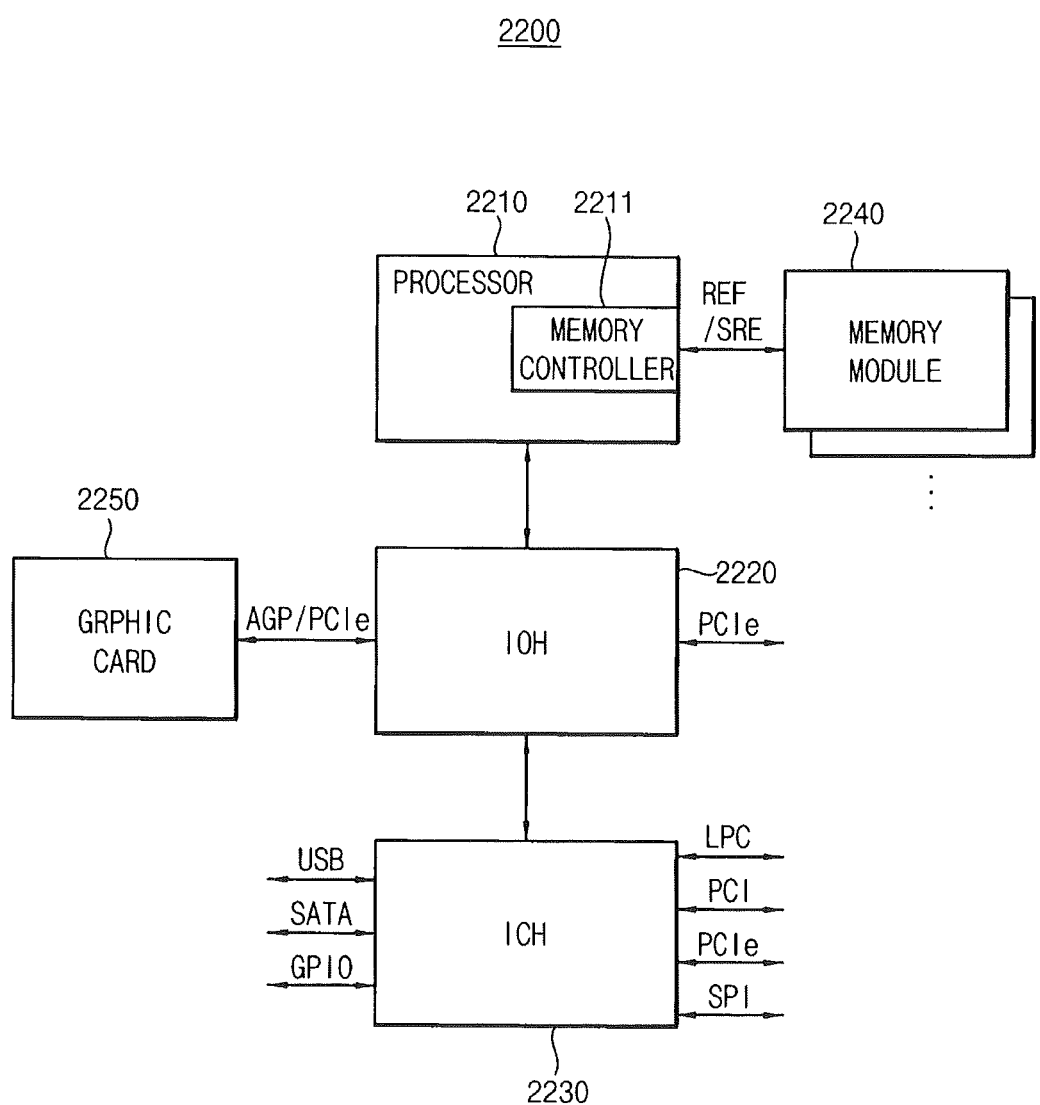
FIG. 28 is a block diagram illustrating a computing system including a memory system of FIG. 26.

FIG. 28 is a block diagram illustrating a computing system including a memory system of FIG. 26.

Referring to FIG. 28, the computing system 2200 includes a processor 2210, an input/output hub (IOH) 2220, an I/O controller hub (ICH) 2230, at least one semiconductor memory module 2240, and a graphics card 2250. According to some example embodiments, the computing system 2200 may correspond to a personal computer (PC), a server computer, a workstation, a laptop computer, etc.

The processor 2210 performs various computing functions. For example, the processor 2210 may be a microprocessor, a central processing unit (CPU), etc. According to some example embodiments, the processor 2210 may include a single core or multiple cores such as a dual-core processor, a quad-core processor, or a hex-core processor. Although it is illustrated in FIG. 28 that the computing system 2200 includes one processor 2210, the computing system 2200 may include a plurality of processors. According to some example embodiments, the processor 2210 may further include an internal or external cache memory. The processor 2210 includes a memory controller 2211 for controlling the semiconductor memory module 2240 by generating a module control signal. The memory controller 2211 included in the processor 2210 may be referred to as an integrated memory controller (IMC). A memory interface between the memory controller 2211 and the semiconductor memory module 2240 may be implemented with one channel (i.e., single-channel) including a plurality of signal lines, or may be implemented with a plurality of channels (i.e., multi-channel). According to some example embodiments, the memory controller 2211 may be located inside the I/O hub 2220. In this case, the I/O hub 2220 including the memory controller 2211 may be referred to as a memory controller hub (MCH).

The semiconductor memory module 2240 may include a plurality of semiconductor memory packages, and each of the semiconductor memory packages may include at least one semiconductor memory device. Here, the semiconductor memory device includes a plurality of memory regions and at least one peripheral region. Each memory region includes a plurality of volatile memory cells that are formed as a density (i.e., standard density) of $2^K$ bits (where K is an integer greater than or equal to 0) and a plurality of I/O terminals for inputting/outputting data of the volatile memory cells. A density of one memory region is different from a density of another memory region. Based on a command and an address input from outside, the peripheral region controls a write operation for writing data into the memory regions and a read operation for reading data from the memory regions. As a result, the semiconductor memory device including a plurality of memory regions may have an 'interim' density, and the number of chip I/O terminals of the semiconductor memory device may be an 'interim' number. The I/O hub 2220 may manage data transfer operations between the processor 2210 and devices such as the graphics card 2250. The I/O hub 2220 may be coupled to the processor 2210 based on various interfaces. For example, the interface between the processor 2210 and the I/O hub 2220 may be a front side bus (FSB), a system bus, a HyperTransport, a lightning data transport (LDT), a QuickPath interconnect (QPI), or a common system interface (CSI). Further, the I/O hub 2220 may provide various interfaces with the devices. For example, the I/O hub 2220 may provide an accelerated graphics port (AGP) interface, a peripheral component interface-express (PCIe), a communications streaming architecture (CSA) interface, etc. Although it is illustrated in FIG. 28 that the computing system 2200 includes one I/O hub 2220, the computing system 2200 may include a plurality of I/O hubs.

The graphics card 2250 may be coupled to the I/O hub 2220 via AGP or PCIe for controlling a display device to display an image. The graphics card 2250 may include an internal processor for processing image data. According to some example embodiments, the I/O hub 2220 may include an internal graphics device instead of the graphics card 2250. The graphics device included in the I/O hub 2220 may be referred to as integrated graphics. Furthermore, the I/O hub 2220 including the internal memory controller and the internal graphics device may be referred to as a graphics and memory controller hub (GMCH). The I/O controller hub 2230 may perform data buffering and interface arbitration operations to efficiently operate various system interfaces. The I/O controller hub 2230 may be coupled to the I/O hub 2220 via an internal bus, such as a direct media interface (DMI), a hub interface, an enterprise Southbridge interface (ESI), PCIe, etc. The I/O controller hub 2230 may interface with peripheral devices. For example, the I/O controller hub 1530 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The present inventive concept may be applied to an integrated circuit memory device having a plurality of volatile memory cells, and a system including the semiconductor memory device. For example, the present inventive concept may be applied to an electronic device such as a cellular phone, a smart phone, a personal digital assistant (PDA), a portable multimedia player (PMP), a digital camera, a video camcorder, a computer, a laptop, a workstation, a digital television, a MP3 player, a portable game console, a navigation system, and/or other devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
a plurality of memory regions formed on one chip, each of the memory regions having a plurality of volatile memory cells that are formed as a density of 2^K bits, where K is an integer greater than or equal to 0, and a plurality of input/output (I/O) terminals for inputting and outputting data of the volatile memory cells, an entire density of the memory regions corresponding to an interim density, wherein the memory regions include:
a first memory region having a plurality of first volatile memory cells that are formed as a density of 2^M bits, where M is an integer greater than or equal to 0, and a plurality of first I/O terminals for inputting and outputting data of the first volatile memory cells; and
a second memory region having a plurality of second volatile memory cells that are formed as a density of 2^N bits, where N is an integer greater than or equal to 0 and N is different from M, and a plurality of second I/O terminals for inputting and outputting data of the second volatile memory cells,
wherein a number of the first I/O terminals and/or a number of the second I/O terminals can be expressed as 2^L, where L is an integer greater than or equal to 0, respectively; and
at least one peripheral region configured to control a write operation for writing data into the memory regions and a read operation for reading data from the memory regions based on an externally input command and address.

2. The device of claim 1, wherein the number of the first I/O terminals is the same as the number of the second I/O terminals.

3. The device of claim 1, wherein the number of the first I/O terminals is different from the number of the second I/O terminals.

4. A semiconductor memory device comprising:
a plurality of memory regions formed on one chip, each of the memory regions having a plurality of volatile memory cells that are formed as a density of 2^K bits, where K is an integer greater than or equal to 0, and a plurality of input/output (I/O) terminals for inputting and outputting data of the volatile memory cells, an entire density of the memory regions corresponding to an interim density, wherein the memory regions include:
a first memory region having a plurality of first volatile memory cells that are formed as a density of 2^M bits, where M is an integer greater than or equal to 0, and a plurality of first I/O terminals for inputting and outputting data of the first volatile memory cells; and
a second memory region having a plurality of second volatile memory cells that are formed as a density of 2^N bits, where N is an integer greater than or equal to 0 and N is different from M, and a plurality of second I/O terminals for inputting and outputting data of the second volatile memory cells,
wherein the first memory region and the second memory region belong to a same rank of a semiconductor memory module, wherein the first I/O terminals and the second I/O terminals simultaneously operate as chip I/O terminals, and wherein a number of the chip I/O terminals corresponds to a sum of the number of the first I/O terminals and the number of the second I/O terminals; and
at least one peripheral region configured to control a write operation for writing data into the memory regions and a read operation for reading data from the memory regions based on an externally input command and address.

5. A semiconductor memory device comprising:
a plurality of memory regions formed on one chip, each of the memory regions having a plurality of volatile memory cells that are formed as a density of 2^K bits, where K is an integer greater than or equal to 0, and a plurality of input/output (I/O) terminals for inputting and outputting data of the volatile memory cells, an entire density of the memory regions corresponding to an interim density, wherein the memory regions include:
a first memory region having a plurality of first volatile memory cells that are formed as a density of 2^M bits, where M is an integer greater than or equal to 0, and a plurality of first I/O terminals for inputting and outputting data of the first volatile memory cells; and
a second memory region having a plurality of second volatile memory cells that are formed as a density of 2^N bits, where N is an integer greater than or equal to 0 and N is different from M, and a plurality of second I/O terminals for inputting and outputting data of the second volatile memory cells,
wherein the first memory region and the second memory region belong to different ranks of a semiconductor memory module, wherein the first I/O terminals and the second I/O terminals selectively operate as chip I/O terminals in response to at least one chip selection signal, and wherein a number of the chip I/O terminals corresponds to the number of the first I/O terminals or the number of the second I/O terminals; and
at least one peripheral region configured to control a write operation for writing data into the memory regions and a read operation for reading data from the memory regions based on an externally input command and address.

6. The device of claim 1, wherein the semiconductor memory device is included in a semiconductor memory package, and wherein the semiconductor memory package is implemented by a monolithic package, a dual-die package, or a through-silicon via dual-die stack package.

7. An integrated circuit memory device, comprising:
a plurality of memory regions on a same memory chip, each of the memory regions having a respective memory capacity defined in units of bits, wherein a sum of the respective memory capacities of the memory regions on the same memory chip cannot be expressed as a power of 2; and
at least one peripheral region configured to control read or write operations for the plurality of memory regions responsive to address and command signals received from an external memory controller.

8. The device of claim 7, wherein the plurality of memory regions comprise:
a first memory region comprising a plurality of first memory cells having a first memory capacity of $2^M$ bits, where M is an integer greater than or equal to zero, and a plurality of first input/output terminals coupled to the memory cells; and
a second memory region comprising a plurality of second memory cells having a second memory capacity of $2^N$ bits, where N is an integer greater than or equal to zero and N does not equal M, and a plurality of second input/output terminals coupled to the memory cells, wherein a sum of the first memory capacity and the second memory capacity is not a power of 2.

9. The device of claim 8, further comprising:
an I/O connecting block configured to connect the first and/or second input/output terminals to chip input/output terminals of the same memory chip.

10. The device of claim 9, wherein a quantity of the chip input/output terminals is not a power of 2.

11. The device of claim 9, wherein a quantity of the chip input/output terminals corresponds to a sum of a quantity of the first and second input/output terminals, and wherein the I/O connecting block is configured to simultaneously connect the first and second input/output terminals to the chip input/output terminals.

12. The device of claim 9, wherein a quantity of the chip input/output terminals corresponds to a quantity of the first input/output terminals or a quantity of the second input/output terminals, and wherein the I/O connecting block is configured to selectively connect either the first input/output terminals or the second input/output terminals to the chip input/output terminals responsive to at least one chip select signal.

13. The device of claim 12, wherein the integrated circuit memory device comprises a first memory chip in a multi-chip memory package, and wherein the memory package comprises a monolithic package, a multi-die package, and/or a through-silicon via multi-die stack package.

14. The device of claim 13, wherein the multi-chip memory package further includes a second memory chip having the first memory region and the second memory region, and wherein the I/O connecting block is configured to simultaneously connect the second input/output terminals of the first and second memory chips to the chip input/output terminals responsive to the chip select signal.

15. The device of claim 14, wherein the chip input/output terminals comprise first chip terminals and second chip terminals different from the first chip terminals, and wherein the I/O connecting block is configured to simultaneously connect the second input/output terminals of the first and second memory chips to the first and second chip terminals, respectively, responsive to the chip select signal.

16. An integrated circuit memory device, comprising:
a plurality of memory regions on a same memory chip, the plurality of memory regions comprising a first memory region comprising a plurality of first volatile memory cells having a first memory capacity of $2^M$ bits, where M is an integer greater than or equal to zero, and a plurality of first input/output terminals coupled to the memory cells, and a second memory region comprising a plurality of second volatile memory cells having a second memory capacity of $2^N$ bits, where N is an integer greater than or equal to zero and N does not equal M, and a plurality of second input/output terminals coupled to the memory cells, wherein a sum of the first memory capacity and the second memory capacity cannot be expressed as a power of 2;
an I/O connecting block configured to connect the first and/or second input/output terminals to chip input/output terminals of the same memory chip, wherein the I/O connecting block is configured to simultaneously connect the first and second input/output terminals to the chip input/output terminals or is configured to selectively connect either the first input/output terminals or the second input/output terminals to the chip input/output terminals responsive to at least one chip select signal; and
at least one peripheral region configured to control read or write operations for the plurality of memory regions responsive to address and command signals received from an external memory controller.

* * * * *